US009190304B2

(12) United States Patent
MacKnight et al.

(10) Patent No.: US 9,190,304 B2
(45) Date of Patent: Nov. 17, 2015

(54) DYNAMIC STORAGE AND TRANSFER SYSTEM INTEGRATED WITH AUTONOMOUS GUIDED/ROVING VEHICLE

(75) Inventors: Robert B. MacKnight, San Jose, CA (US); Anthony C. Bonora, Portola Valley, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 477 days.

(21) Appl. No.: 13/475,723

(22) Filed: May 18, 2012

(65) Prior Publication Data
US 2012/0321423 A1 Dec. 20, 2012

Related U.S. Application Data

(60) Provisional application No. 61/488,120, filed on May 19, 2011.

(51) Int. Cl.
*B65G 65/00* (2006.01)
*B65G 1/04* (2006.01)
*H01L 21/677* (2006.01)
*H01L 21/67* (2006.01)

(52) U.S. Cl.
CPC .... *H01L 21/67276* (2013.01); *H01L 21/67724* (2013.01); *H01L 21/67736* (2013.01); *B65G 2201/0297* (2013.01)

(58) Field of Classification Search
CPC .... B65G 1/0414; B65G 1/0492; B65G 1/065; H01L 21/67724; H01L 21/67736; H01L 21/67276
USPC .......................................... 414/279; 700/288
See application file for complete search history.

(56) References Cited

U.S. PATENT DOCUMENTS

| | | | |
|---|---|---|---|
| 5,570,990 A | 11/1996 | Bonora et al. | |
| 5,957,648 A | 9/1999 | Bachrach | |
| 6,019,563 A | 2/2000 | Murata et al. | |
| 6,042,324 A | 3/2000 | Aggarwal et al. | |
| 6,079,927 A * | 6/2000 | Muka | 414/217 |
| 6,086,323 A | 7/2000 | Rush et al. | |
| 6,102,647 A | 8/2000 | Yap | |
| 6,205,881 B1 | 3/2001 | Gravell et al. | |
| 6,454,512 B1 | 9/2002 | Weiss | |
| 6,481,558 B1 * | 11/2002 | Bonora et al. | 198/346.2 |

(Continued)

OTHER PUBLICATIONS

Mackulak, G.T., et al., "Simulation Analysis of 300 mm Intrabay Automation Vehicle Capacity Alternatives," Sep. 1998, IEEE/SEMI Advanced Semiconductor Manufacturing Conference and Workshop, pp. 445-450.

(Continued)

*Primary Examiner* — Saul Rodriguez
*Assistant Examiner* — Emery Hassan
(74) *Attorney, Agent, or Firm* — Martine Penilla Group, LLP

(57) ABSTRACT

A workpiece container storage and handling system includes a base, a number of wheels connected to the base, and a container handling system connected to the base. The wheels provide for movement of the base. The container handling system is defined to hold at least two containers in a vertically overlying orientation relative to each other. The container handling system is defined to provide for controlled vertical travel of the at least two containers in unison relative to the base. Also, the container handling system is defined to provide for controlled and independent horizontal travel of each of the at least two containers relative to the base.

16 Claims, 45 Drawing Sheets

(56) References Cited

U.S. PATENT DOCUMENTS

| | | | |
|---|---|---|---|
| 6,516,238 B1 | 2/2003 | Kim et al. | |
| 6,533,101 B2 * | 3/2003 | Bonora et al. | 198/465.1 |
| 6,592,318 B2 | 7/2003 | Aggarwal | |
| 6,602,038 B2 | 8/2003 | Ahn et al. | |
| 7,044,703 B2 | 5/2006 | Fukuda et al. | |
| 7,234,908 B2 * | 6/2007 | Nulman et al. | 414/222.01 |
| 7,363,107 B2 | 4/2008 | Chae et al. | |
| 7,480,538 B2 | 1/2009 | Volant et al. | |
| 7,604,306 B1 | 10/2009 | Cheng | |
| 7,798,758 B2 | 9/2010 | Bufano et al. | |
| 7,897,525 B2 | 3/2011 | Lei et al. | |
| 7,931,431 B2 | 4/2011 | Benedict et al. | |
| 8,206,076 B2 * | 6/2012 | Ueda et al. | 414/217 |
| 2003/0235486 A1 * | 12/2003 | Doherty et al. | 414/217.1 |
| 2004/0109746 A1 * | 6/2004 | Suzuki | 414/373 |
| 2006/0104712 A1 | 5/2006 | Bufano et al. | |
| 2010/0204826 A1 * | 8/2010 | Sawado et al. | 700/228 |
| 2010/0316467 A1 | 12/2010 | Ishibashi et al. | |

OTHER PUBLICATIONS

Xiaozhuo Xu, et al., "Optimization of Vertical Linear Synchronous Motor for Ropeless Elevator with INGA Method," Jun. 2010, International Conference on Electrical and Control Engineering, pp. 3965-3968.

Hoshino, S., "Hybrid Design Methodology and Cost-Effectiveness Evaluation of AGV Transportation Systems," Jul. 2007, IEEE Transactions on Automation Science and Engineering, vol. 4, No. 3, pp. 360-372.

Hoshino, S., et al., "Integrated Design Methodology for an Automated Transportation System in a Seaport Terminal," Apr. 2007, IEEE International Conference on Robotics and Automation, pp. 858-863.

* cited by examiner

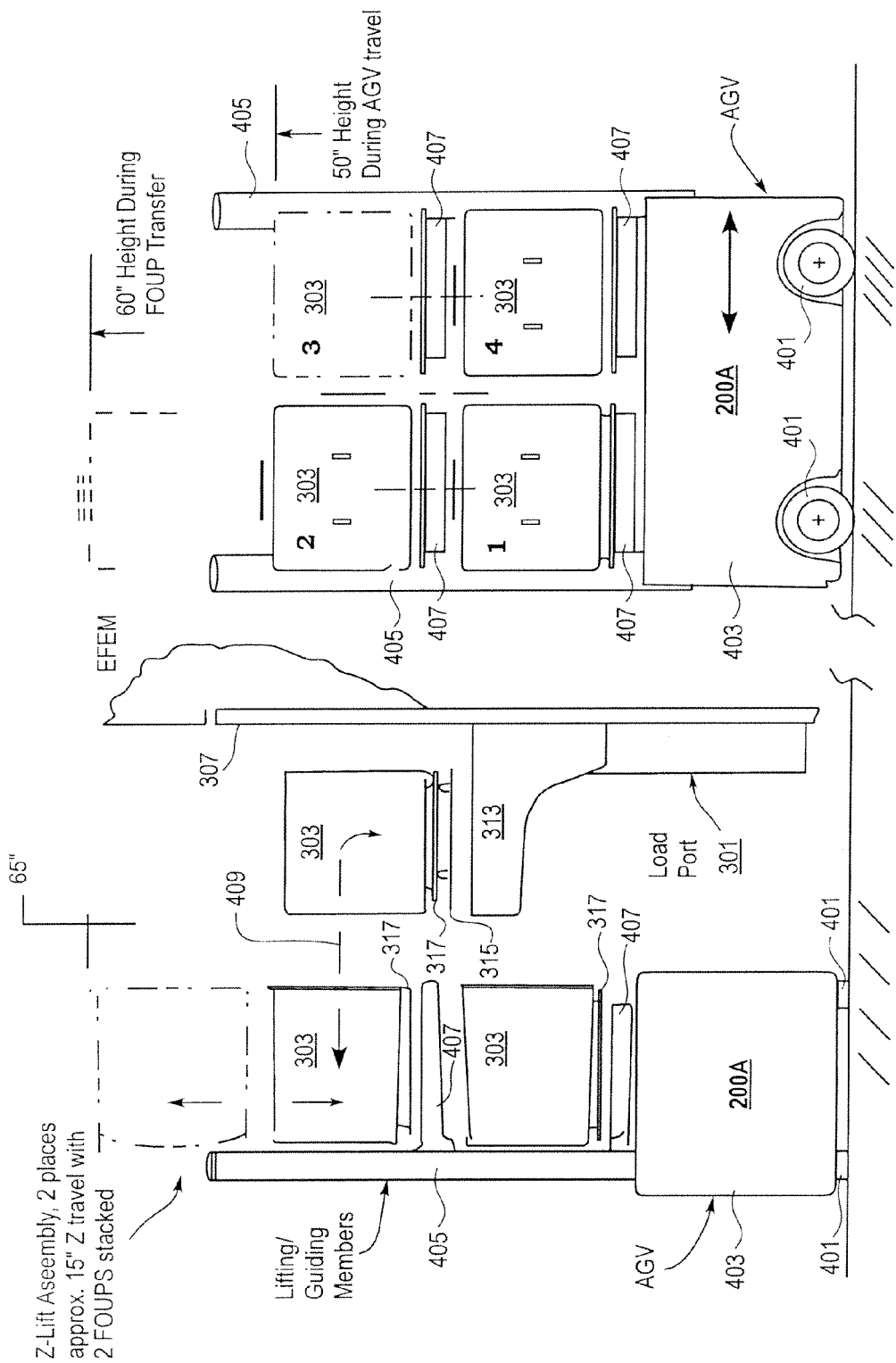

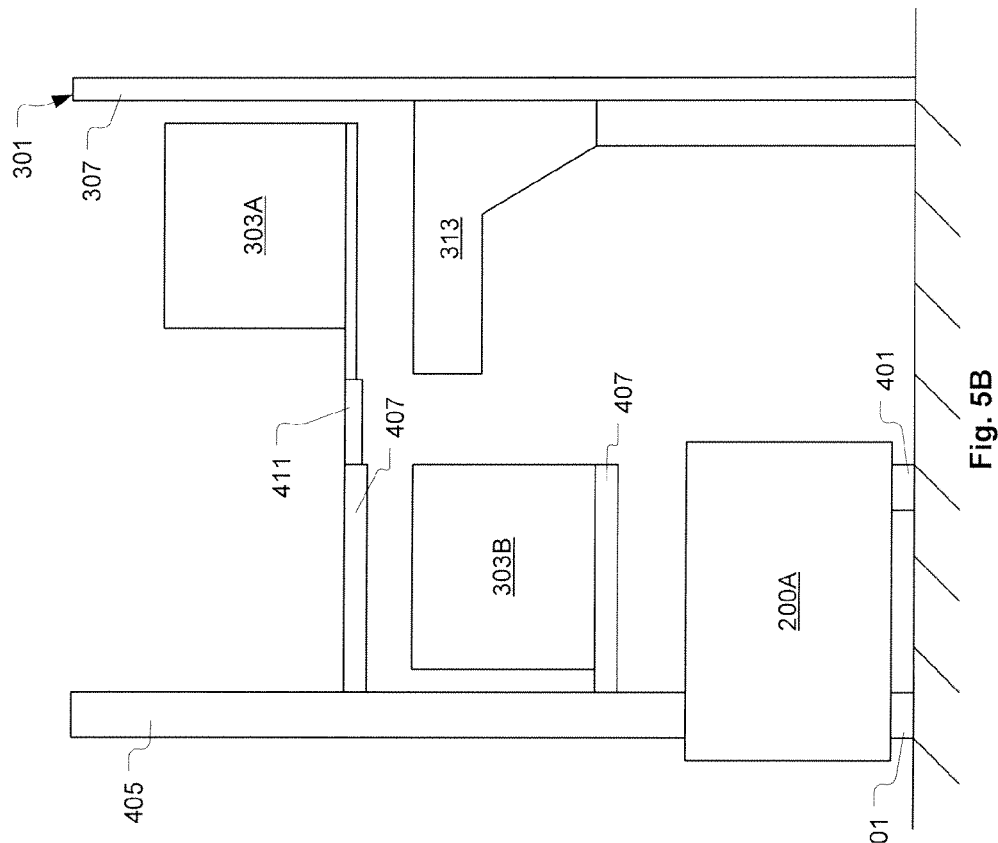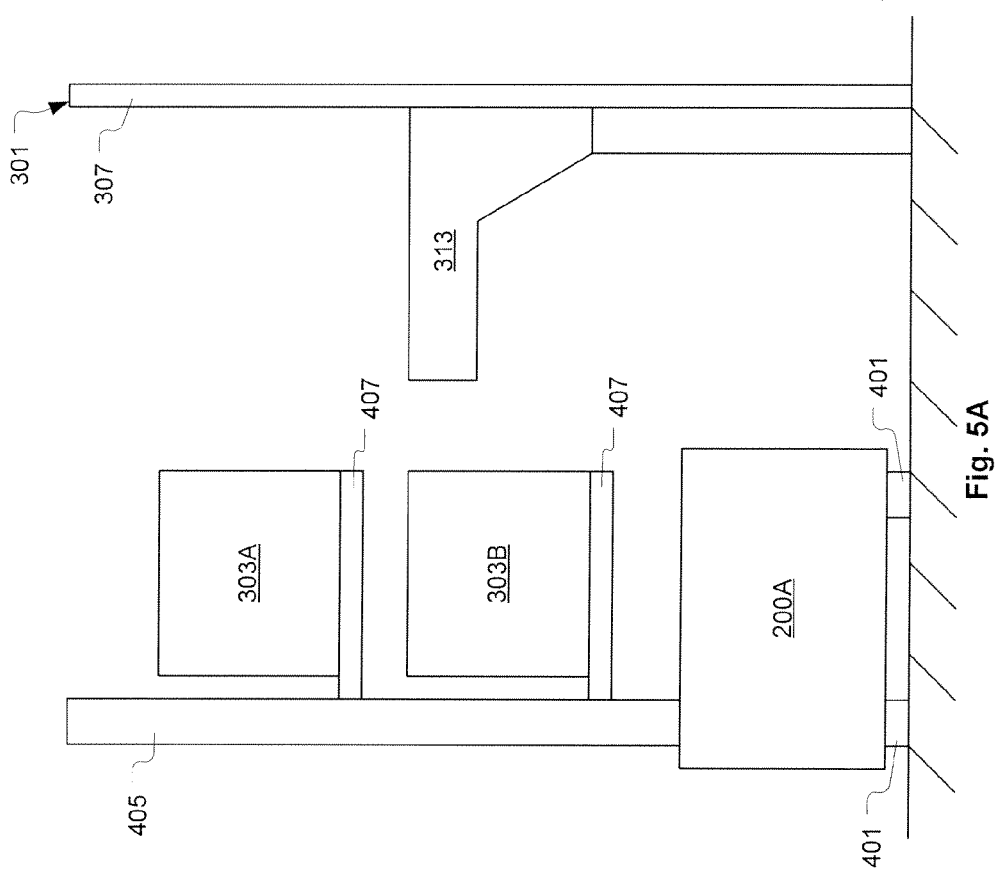

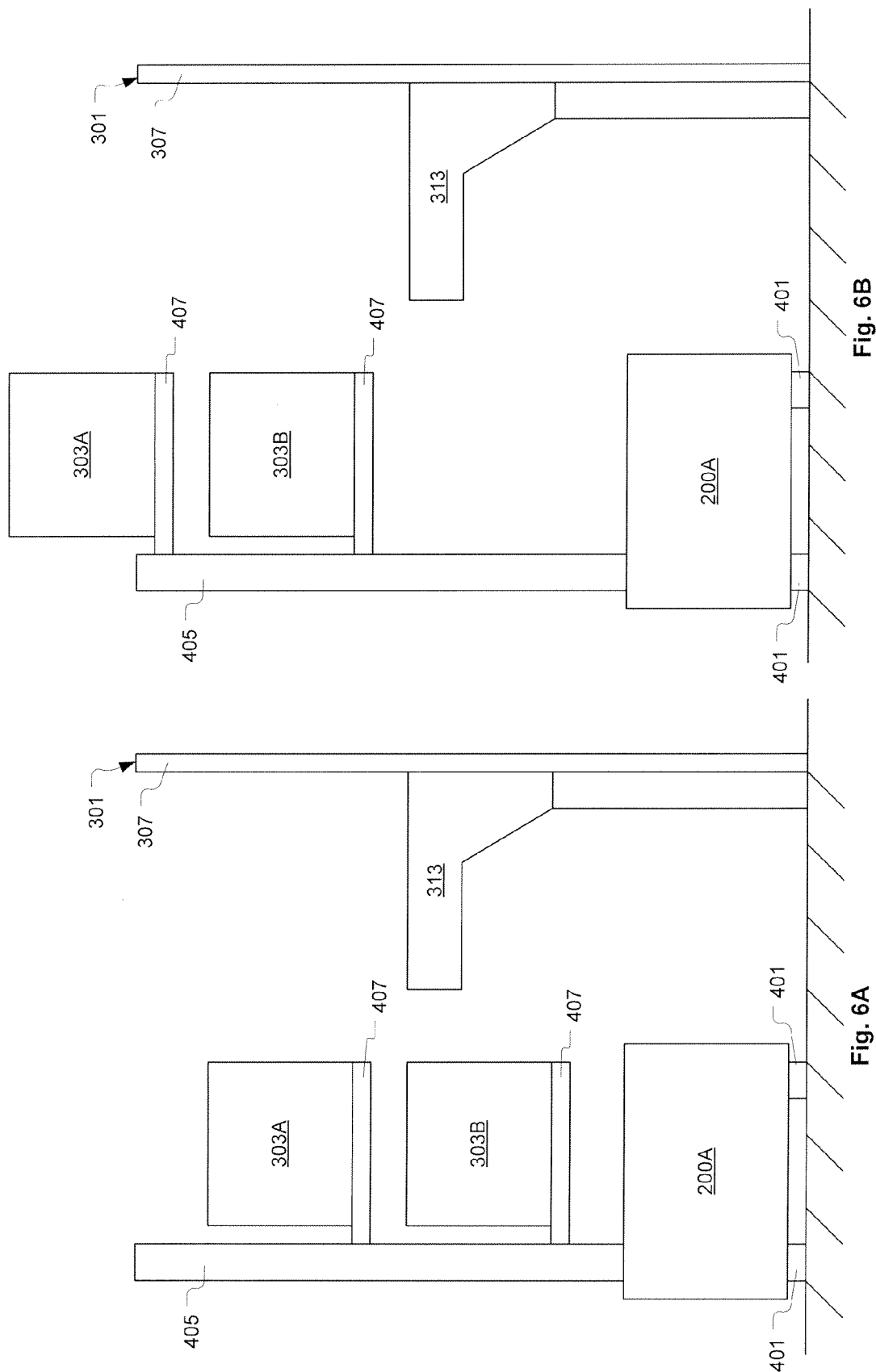

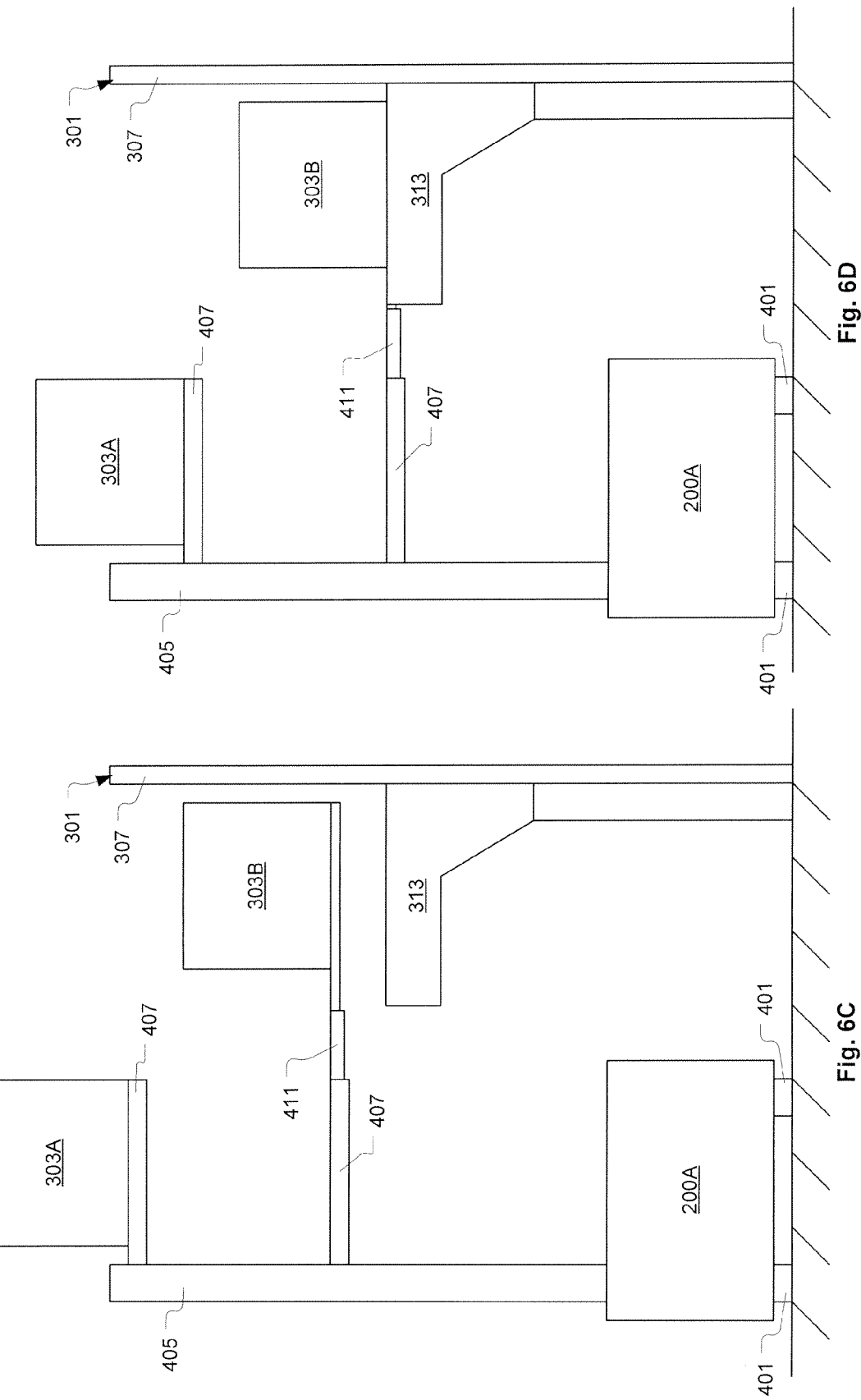

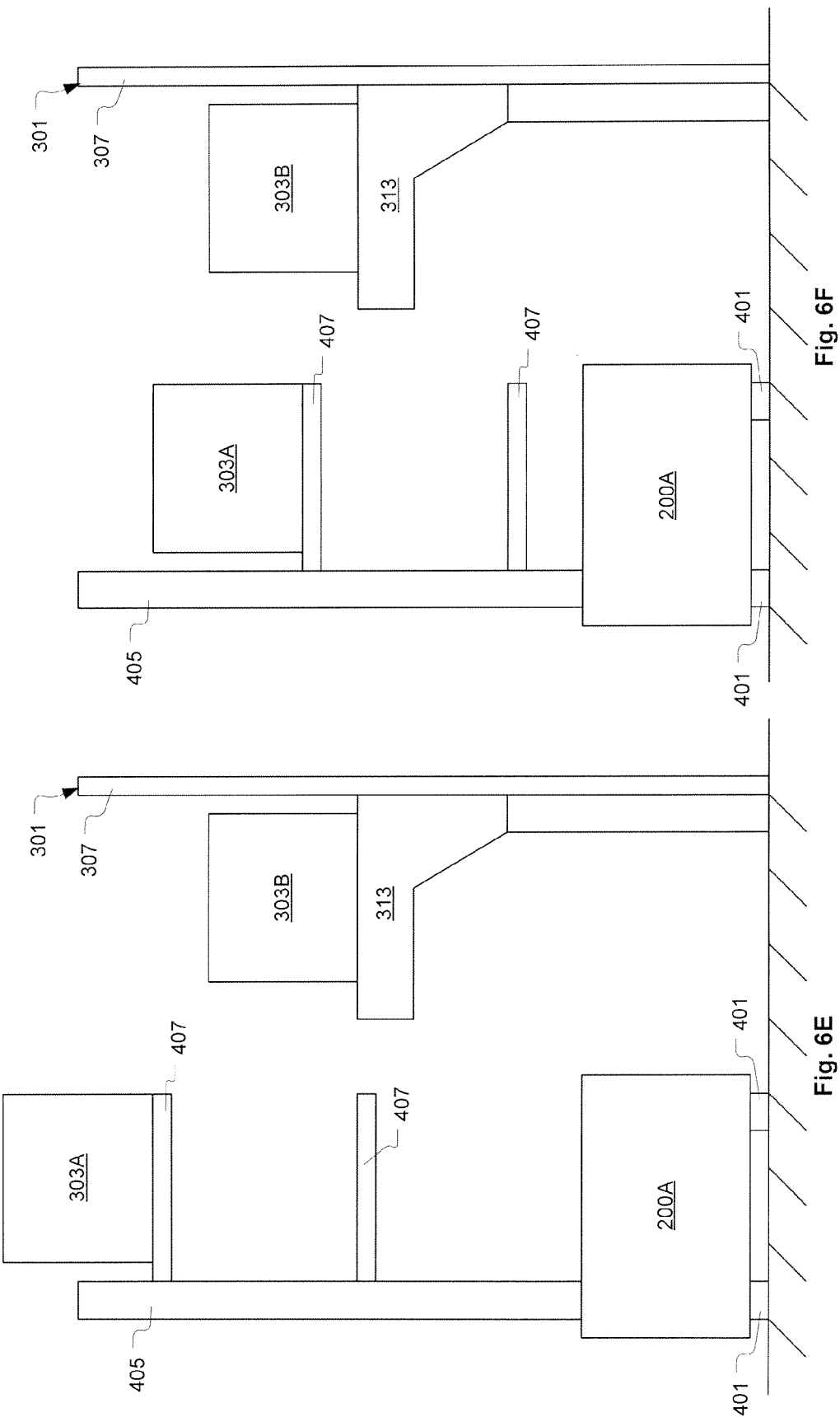

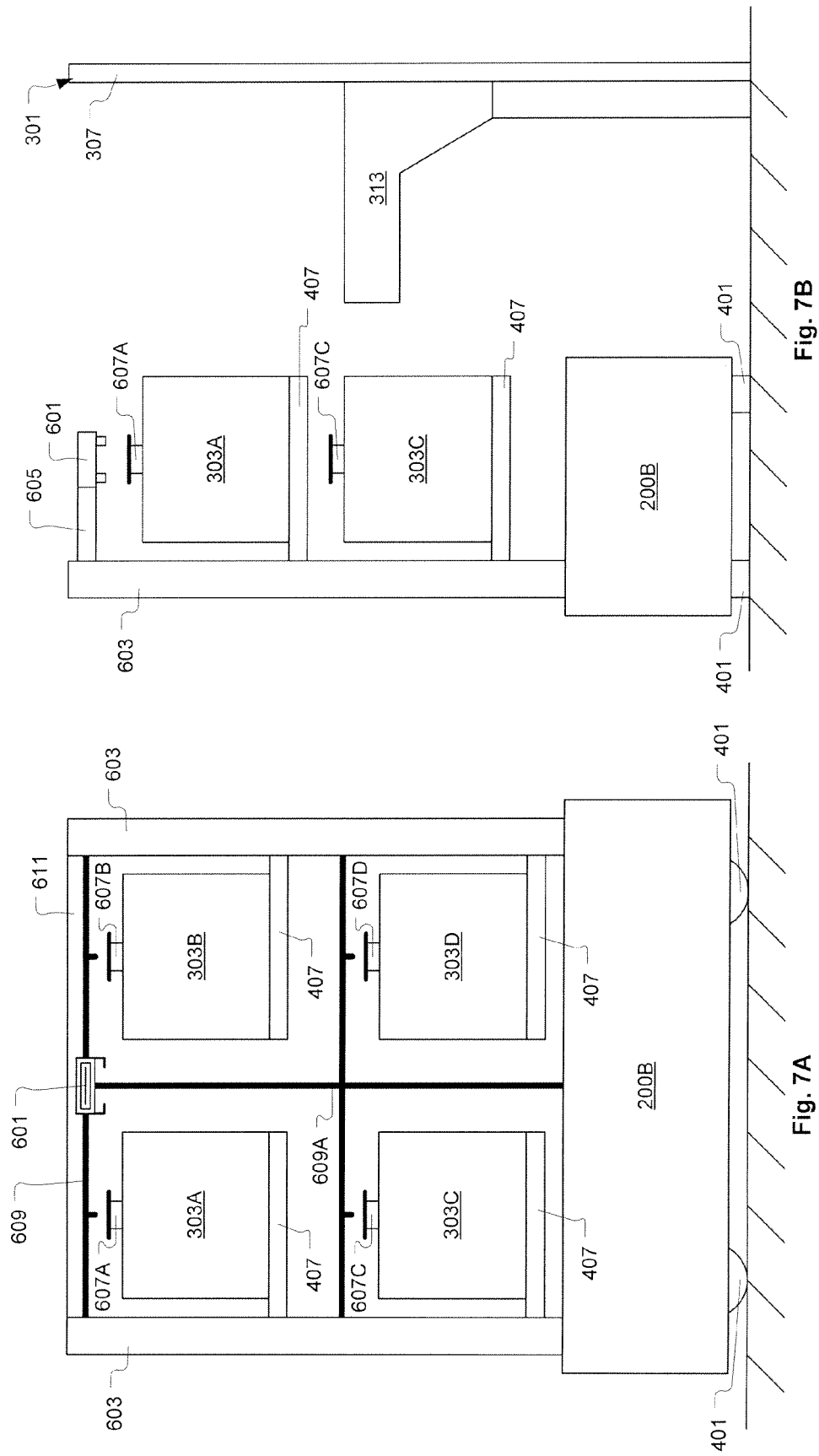

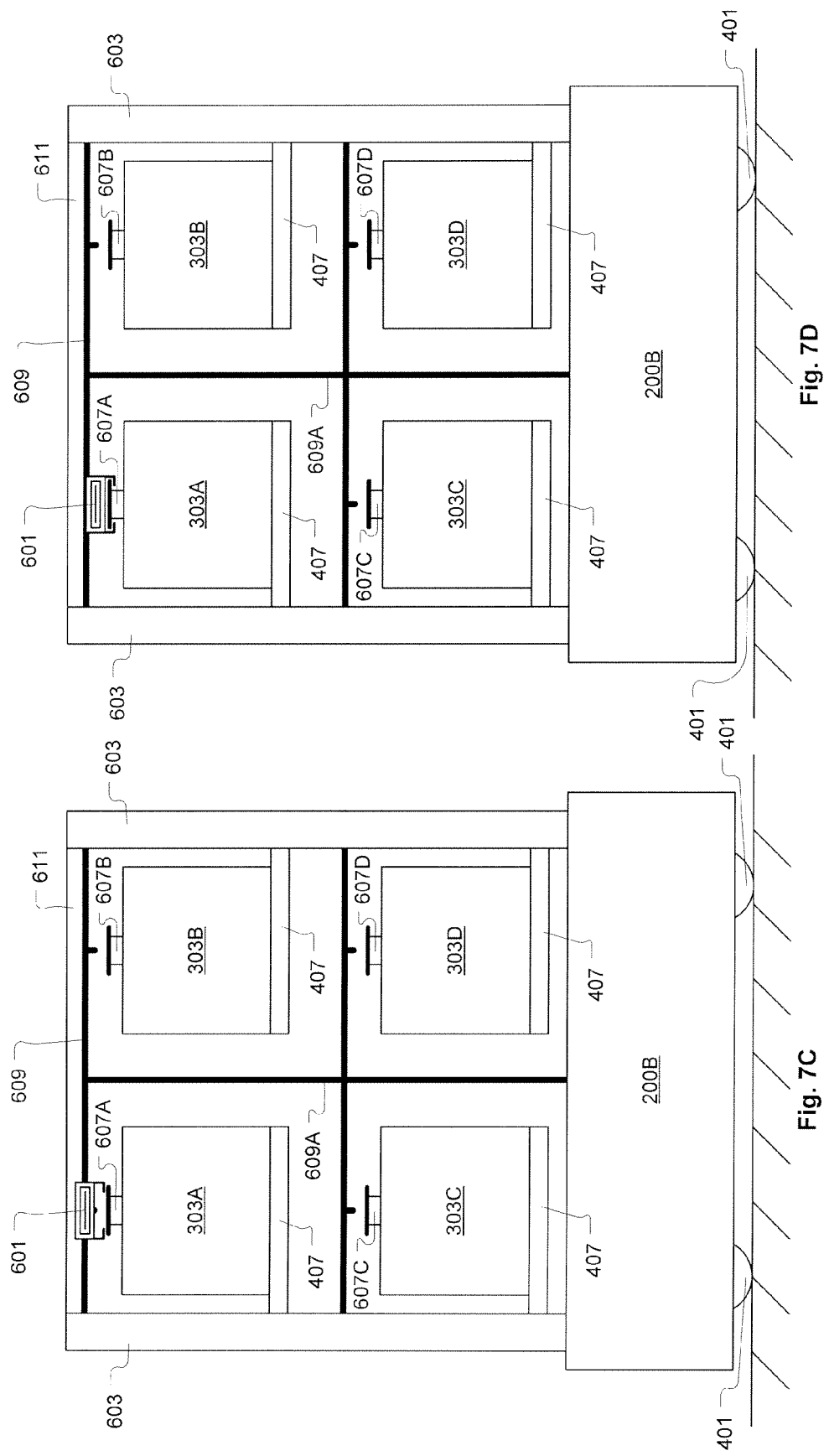

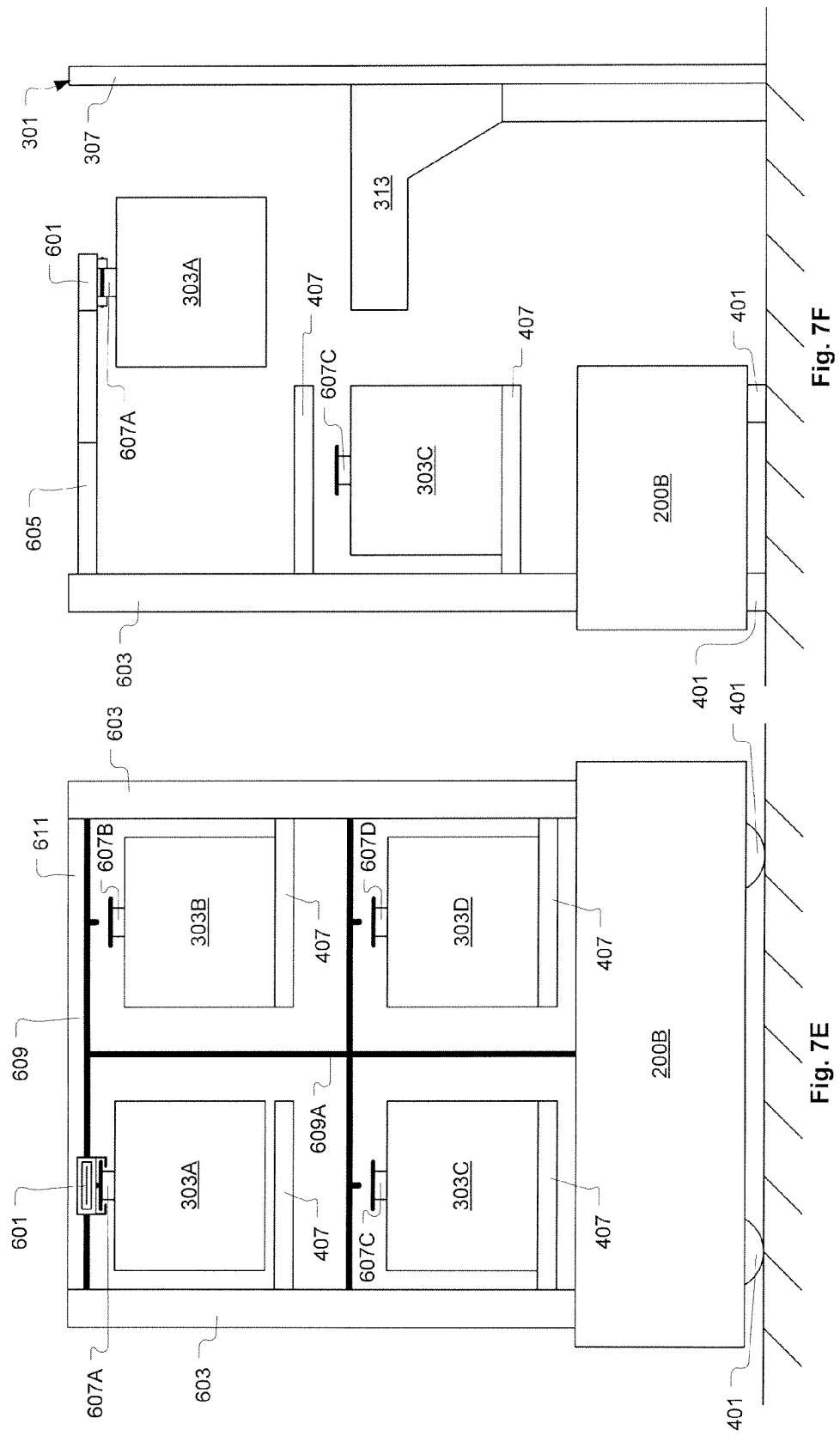

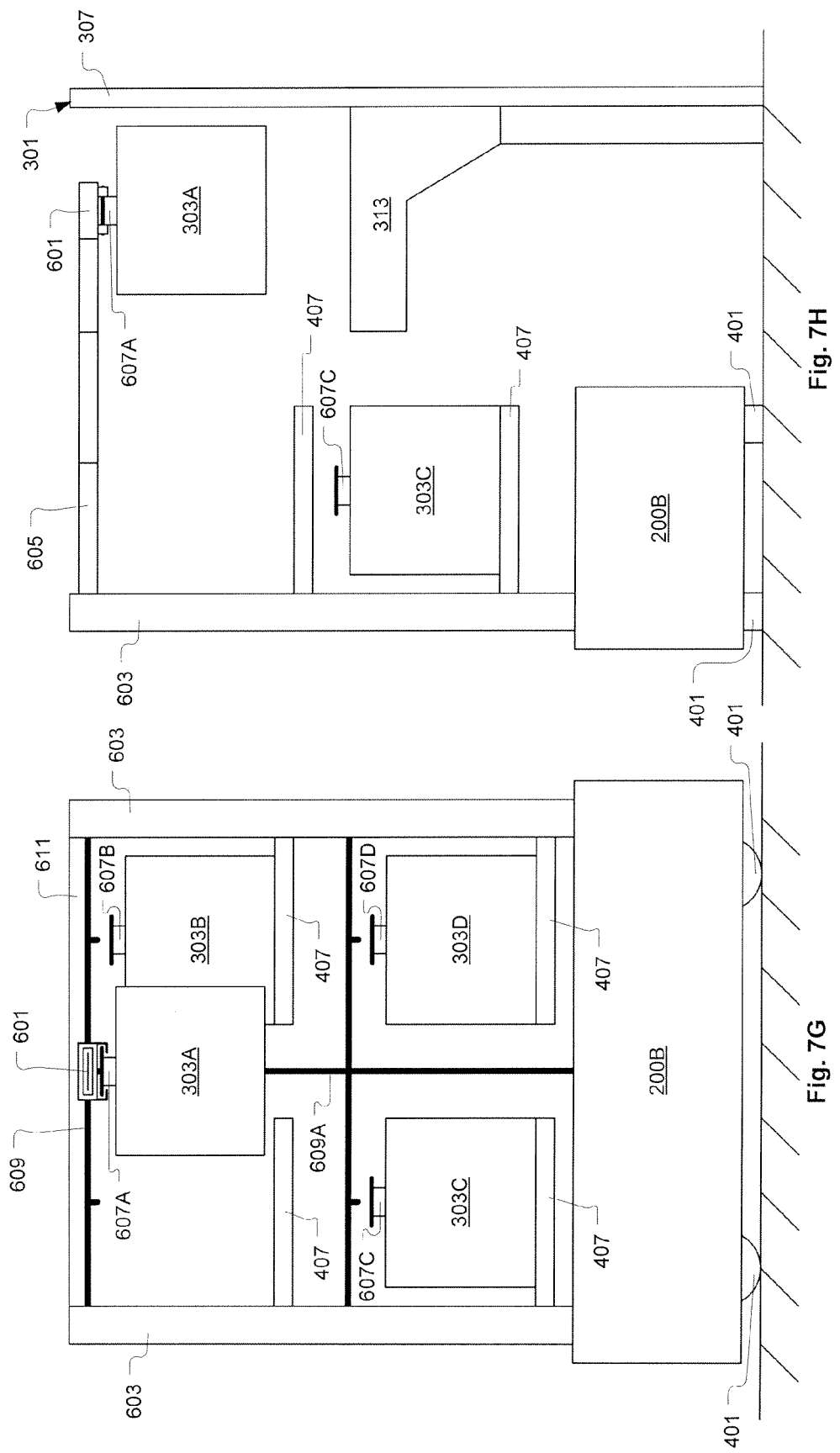

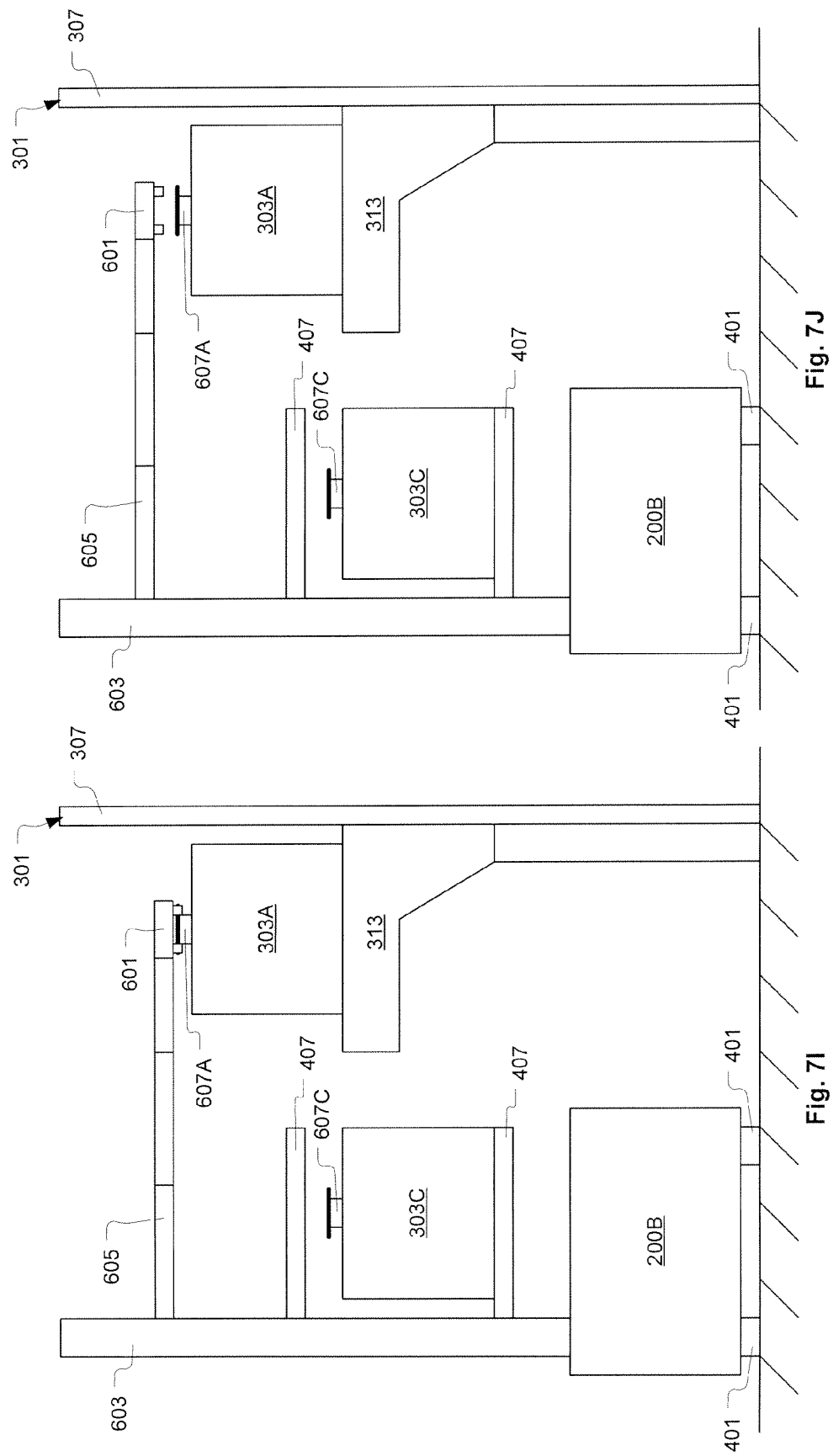

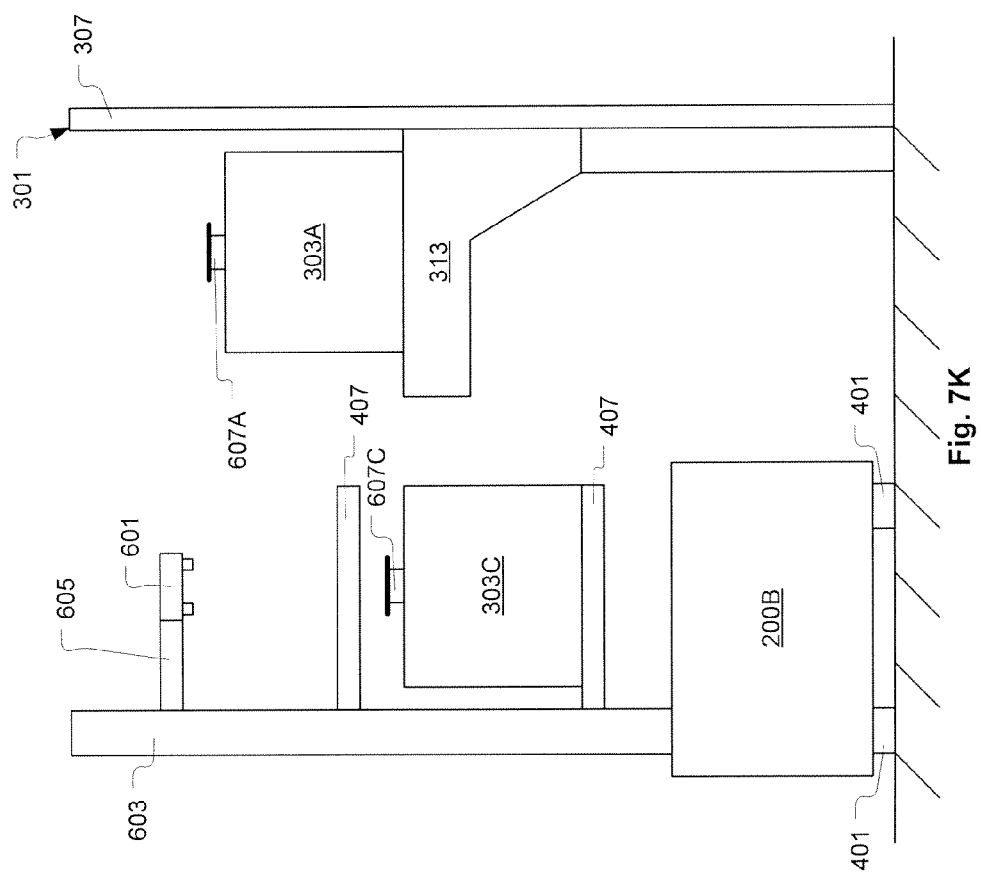

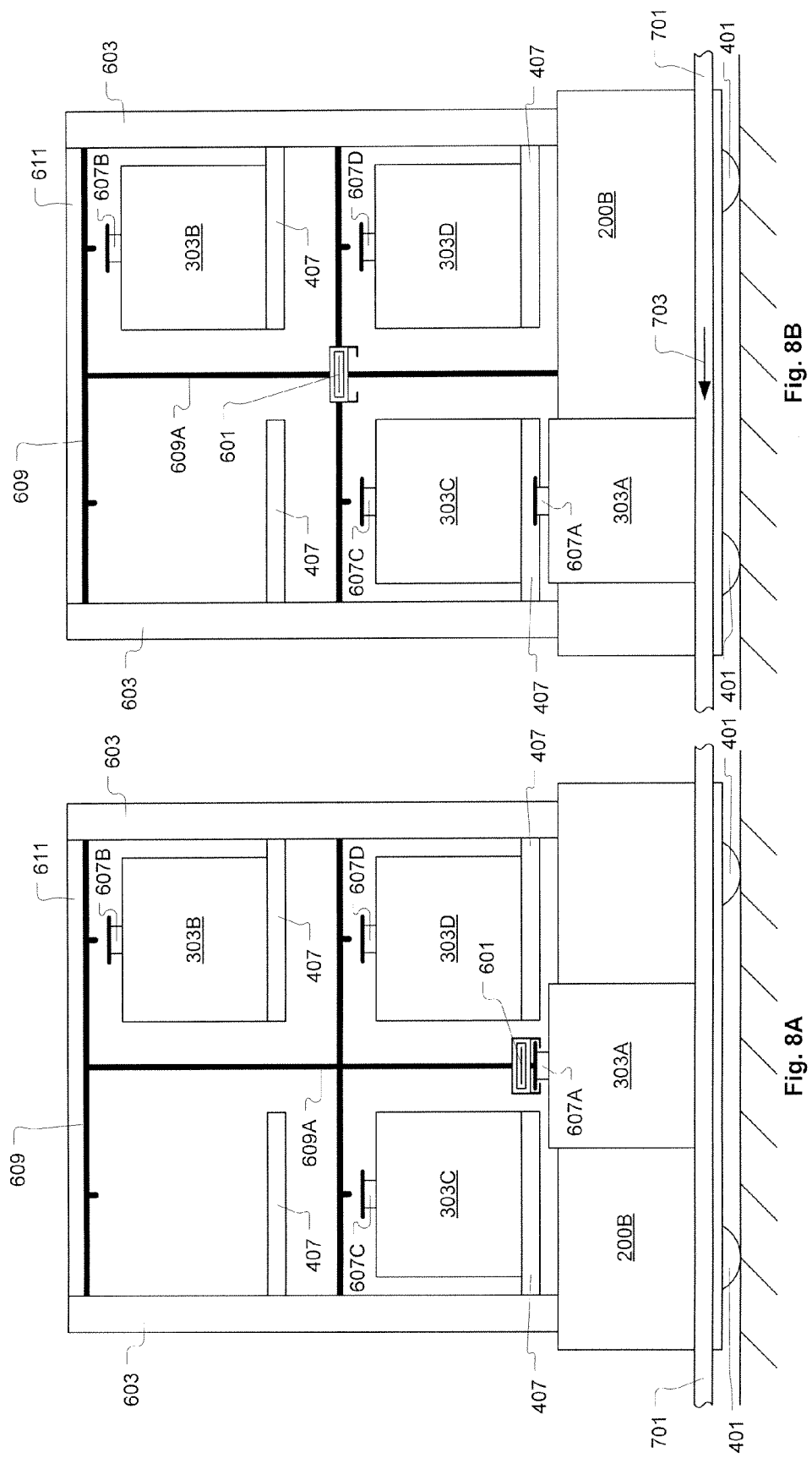

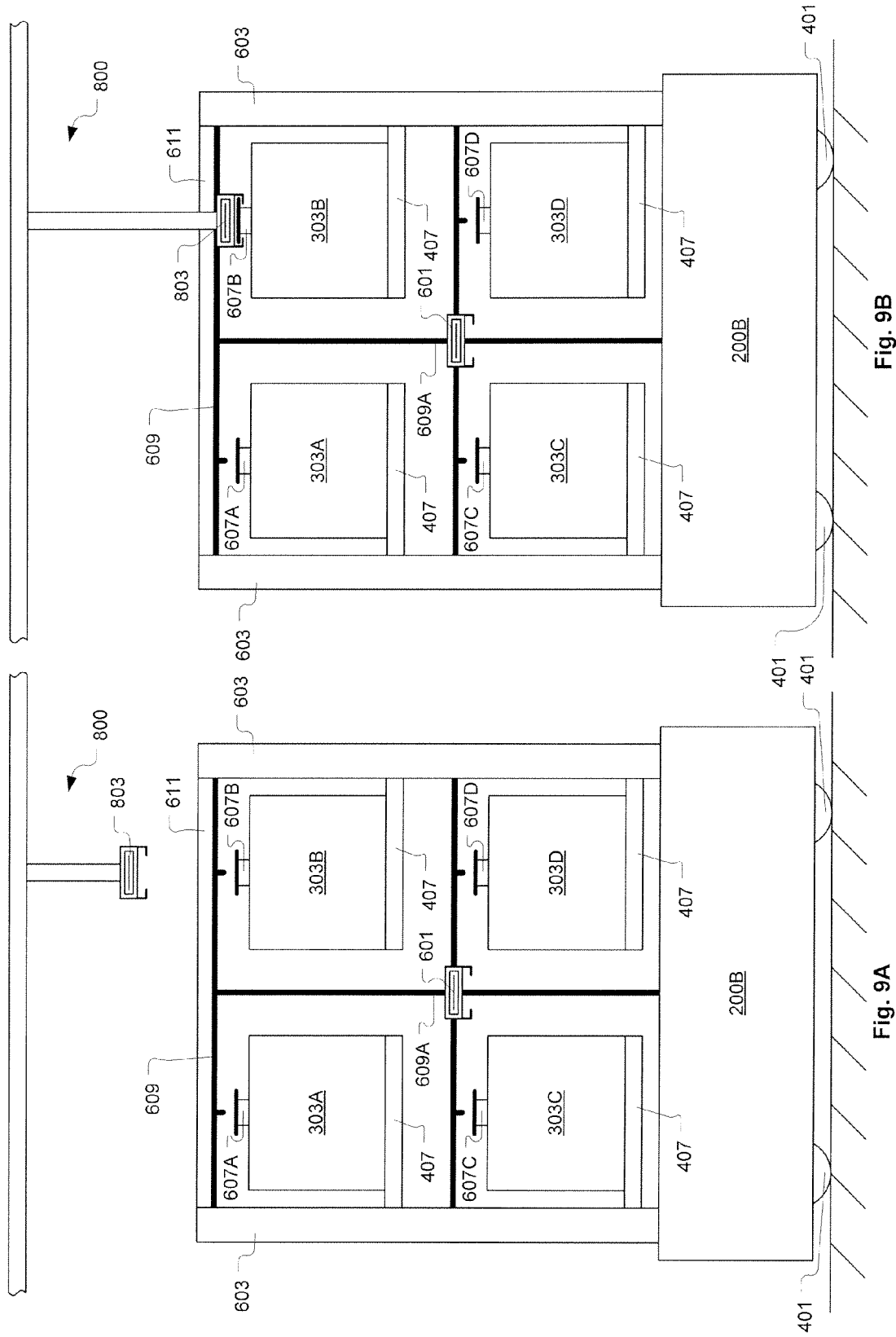

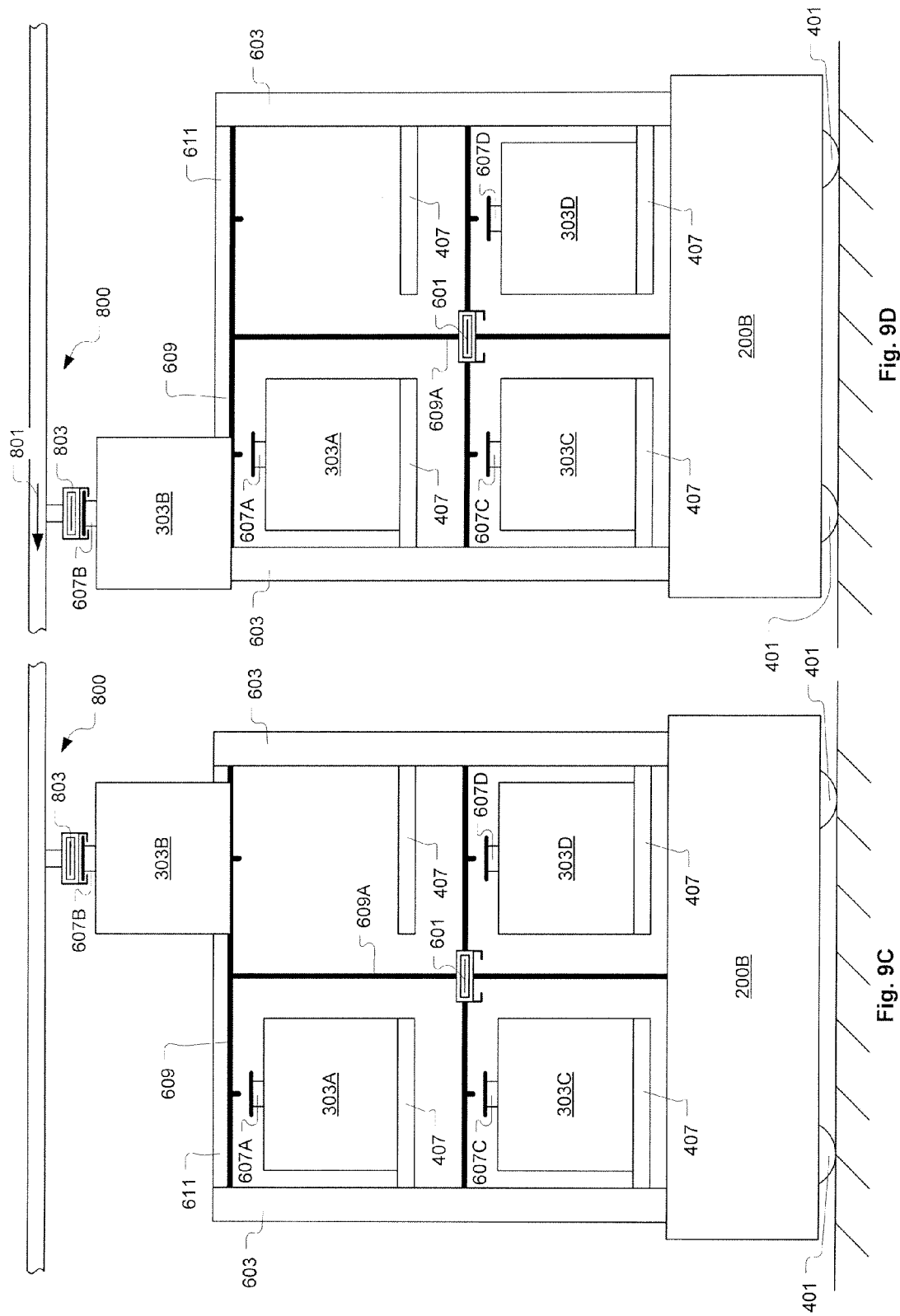

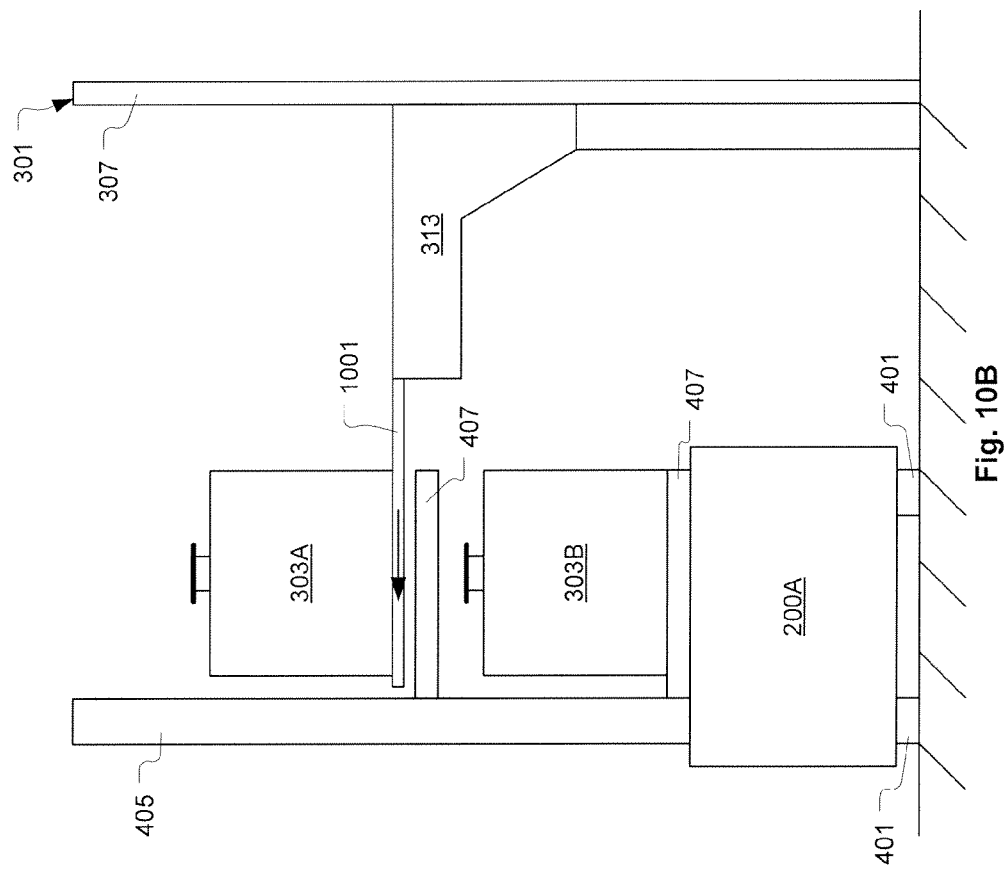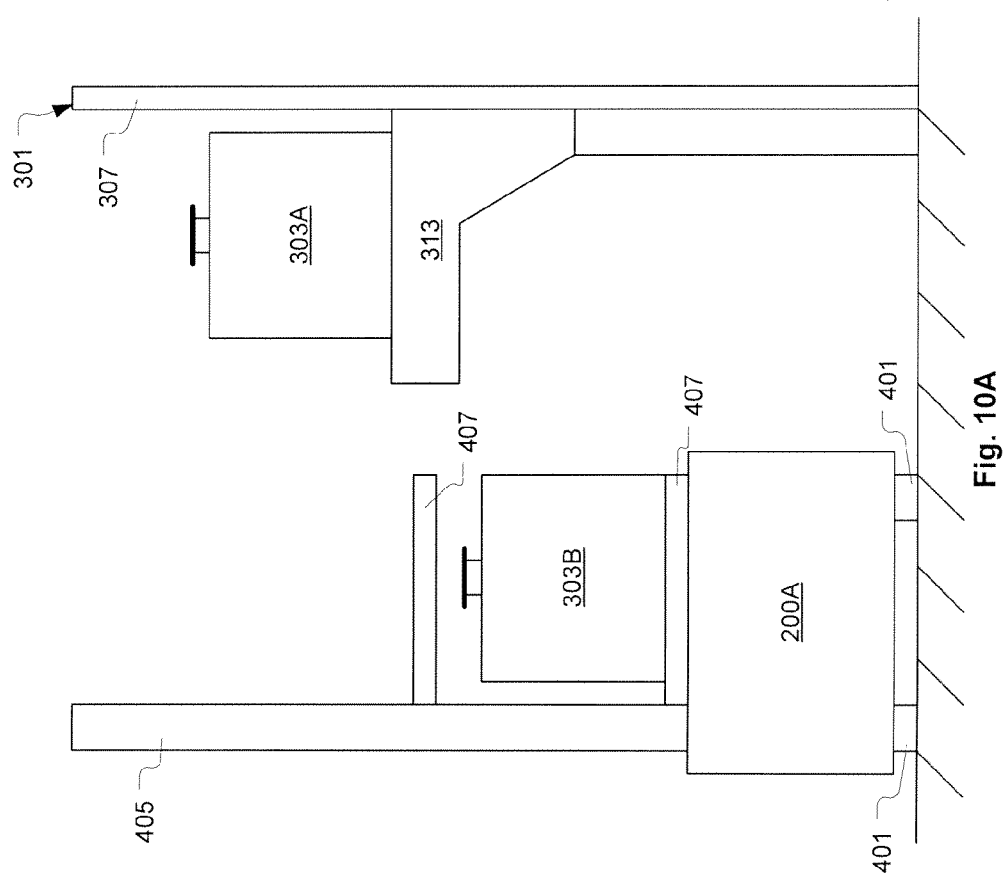

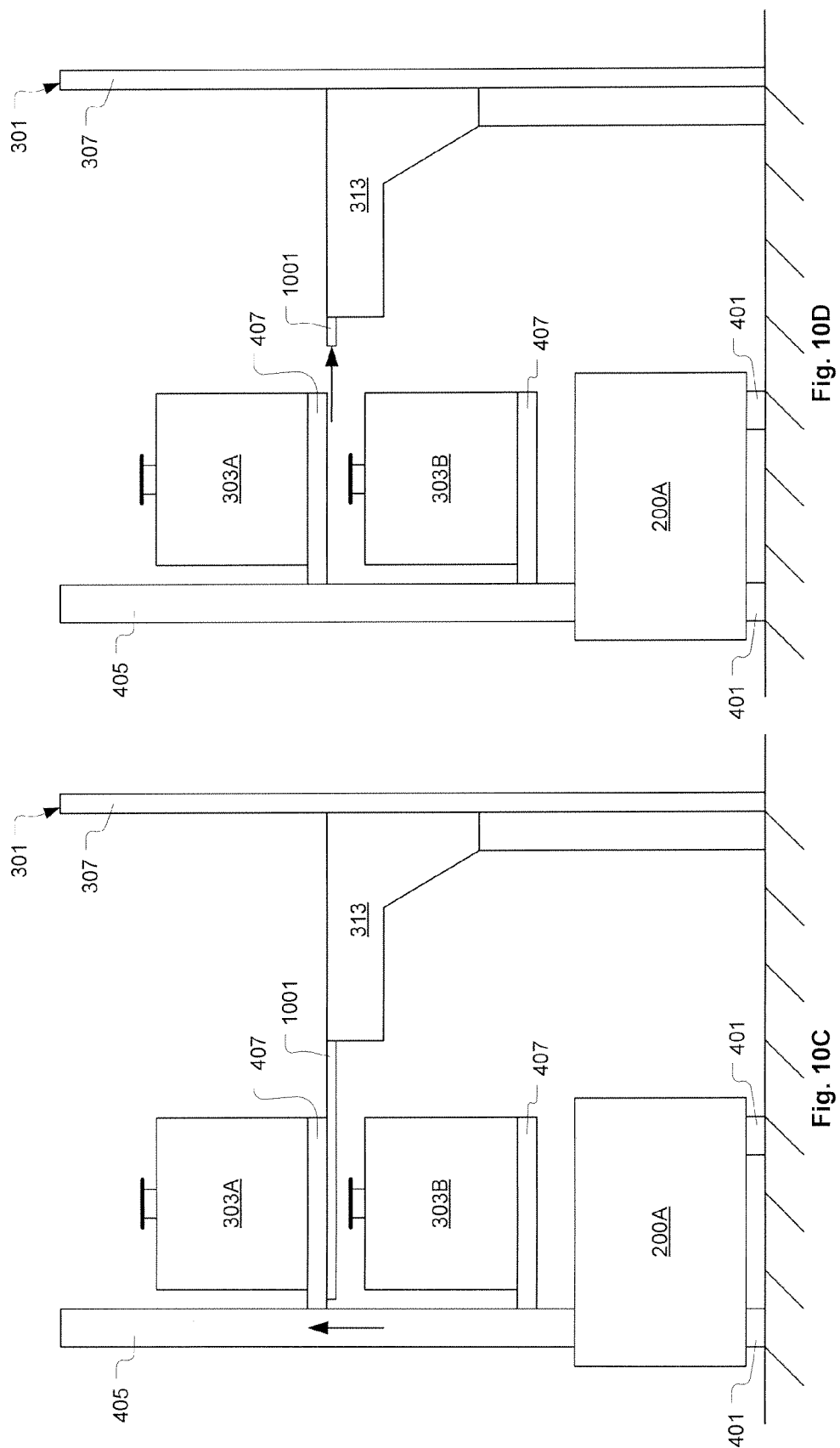

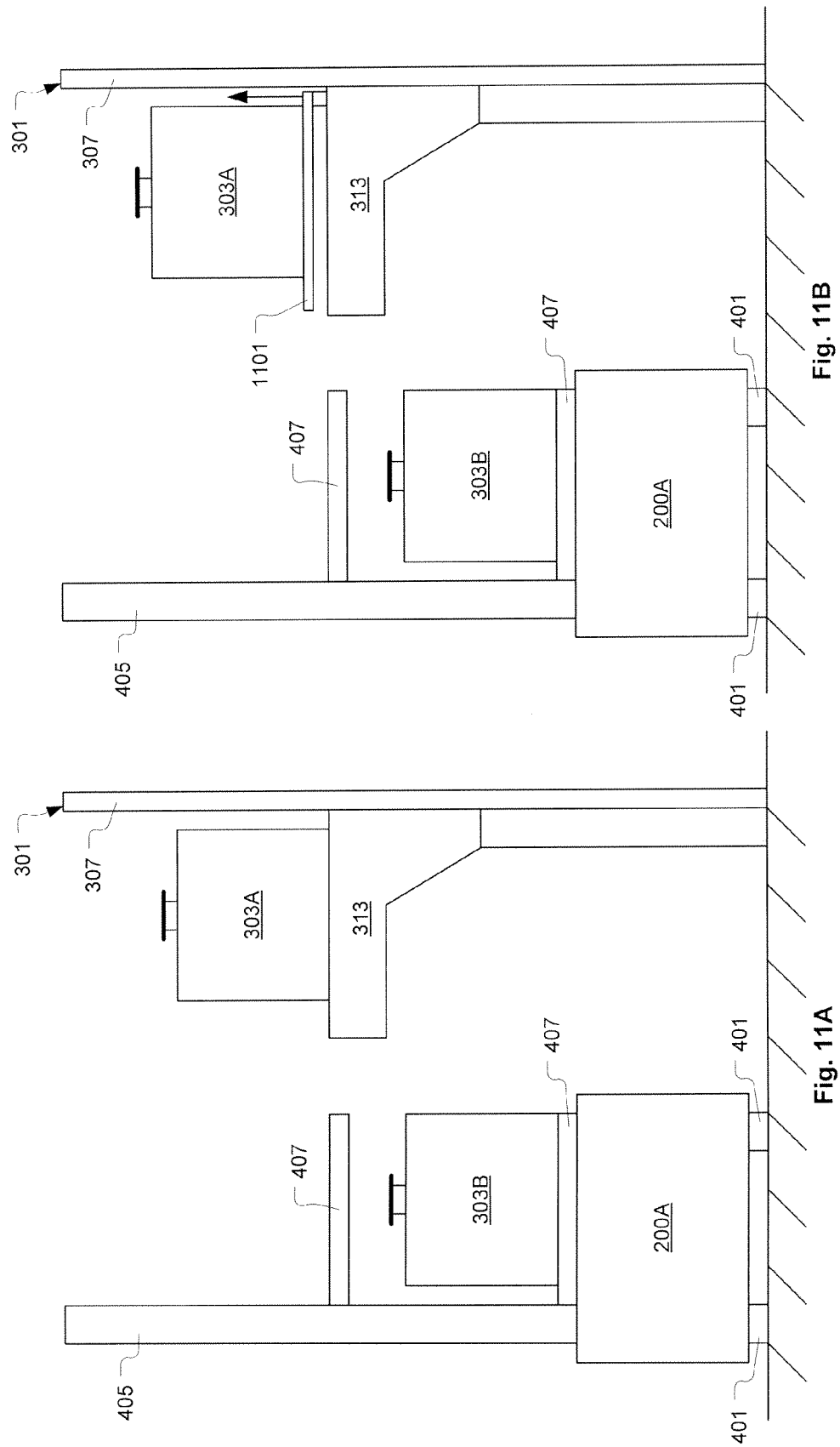

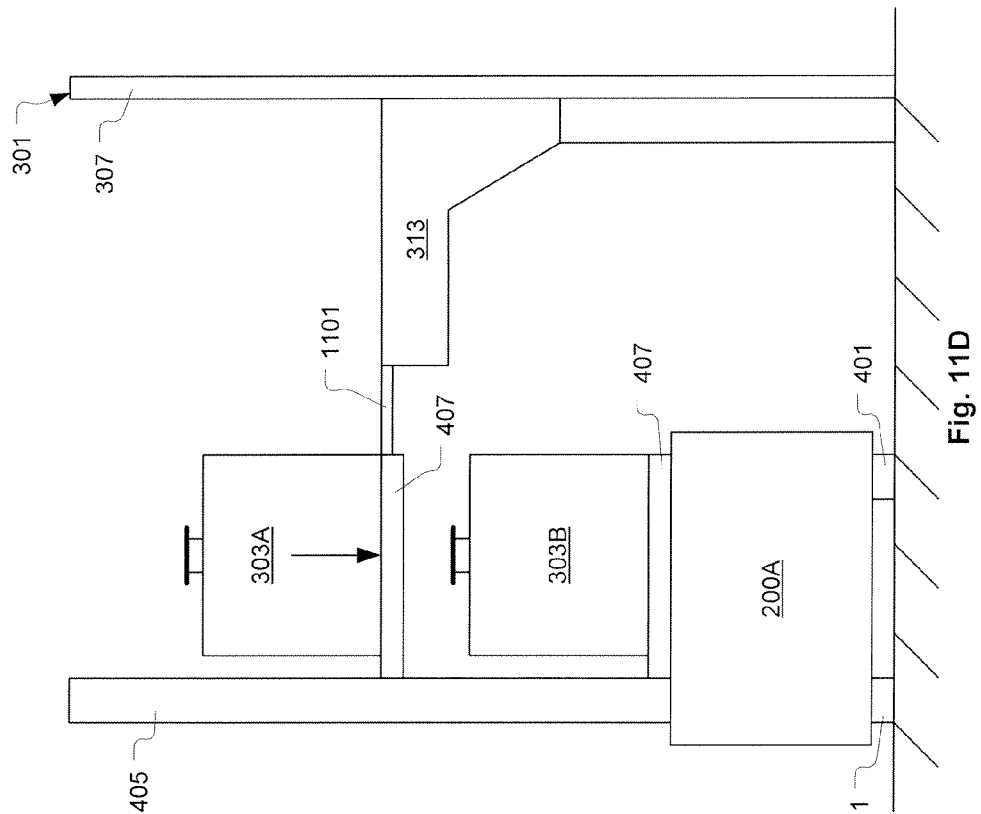
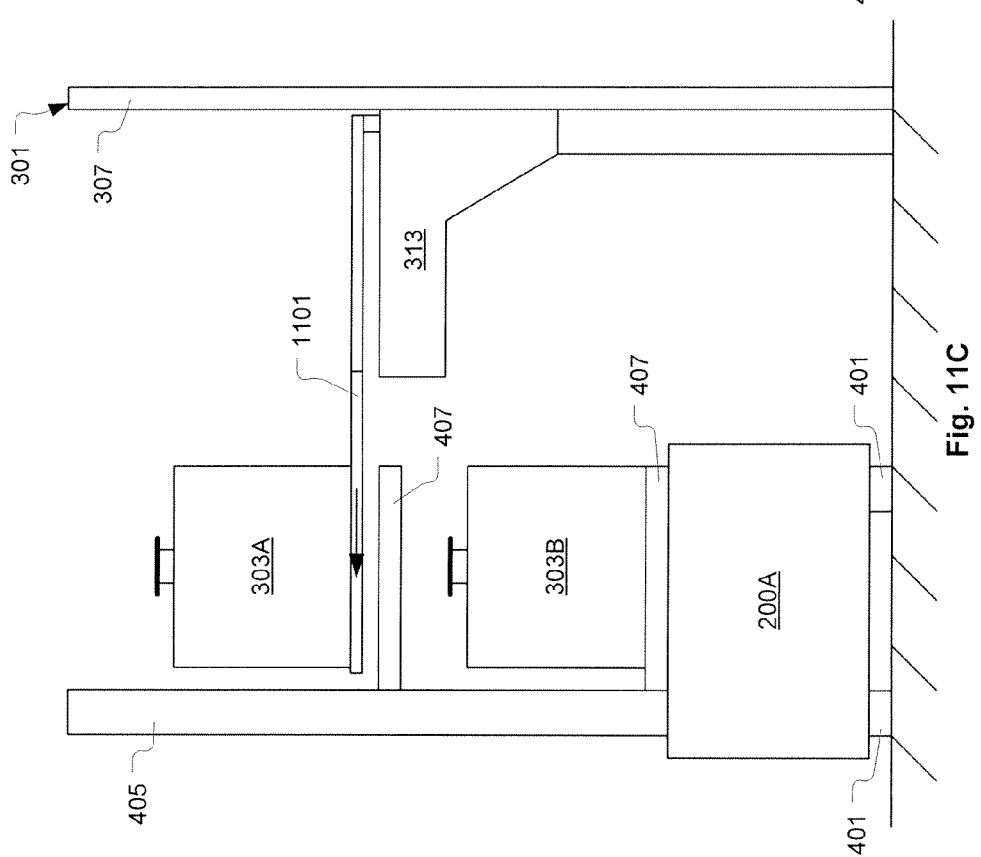

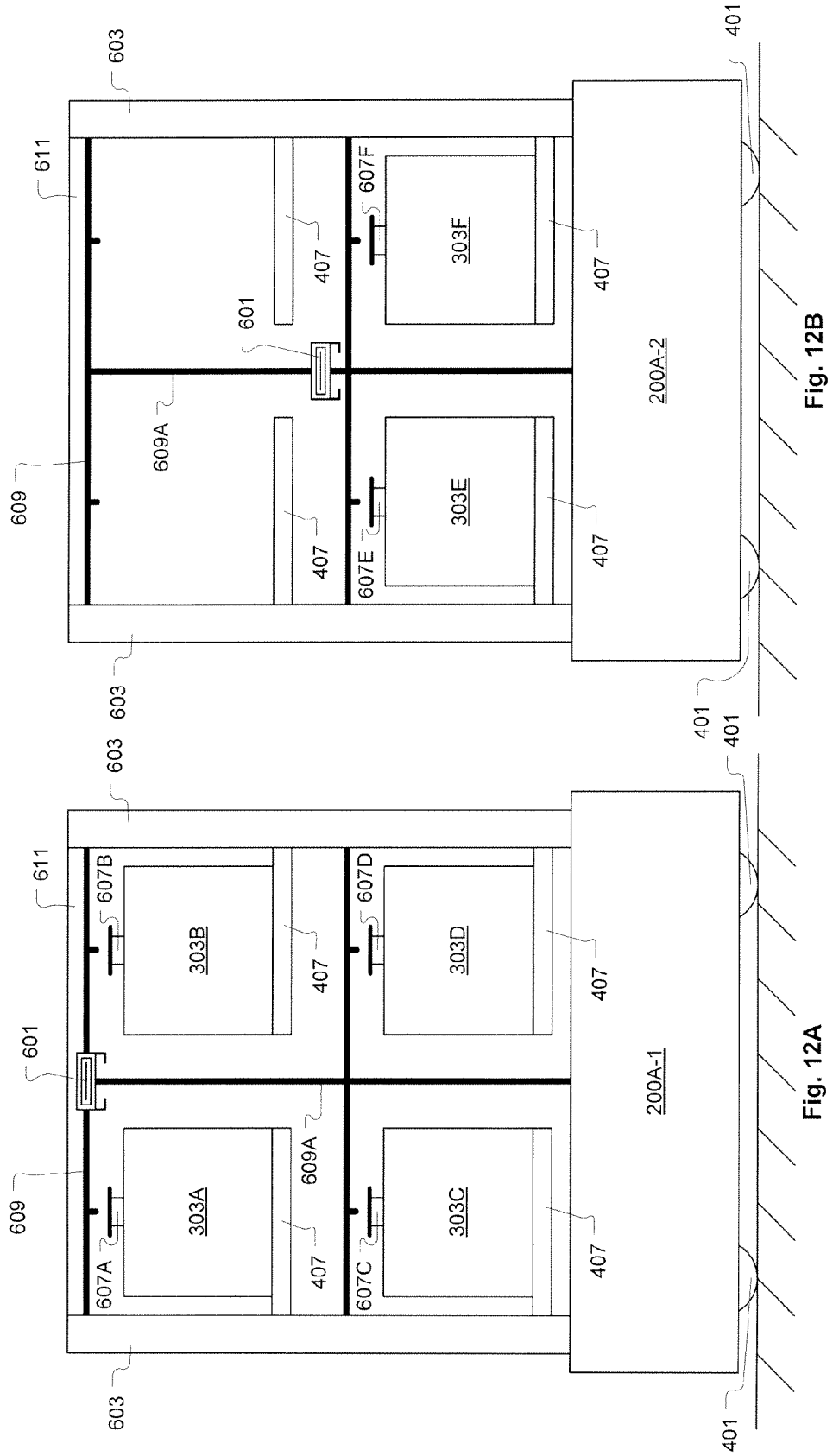

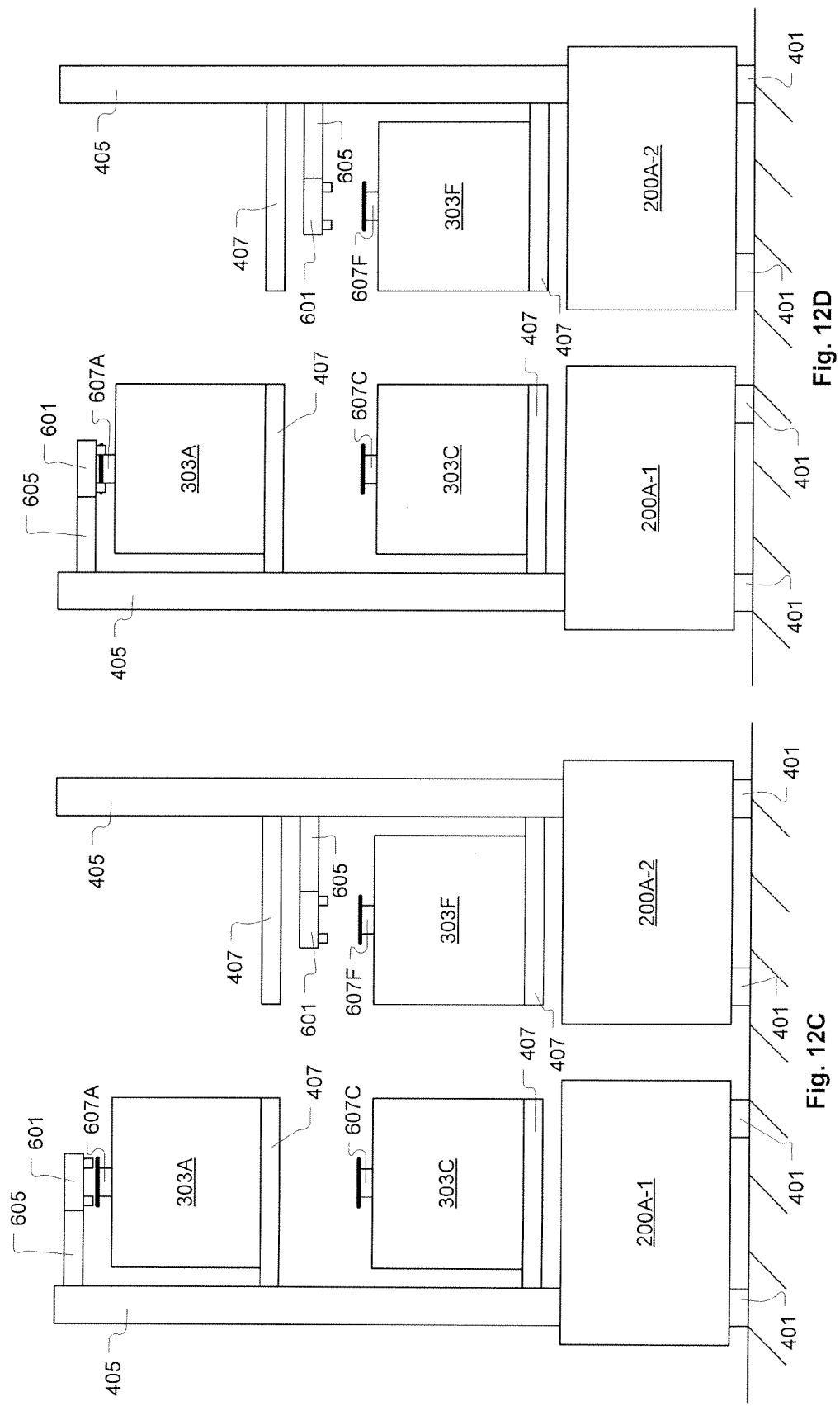

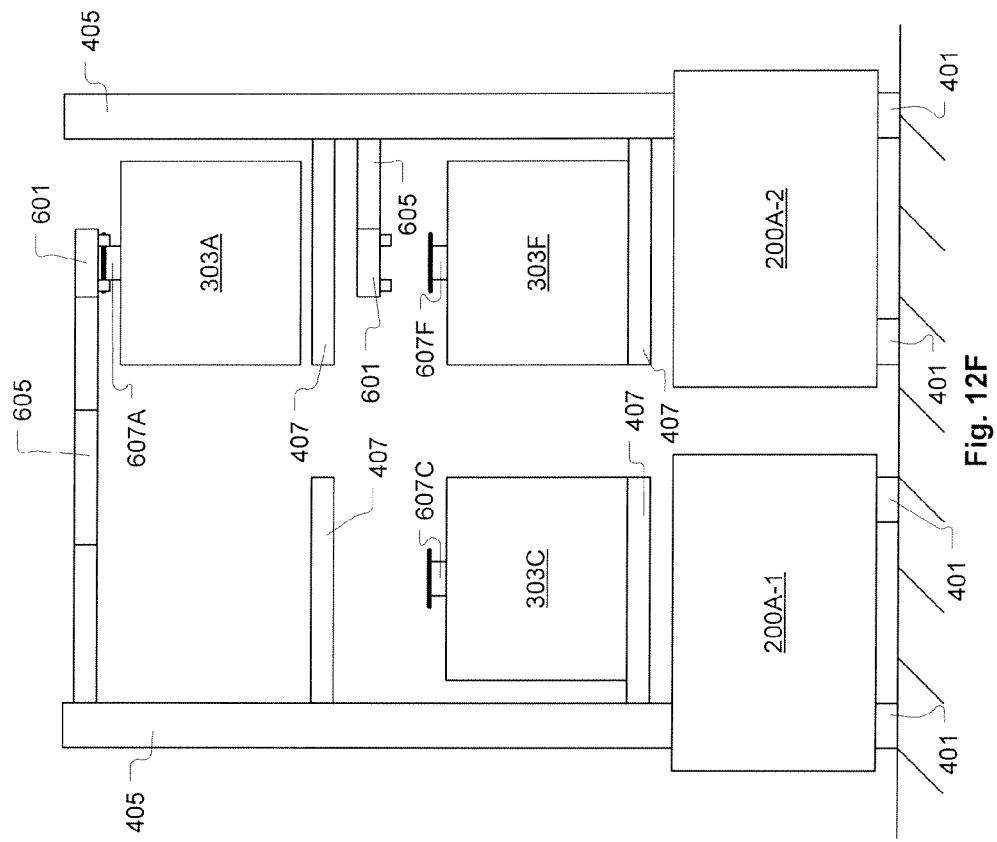
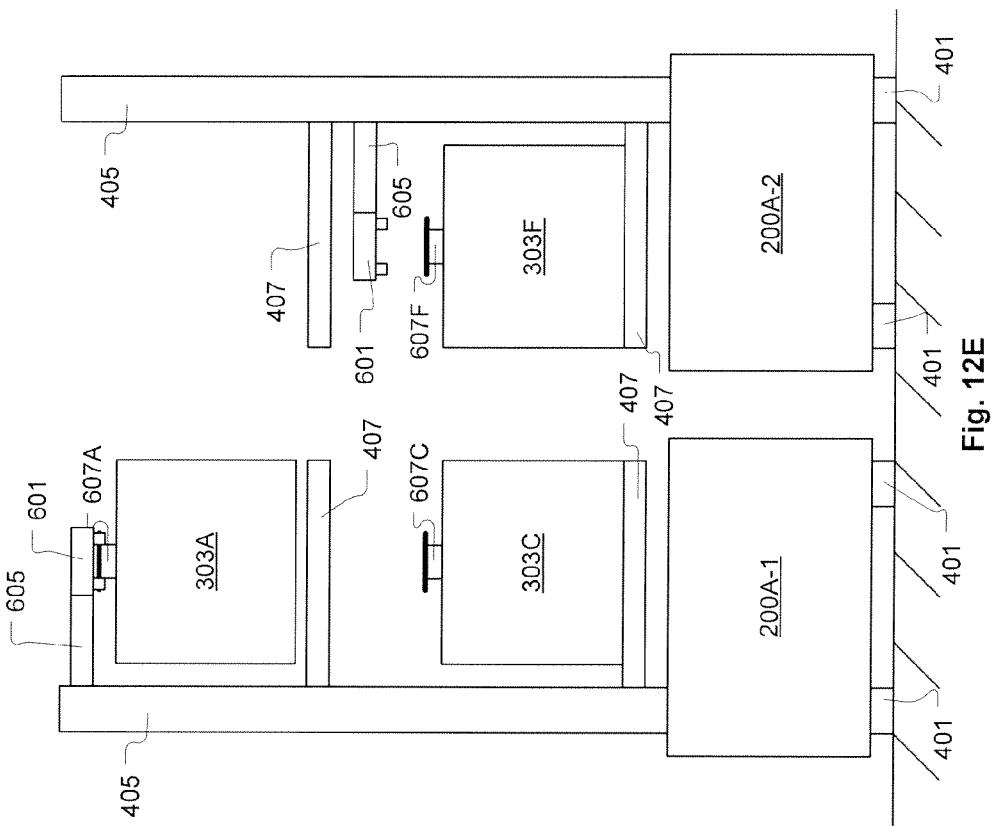

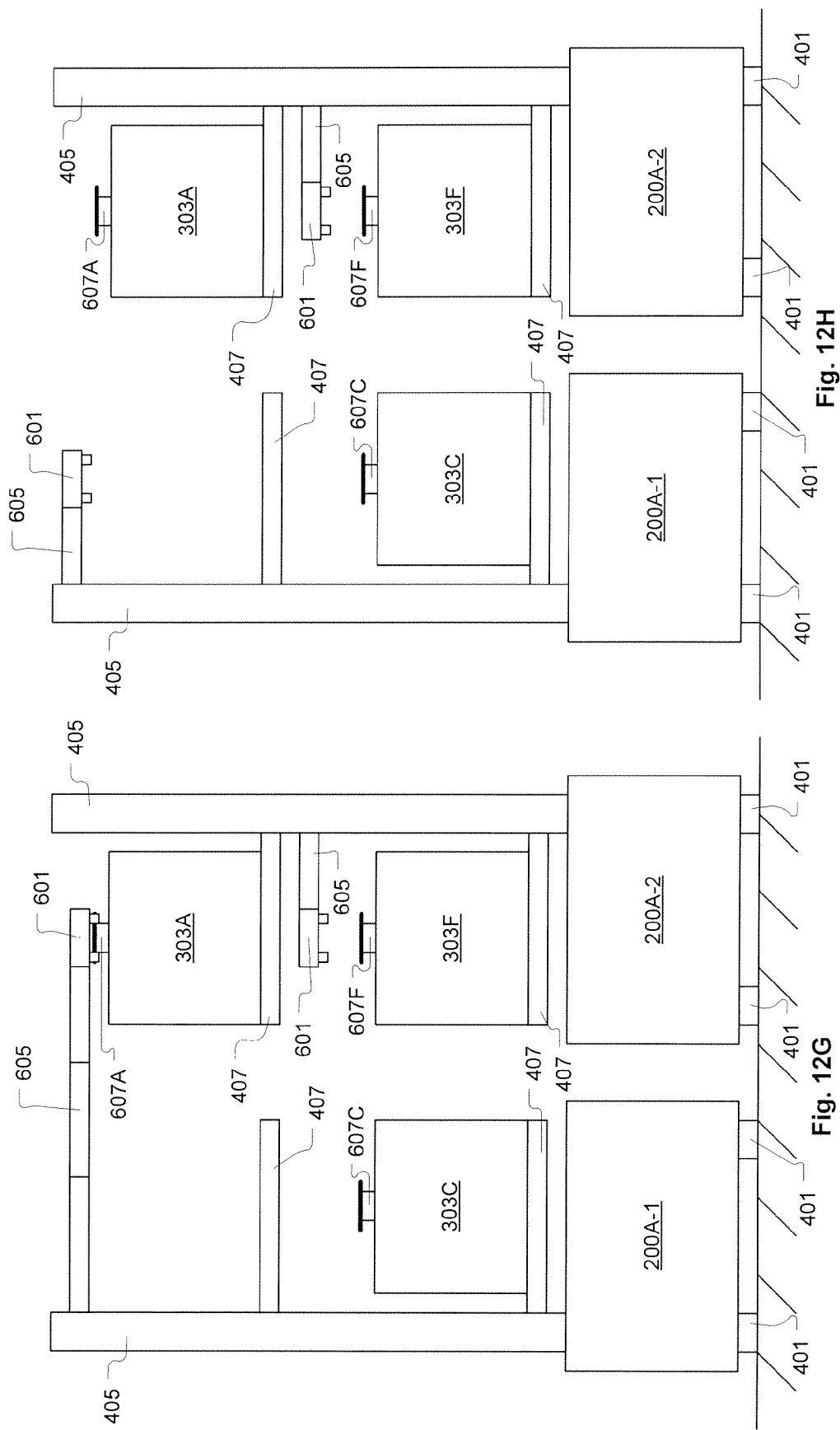

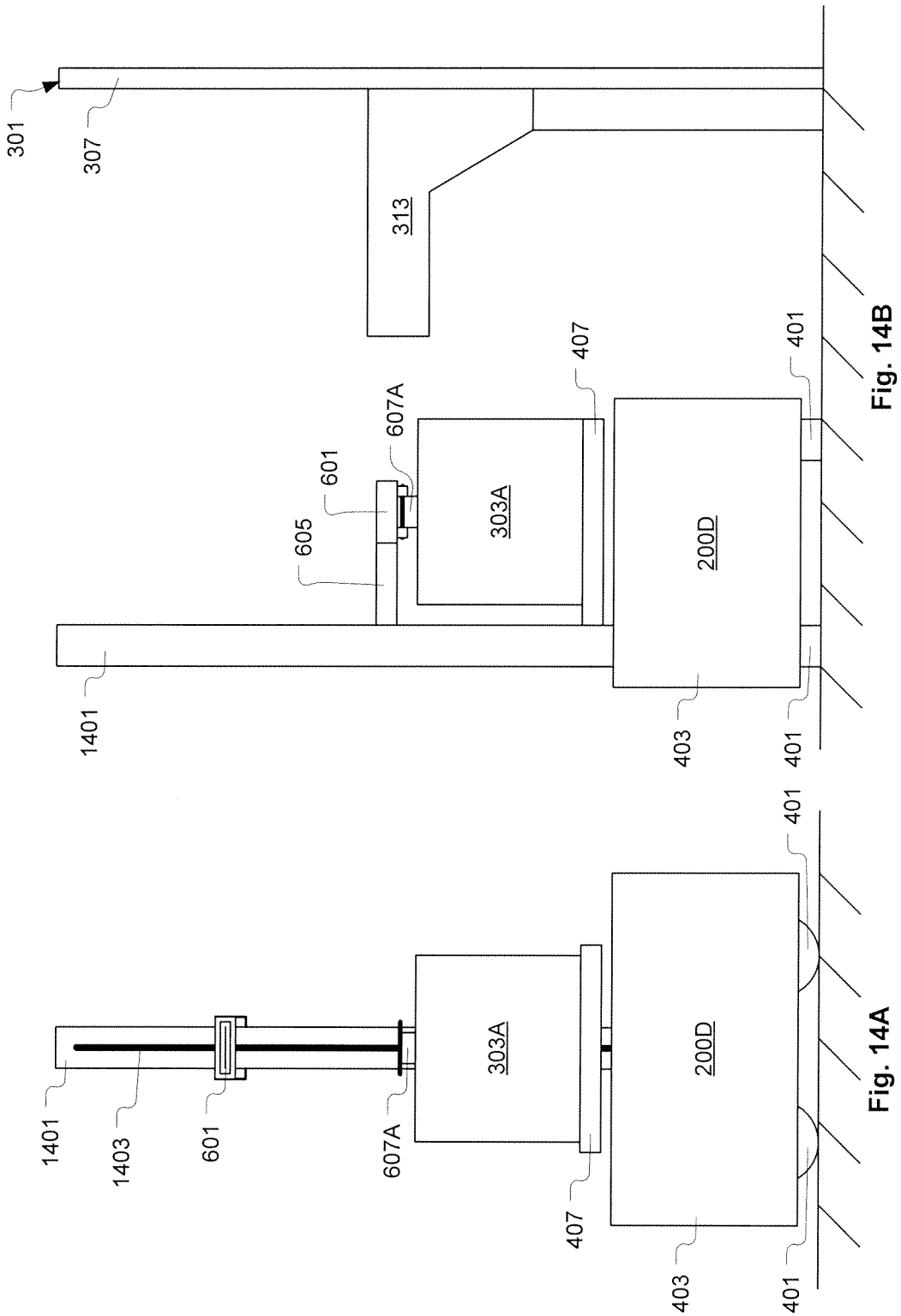

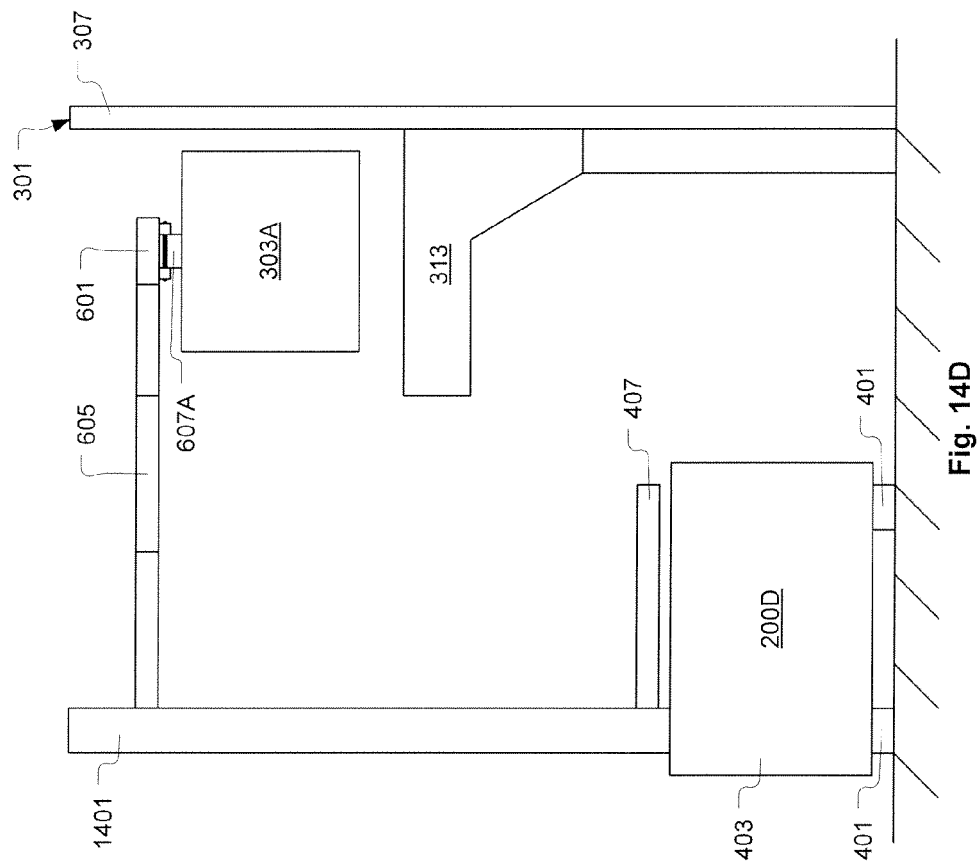
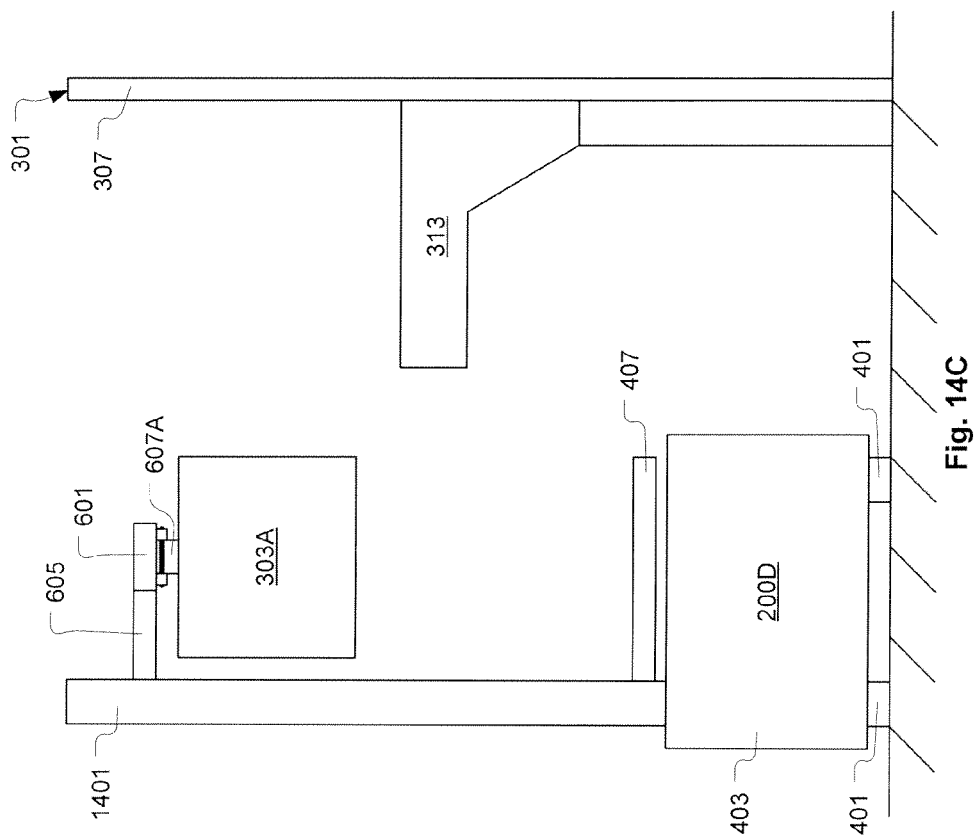

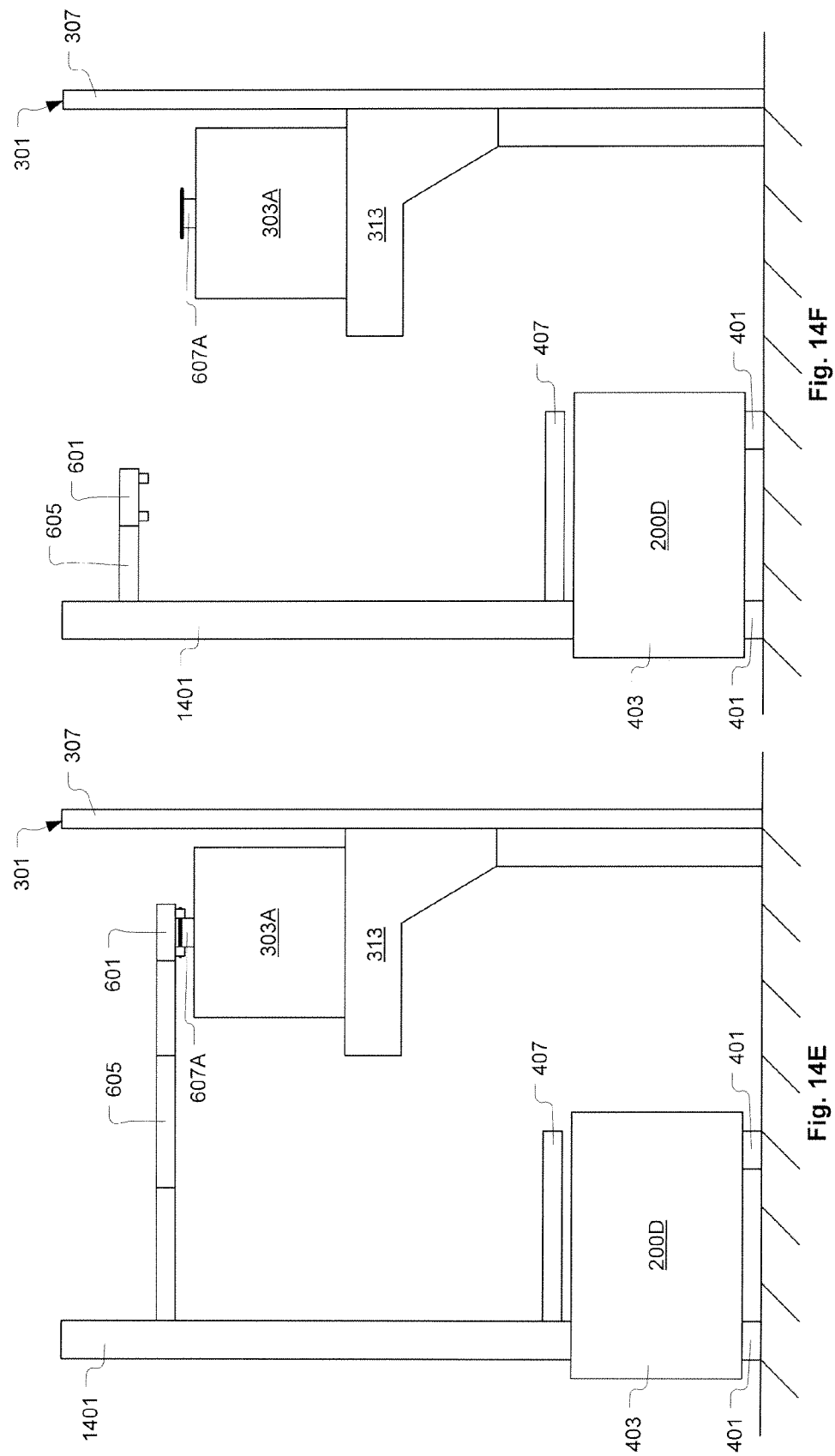

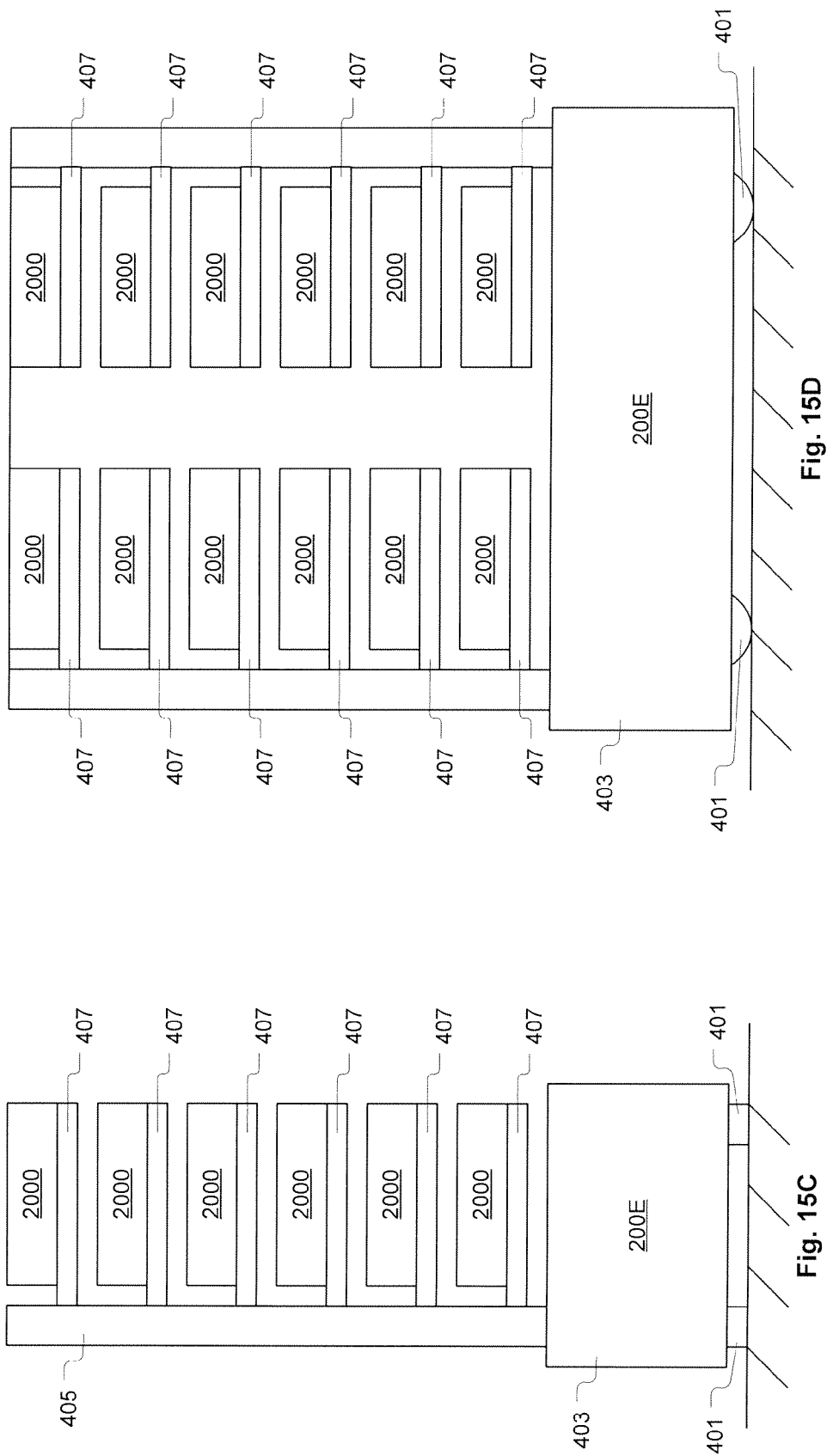

US 9,190,304 B2

DYNAMIC STORAGE AND TRANSFER SYSTEM INTEGRATED WITH AUTONOMOUS GUIDED/ROVING VEHICLE

CLAIM OF PRIORITY

This application claims priority under 35 U.S.C. 119(e) to U.S. Provisional Patent Application No. 61/488,120, filed May 19, 2011, entitled "Dynamic Storage and Transfer System Integrated with Autonomous Guided/Roving Vehicle," the disclosure of which is incorporated herein by reference.

BACKGROUND

Modern semiconductor factories use a variety of automation systems for movement of materials and control of fabrication processes. As used herein, the terms semiconductor factory and semiconductor fab are synonymous, and are respectively abbreviated as factory and fab. The various automation systems within the fab include hardware and software that are interfaced to work together to automate the movement of material, data, and control through the fab. Major automation systems in the fab may include: MES (Manufacturing Execution System), AMHS (Automated Material Handling System), MCS (Material Control System), station Control for tool connectivity, EFEMs (Equipment Front-End Modules) and loadports for interface between factory tools and the AMHS, material tracking systems like radiofrequency identifier (RFID) and barcode, and associated software products that may or may not be used in a fab and may or may not be bundled together to handle functions like fault detection, recipe management, scheduling and dispatch, statistical process control (SPC), and others.

During semiconductor manufacturing, a semiconductor wafer undergoes a plurality of process steps, each of which are performed by a specialized process tool. Pods are used to convey semiconductor wafers from one tool to another. Each pod is capable of transporting a number of wafers of a specific diameter. The pods are designed to maintain a protected internal environment to keep the wafers free of contamination, e.g., by particulates in the air outside the pod. Pods are also known for conveying other types of substrates, such as reticles, liquid crystal panels, rigid magnetic media for hard disk drives, solar cells, etc. It is an ongoing desire to improve fab logistics and productivity in the areas of cycle time, throughput, WIP (Work-In-Progress) levels, material handling, etc. It is within this context that the present invention arises.

SUMMARY

In one embodiment, a workpiece container storage and handling system is disclosed. The system includes a base and a number of wheels connected to the base to provide for movement of the base. The system also includes a container handling system connected to the base. The container handling system is defined to hold at least two containers in a vertically overlying orientation relative to each other. The container handling system is also defined to provide for controlled vertical travel of the at least two containers in unison relative to the base. And, the container handling system is defined to provide for controlled and independent horizontal travel of each of the at least two containers relative to the base.

In one embodiment, a method is disclosed for workpiece container handling. The method includes positioning at least two workpiece containers in a vertically overlying orientation with respect to each other. The method also includes moving the at least two workpiece containers in unison next to a platform on which a given one of the at least two workpiece containers is to be positioned. The method also includes moving the at least two workpiece containers in unison in a vertical direction until the given one of the at least two workpiece containers is positioned higher than the platform. The method also includes moving the given one of the at least two workpiece containers in a horizontal direction so as to position the given one of the at least two workpiece containers over the platform without moving others of the at least two workpiece containers. The method also includes moving the at least two workpiece containers in unison in the vertical direction until the given one of the at least two workpiece containers is positioned on the platform.

BRIEF DESCRIPTION OF THE DRAWINGS

FIG. 4A shows an end view of an AGV, in accordance with one embodiment of the present invention.

FIG. 4B shows a side view of the AGV of FIG. 4A, in accordance with one embodiment of the present invention.

FIGS. 5A-5D show a sequence of operations of the AGV of FIG. 4A in transferring the container to the LPT, in accordance with one embodiment of the present invention.

FIGS. 6A-6F show a sequence of operations of the AGV of FIG. 4A in transferring the container to the LPT, in accordance with one embodiment of the present invention.

FIG. 7A shows another AGV that implements a gripper assembly, in accordance with one embodiment of the present invention.

FIGS. 7B-7K show a sequence of operations of the AGV of FIG. 7A in transferring the container to the LPT, in accordance with one embodiment of the present invention.

FIGS. 8A-8B show how the AGV of FIG. 7A can be used to transfer a container to a conveyer within the fab, in accordance with one embodiment of the present invention.

FIGS. 9A-9D show a sequence of operations in which the container is retrieved from the AGV by an OHT system, in accordance with one embodiment of the present invention.

FIGS. 10A-10D show an exemplary embodiment in which the LPT is equipped with a horizontal slide assembly to provide for horizontal movement of the container between the LTP and the AGV, vice-versa, in accordance with one embodiment of the present invention.

FIGS. 11A-11D show another sequence of operations in which the container is moved from the LPT to the AGV, in accordance with one embodiment of the present invention.

FIGS. 12A-12H show a sequence of operations in which AGVs are positioned and operated to transfer a container from AGV to AGV, in accordance with one embodiment of the present invention.

FIG. 14A-14F show an AGV that is defined to carry a single container at a time, in accordance with one embodiment of the present invention.

FIG. 15C shows an end view of an AGV, in accordance with one embodiment of the present invention.

FIG. 15D shows a side view of the AGV, in accordance with one embodiment of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Improvement in fab logistics can be of particular concern with regard to fabrication of larger wafers. For example, fabrication of 300 mm and larger wafers requires more automated transport through the fab, thereby benefiting from improved fab logistics. Also, fabrication of smaller technology node devices having decreased line widths may require more process steps, which in turn requires more automated transport through the fab and increases the complexity of cycle time control in the fab. Also, the cycle time for timely product transfers within the fabrication facility are becoming more important for emerging manufacturing processes. Therefore, management of cycle time within the fabrication facility is important to achieving sufficient process yields. Hence, improvement in fab logistics can also benefit fabrication of smaller technology node devices and improve cycle time management.

Figure 1:
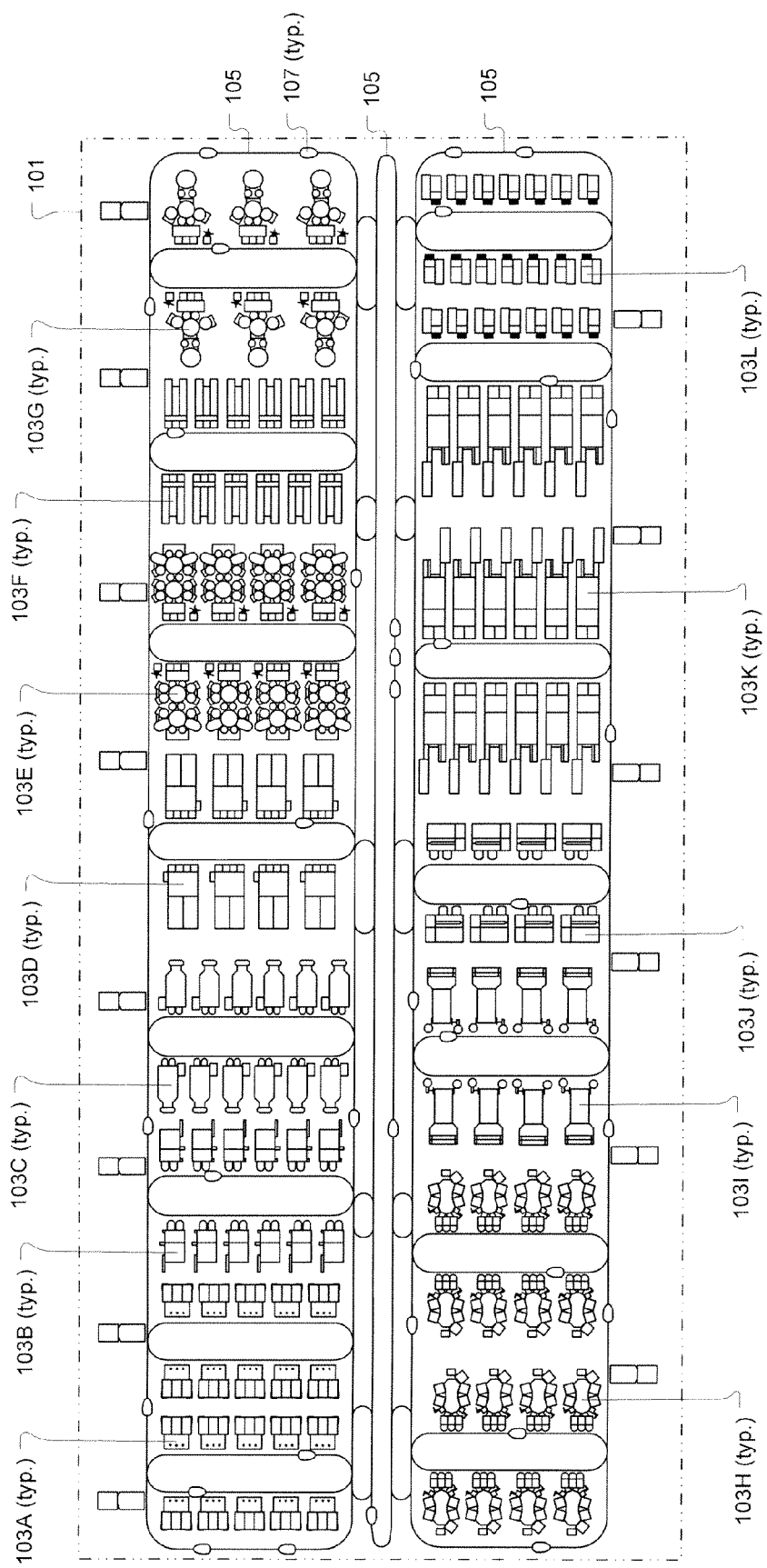
FIG. 1 shows an example floorplan of a portion of a fab, in accordance with one embodiment of the present invention.

FIG. 1 shows an example floorplan 101 of a portion of a fab. The floorplan includes a many different fabrication process and/or metrology tools 103A-103L. The fabrication tools can include essentially any type of semiconductor wafer fabrication tool, including but not limited to, wafer plasma processing tools for material etching and/or deposition, wafer cleaning tools, wafer rinsing tools, wafer planarization tools, among others. The floorplan can also include material handling equipment, including but not limited to, lifters/elevators, OHT (overhead hoist transport) systems, OHV's (overhead hoist vehicles), RGV's (rail-guided vehicles), floor conveyers, STC's (material storage/stockers), among others. The floorplan of FIG. 1 shows example travel routes 105 of material handling systems, such as the OHT system, the RGV system, and/or floor conveyers, among others. The floorplan of FIG. 1 also shows a number of material transport vehicles 107, such as OHV's, RGV's, among others, traveling along the various travel routes 105 to move pods or other types of containers carrying semiconductor wafers or other types of workpieces.

It should be understood that there is an essentially limitless number of floorplan variations possible with a given fab. For example, different fabs can include different combination of process and/or metrology tools. Also, different fabs can include different material handling systems and associated routes. However, what most fabs share is a need to accurately and reliably move workpieces between locations in a most efficient manner as possible. The OHT, RGV, and floor conveyer systems provide a substantial ability to move workpieces between locations within a fab. However, these material handling systems can experience problems detrimental to production, such as bottlenecks, congestion, blockages, mechanical/electrical/control failures, maintenance downtime, among others. Consequently, there is a need in most fabs for some capability to move workpieces between locations in an independent manner, without reliance upon the fab material handling systems such as the OHT, RGV, and/or floor conveyer systems.

Conventionally, to meet the need for independent material handling within the fab, people have been relied upon to manually transport pods containing workpieces between locations within the fab when necessary. This manual transport could be entirely manual, such as by simply picking up and carrying a pod from one location to another. Or, this manual transport could be augmented by manually controlled equipment, such as by pushing a cart and/or manual operation of a robotic arm to handling pods. For example, a human guided mobile loader stocker as described in U.S. Pat. No. 5,570,990, is an example of manually controlled equipment for material handling within a fab. The U.S. Pat. No. 5,570,990 is incorporated herein by reference in its entirety. It should be understood that human involvement in handling material within a fab is prone to significant problems. For instance, movement of the wrong material could occur by human error, or materials could be damaged by human error, or materials could be moved to the wrong location by human error. Also, manual transport of materials within the fab requires people to be present within clean areas of the fab, which always introduces a potential for contamination of the environment and/or the workpieces.

A dynamic storage and transfer system (DSTS) is described herein to provide for automated independent movement of materials, i.e., pods, containers, or even exposed workpieces, within a fab. The DSTS utilizes an autonomous guided vehicle (AGV) 200 to provide for movement of pods, containers, and/or bare workpieces, between locations within the fab. For ease of description, the DSTS and AGV 200 are described hereafter with regard to movement/storage of containers that contain one or more workpieces. It should be understood that the term "container" as used herein can refer to any type of container used within a fab, such as a FOUP (Front Opening Unified Pod), a FOSB (Front-Opening Shipping Box), a SMIF (Standard Mechanical Interface) pod, a SRP (Single Reticle Pod), an open substrate cassette, among many others. Also, the term "workpiece" as used herein can refer to a semiconductor wafer, a semiconductor substrate, a reticle, a liquid crystal panel, a rigid magnetic media, e.g., for hard disk drives, a solar cell, among many others. That is to say that the term "workpiece" as used herein can refer to any item that is worked upon by process and/or metrology tools within the fab.

Figure 2:
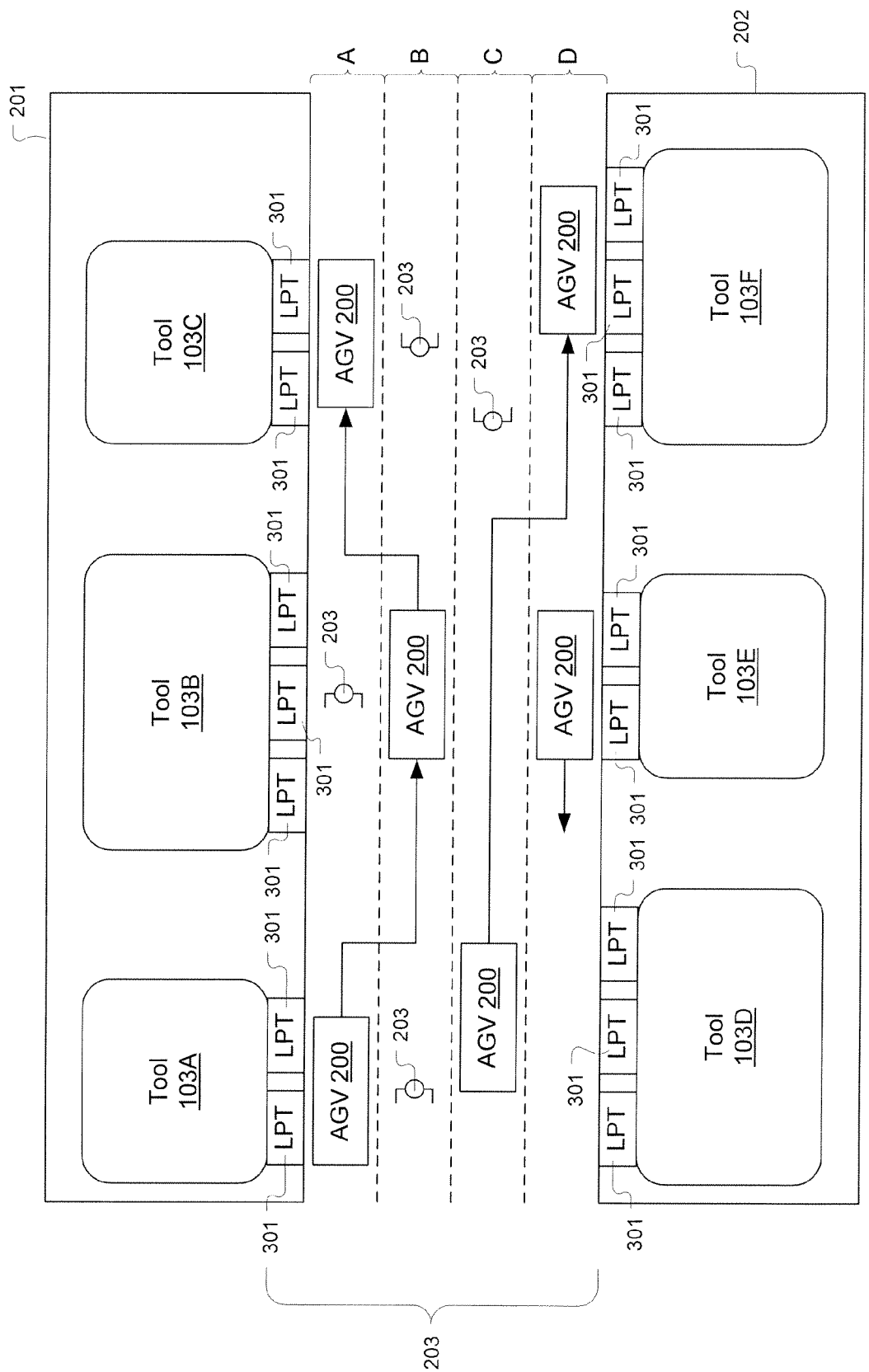
FIG. 2 shows a portion of a fab floorplan in which a number of tools are placed in a first row, and a number of tools are placed in a second row, with a hallway formed between the first and second rows, in accordance with one embodiment of the present invention.
Figure 3A:
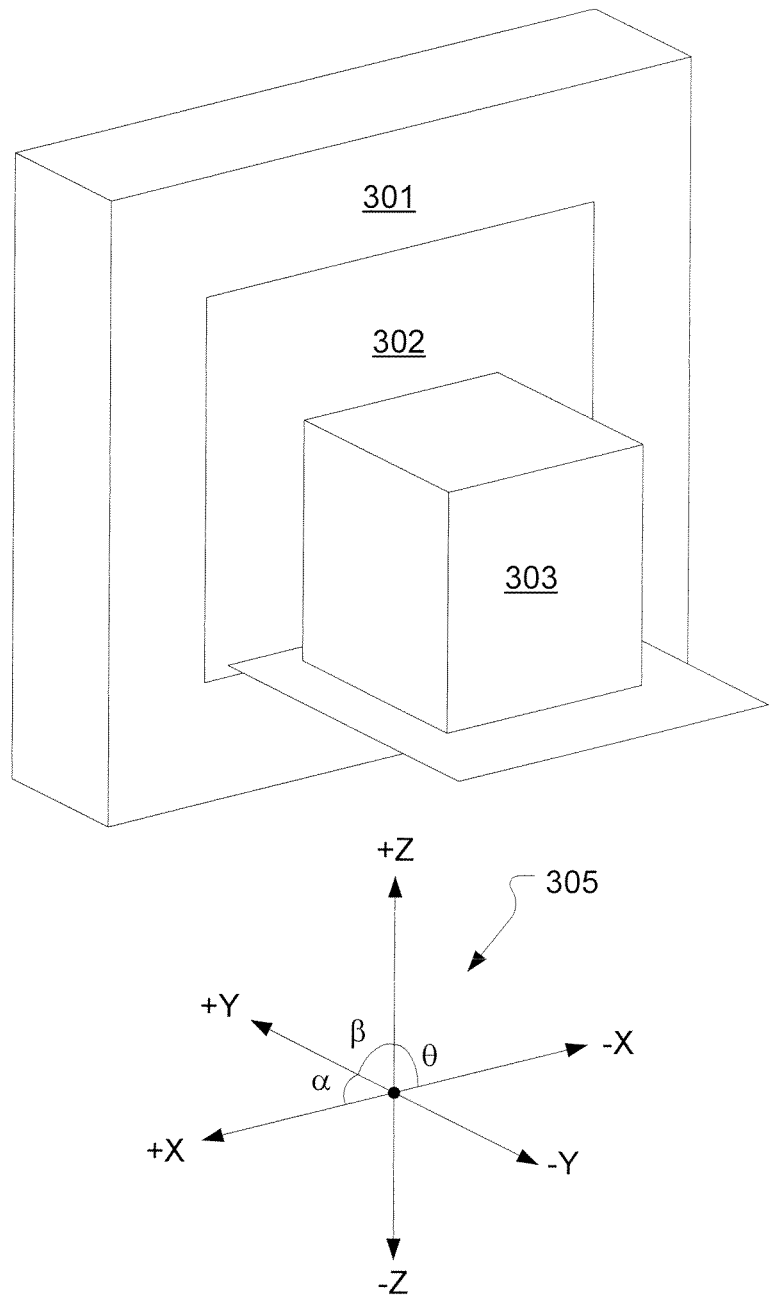
FIG. 3A shows an articulation schematic of loadport (LPT) having a window through which a container is moved, in accordance with one embodiment of the present invention.

FIG. 2 shows a portion of a fab floorplan in which a number of tools 103A-103C are placed in a first row 201, and a number of tools 103D-103F are placed in a second row 202, with a hallway 203 formed between the first and second rows 201/202, in accordance with one embodiment of the present invention. Each tool 103A-103F has one or more loadports (LPT's) 301 positioned along the hallway 203. A loadport (LPT) 301 transfer device is defined to provide a standard mechanical interface to wafer fabrication production tools (process and/or metrology tools) to enable loading/unloading of containers into/out of workpiece fabrication production tools, while ensuring protection of workpieces therein from contamination. FIG. 3A shows an articulation schematic of LPT 301 having a window 302 through which a container 303 is moved. In one embodiment, the LPT 301 is defined to move the container 303 through the window 302 in a Y direction, and is also defined to move the container 303 in a Z direction.

Figure 3B:
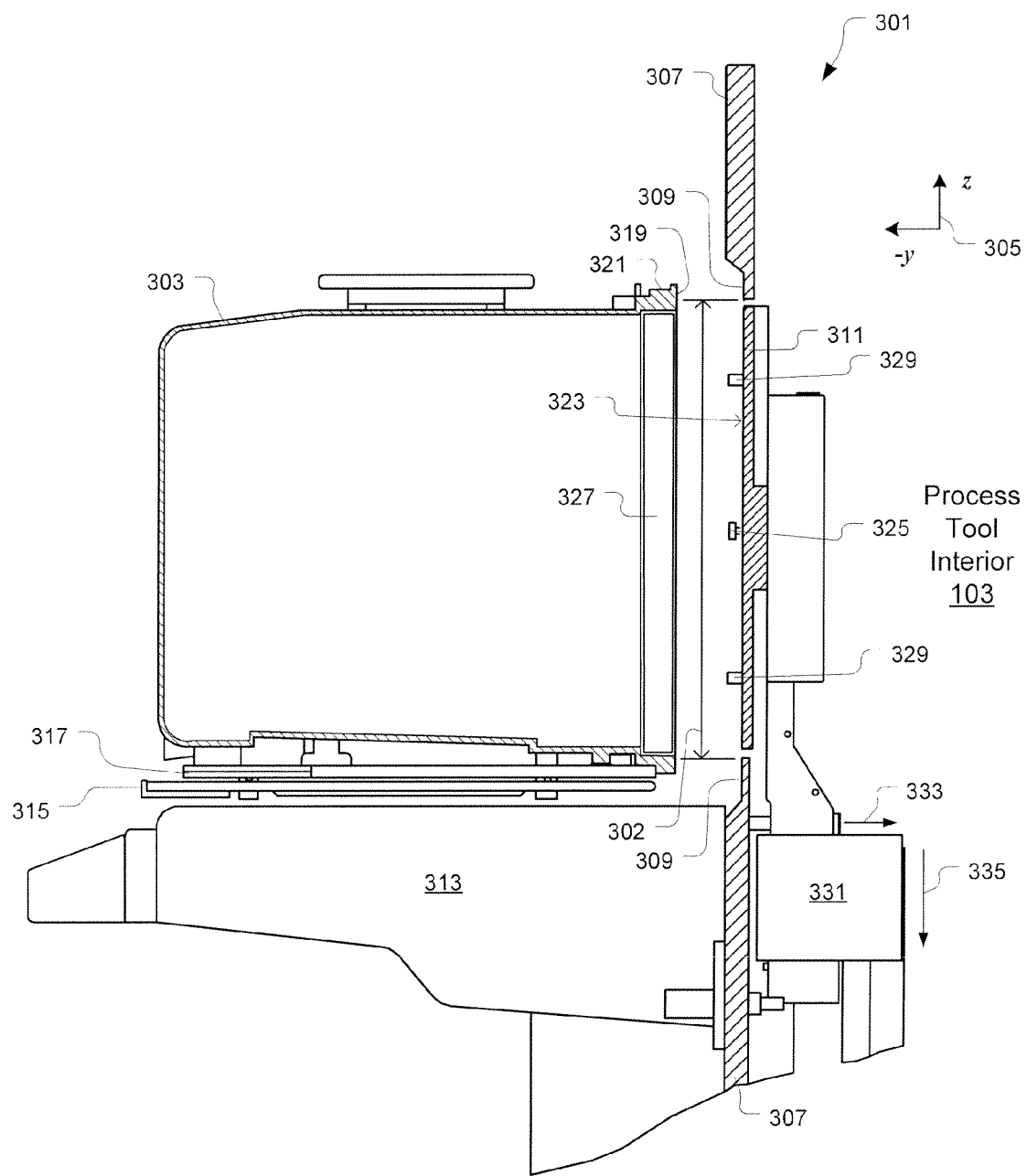
FIG. 3B shows the LPT configured to interface with the container, defined as a FOUP by way of example, in accordance with one embodiment of the present invention.

FIG. 3B shows the LPT 301 configured to interface with the container 303, defined as a FOUP by way of example. The LPT 301 is attached to a front end of a process tool 103 as described, for example, with reference to FIGS. 1 and 2 of U.S. Pat. No. 6,502,869, which issued Jan. 7, 2003 to Rosenquist et al., and is incorporated herein by reference in its entirety. For purposes of description, the "front" of LPT 301 is the side of LPT 301 facing the hallway 203, i.e., facing the negative Y direction as indicated by coordinate axes 305. The "front" of container 303 is the side facing the front of the LPT 301.

The LPT 301 includes a tool interface 307. In the semiconductor industry, tool interface 307 is often in conformance with an industry standard referred to as "Box Opener/Loader-to-Tool Standard Interface" (BOLTS), commonly referred to as a BOLTS interface or a BOLTS plate. Tool interface 307 includes the window 302 surrounded by a recessed shoulder 309. The window 302 is substantially occluded by a port door 311. The port door 311 forms a proximity seal with a boundary of the window 302 to prevent contaminants from migrating to the interior of the process tool 103. A proximity seal provides a small amount of clearance, e.g., about 1 mm, between the parts forming the proximity seal. The small clearance of the proximity seal allows air at a higher pressure to escape from the interior of the process tool 103 and sweep away any particulates from the sealing surfaces of the proximity seal.

The LPT 301 also includes an advance plate assembly 313 having an advance plate 315. In one embodiment, registration pins (not shown) mate with corresponding slots or recesses in the bottom support 317 of container 303, to facilitate alignment of the container 303 on the advance plate 315. The container 303 may conform to industry standards for Front Opening Unified Pods (FOUPs) or a different standard. The advance plate assembly 313 has an actuator (not shown) that slides the advance plate 315 in the Y direction between the retracted position shown in FIG. 3B and an advanced position that brings the container 303 into close proximity with the tool interface 307. When the container 303 is in the advanced position, a front surface 319 of a flange 321 forms a proximity seal with the recessed shoulder 309 of tool interface 307.

A front surface 323 of the port door 311 includes a pair of latch keys 325. The latch keys 325 include a post that extends away from the port door 311 and is substantially perpendicular to port door 311, and a crossbar at the distal end of the post. The crossbar extends perpendicularly to the post to form a "T" therewith. The port door 311 includes an actuator that interacts with the latch keys 325, causing the latch keys 325 to rotate on the axis of the post. As the container 303 moves to the advanced position, the latch keys 325 are inserted into corresponding latch key receptacles (not shown) of a container door 327 of container 303. The latch keys 325 are then rotated on the axis of the post, thereby interacting with a mechanism (not shown) internal to the container door 327, causing the container door 327 latches to disengage from the flange 321 of the container 303.

An example of a door latch assembly within a container door adapted to receive and operate with latch keys is disclosed in U.S. Pat. No. 4,995,430, entitled "Sealable Transportable Container Having Improved Latch Mechanism," which is incorporated herein by reference in its entirety. Another example is presented in U.S. Pat. No. 6,502,869, issued on Jan. 7, 2003 to Rosenquist et al., also incorporated herein by reference in its entirety. In addition to disengaging the container door 327 from the container 303, rotation of the latch keys 325 locks the latch keys 325 in their respective latch key receptacles, thereby coupling the container door 327 to the port door 311. In one embodiment, the LPT 301 includes two latch keys 325, that are structurally and operationally identical to each other. Additionally, alignment pins 329 are provided to facilitate alignment between the port door 311 and the container door 327, so that container door 327 will be sufficiently aligned to enable passage through the window 302 toward the interior of the process tool 103.

In the LPT 301, once the container door 327 latches are disengaged from the flange 321, the port door 311 is retracted in the horizontal direction (Y direction) by a mechanism 331, as indicated by arrow 333, thereby removing the container door 327 from the container 303. Following retraction of the port door 311 (with container door 327 coupled thereto) in the horizontal direction 333, the mechanism 331 is operated to move the port door 311 (with container door 327 coupled thereto) downward in a vertical direction (Z direction), as indicated by arrow 335, thereby clearing the window 302 to enable unobstructed access from the interior of the process tool 103 to the workpieces inside the container 303.

With reference back to FIG. 2, the AGV 200 of the DSTS is defined to provide for automated movement of containers to and from LPT's 301 within the fab, as well as to and from essentially any other location or equipment within the fab. In one embodiment, each AGV 200 is defined as a wheeled vehicle capable of moving in any direction on the fab floor. Also, as discussed further below, the AGV 200 is defined to move and operate in accordance with instructions received from a fab computer and/or in accordance with signals generated by sensors on board the AGV 200 or by communication with devices deployed within the fab. In one embodiment, as shown in FIG. 2, hallway 203 between rows 201/202 of tools 103 can be delineated into a number of virtual lanes A, B, C, D. The AGV 200 can be operated to travel within the virtual lanes A, B, C, D, so as to provide a degree of order to the allowed movement paths of the AGV's 200 within the fab.

Also, as shown in FIG. 2, a number of humans 203 may be present within the hallway 203 with the AGV's 200. To ensure safety, the AGV's 200 are equipped with sensors to detect proximity to humans and fab equipment and structures. Upon detection of a proximity alarm based on signals received from these sensors, the AGV 200 can be defined/directed to automatically stop movement and/or operation until the proximity alarm is cleared. In one embodiment, the AGV 200 can be defined to sense an upcoming interference with a human or a fab structure and automatically maneuver to avoid the upcoming interference as the AGV 200 travels down the hallway 203. Additionally, it should be understood that the AGV 200 can be equipped and operated to turn corners within the fab, so as to enable movement of the AGV 200 to essentially any location within the fab.

FIG. 4A shows an end view of an AGV 200A, in accordance with one embodiment of the present invention. FIG. 4B shows a side view of the AGV 200A, in accordance with one embodiment of the present invention. In this example embodiment, the AGV 200A is defined as a wheeled vehicle having four wheels 401. In one embodiment, the four wheels 401 can include two wheels 401 that turn and two wheels 401 that do not turn. In another embodiment, each of the four wheels 401 can be configured to turn. Also, it should be understood that in other embodiments the AGV 200A can be defined to include three or more wheels 401, so long as the wheels 401 provided a stable platform for the AGV 200A and allow the AGV 200A to maneuver as needed throughout the fab. Also, it should be understood that the turning and orientation of the wheels 401 are controlled by electromechanical systems on board the AGV 200A in accordance with instructions communicated to the AGV 200A from the fab computer and/or in accordance with signals generated by sensors on board the AGV 200 or by communication with devices deployed within the fab.

The AGV 200A further includes a base 403 defined to provide sufficient weight and stability to the AGV 200A during any operation to be performed by the AGV 200A. More specifically, the base 403 is defined and weighted to lower the center of gravity of the AGV 200A to ensure that the AGV 200A will not topple over as it moves throughout the fab and as it operates to transfer containers 303 to/from LPT's 301 or other equipment within the fab. In one embodiment, the base 403 is configured to house the computing/control equipment and the power supply, e.g., batteries, required for AGV 200A operation.

The AGV 200A of this embodiment is further equipped with a lifting/guiding members 405 and container support members 407. In the embodiment of FIGS. 4A-4B, the AGV 200A includes four container support members 407, to enable occupancy of up to four containers 303 onboard the AGV 200A at a time. The container support members 407 can be connected to a lifting means, such as a chain drive or belt drive, within the lifting/guiding members 405 to enable controlled vertical movement of the container support members 407 in the Z direction. In one embodiment, each lifting/guiding member 405 is defined to provide up to about 15 inches of vertical travel of the container support members 407, to enable appropriate vertical positioning of the containers 303 relative to the LPT 301 advance plate 315 for transfer of the containers 303 to/from the advance plate 315. It should be understood, however, that other embodiments of the AGV 200A can provide for essentially any lift height of the container support members 407, so long as the AGV 200A remains sufficiently stable during lifting operations.

Additionally, in one embodiment, the AGV 200A is defined to provide for placement of the container 303 on the advance plate 315 of the LPT 301 by extending the container 303 toward the LPT 301 in the horizontal direction, and by lowering the container 303 onto the LPT 301 such that the registration pins of the advance plate 315 are positioned within the corresponding slots within the bottom support 317 of the container 303, as indicated by arrow 409. Similarly, in this embodiment, the AGV 200A is defined to provide for retrieval of the container 303 from the advance plate 315 of the LPT 301 by lifting the container 303 from the advance plate 315, and by moving the container 303 horizontally toward the AGV 200A. In one embodiment, horizontal movement of the container 303 by the AGV 200A is provided by a horizontal slide assembly affixed to the container support member 407. Also, in this embodiment, vertical movement of the container 303 by the AGV 200A is provided by vertical movement of the horizontal slide assembly. It should be understood that all movement of the container support members 407 and their associated horizontal slide assemblies is controlled precisely by an electromechanical system onboard the AGV 200A operating in accordance with instructions received from the fab computer system.

It should be appreciated that for successful transfer of the container 303 to or from the LPT 301, it is necessary to accurately align the container 303 with the LPT 301. Alignment of the container 303 with the LPT 301 in accomplished in part by accurately aligning the AGV 200A to the LPT 301. To facilitate accurate alignment of the AGV 200A to the LPT 301, both the AGV 200A and the LPT 301 can be equipped with corresponding components of an alignment system, such as laser alignment system, among others. Also, in transferring the container 303 between the AGV 200A and LPT 301, the horizontal slide assembly of the AGV 200A and/or the container support members 407 can be equipped with position detection devices that communicate either actively or passively with corresponding position detection devices on the LPT 301 to enable determination of container 303 position and attitudinal orientation relative to the LPT 301. The determination of container 303 position and attitudinal orientation relative to the LPT 301 can be performed in a continuous mariner as the container 303 is transferred to or from the LPT 301 to provide for feedback to the container 303 movement mechanisms, e.g., the horizontal slide assembly, container support members 407, and/or lifting/guiding members 405.

With reference to FIG. 3A, it should be understood that the container 300 handling device, such as a gripper assembly connected to the container 303 handling end of the horizontal slide assembly, can be defined to orient the container 303 in essentially any necessary attitudinal orientation relative to the LPT 301, as indicated by coordinate axes 305. Specifically, in different embodiments, the container 300 handling device can be defined to turn the container 303 through any angle α within the X-Y plane, and/or through any angle β within the Y-Z plane, and/or through any angle θ within the X-Z plane.

Figure 5D:
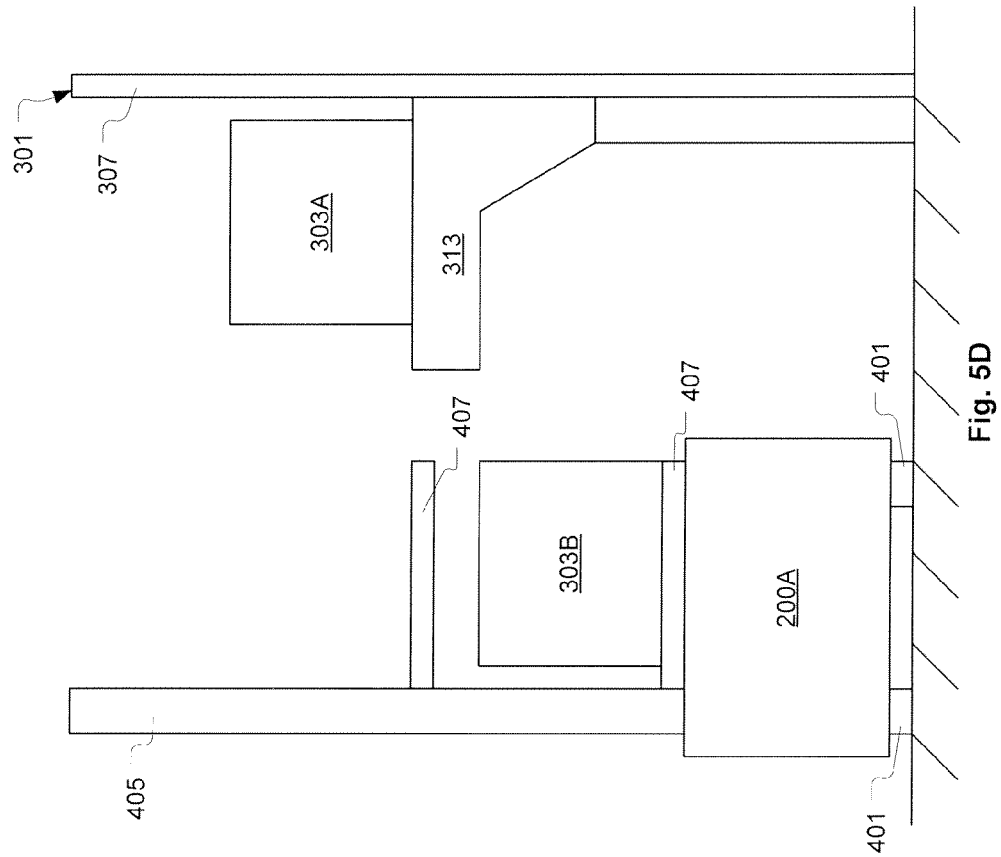
Figure 5C:
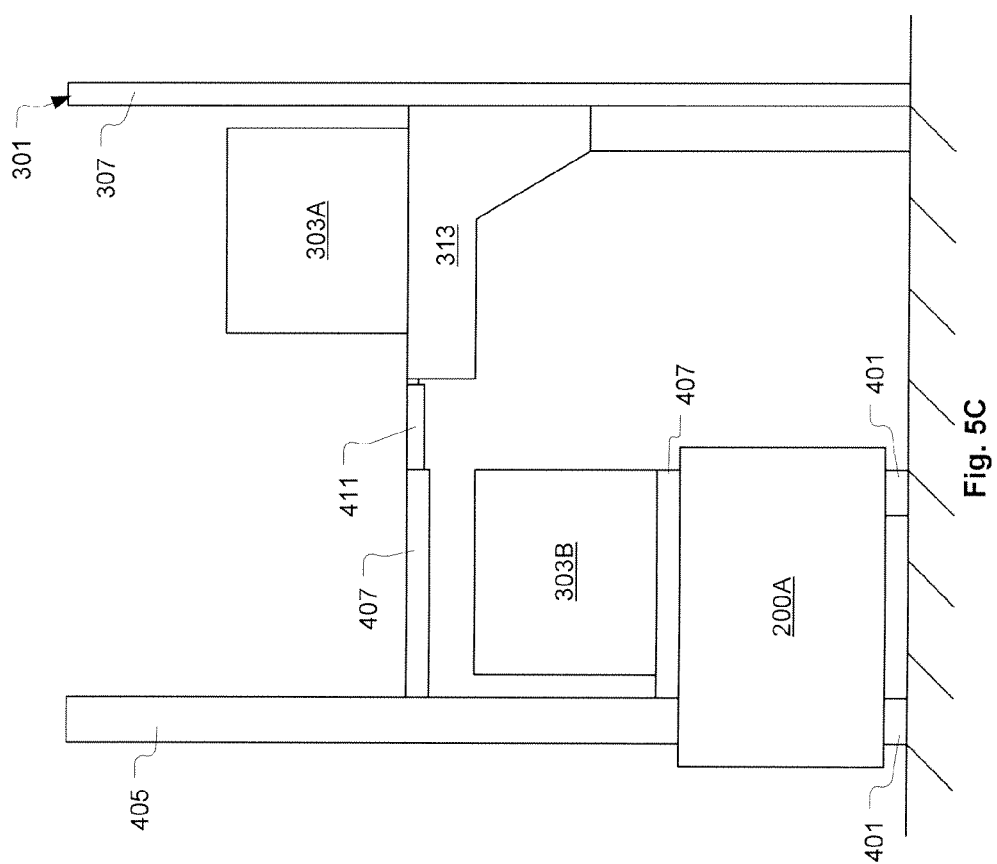

FIGS. 5A-5D show a sequence of operations of the AGV 200A in transferring the container 303A to the LPT 301, in accordance with one embodiment of the present invention. As shown in FIG. 5A, the AGV 200A is directed to travel to the LPT 301 and position itself in front of the LPT 301, such that the container 303A is positioned in a substantially centered manner on the LPT 301. The lifting/guiding member 405 of the AGV 200A is directed to lift the container 303A to an appropriate transfer height, as shown in FIG. 4A. Then, as shown in FIG. 5B the horizontal slide assembly 411 is actuated to move the container 303A horizontally to a location above the advance plate assembly 313 of the LPT 301. At this point, the attitudinal orientation of the container 303A relative to the LPT 301 and advance plate 315 is corrected as necessary to ensure proper alignment of the container 303A over the advance plate assembly 313 and registration pins of the advance plate 315. Then, as shown in FIG. 5C, the lifting/guiding member 405 is operated to lower the container support member 407 and horizontal slide assembly 411, so as to lower the container 303A onto the advance plate 315 of the LPT 301. Then, as shown in FIG. 5D, the horizontal slide assembly 411 is retracted, and the AGV 200A is free to move on to another task within the fab.

FIGS. 6A-6F show a sequence of operations of the AGV 200A in transferring the container 303B to the LPT 301, in accordance with one embodiment of the present invention. As shown in FIG. 6A, the AGV 200A is directed to travel to the LPT 301 and position itself in front of the LPT 301, such that the container 303B is positioned in a substantially centered manner on the LPT 301. The lifting/guiding member 405 of the AGV 200A is directed to lift the container 303B to an appropriate transfer height, as shown in FIG. 6B. Then, as shown in FIG. 6C the horizontal slide assembly 411 is actuated to move the container 303B horizontally to a location above the advance plate assembly 313 of the LPT 301. At this point, the attitudinal orientation of the container 303B relative to the LPT 301 and advance plate 315 is corrected as necessary to ensure proper alignment of the container 303B over the advance plate assembly 313 and registration pins of the advance plate 315. Then, as shown in FIG. 6D, the lifting/guiding member 405 is operated to lower the container support member 407 and horizontal slide assembly 411, so as to lower the container 303B onto the advance plate 315 of the LPT 301. Then, as shown in FIG. 6E, the horizontal slide assembly 411 is retracted. Then, as shown in FIG. 6F, the lifting/guiding members 405 are operated to lower the container support members 407 to their home/travel position, and the AGV 200A is free to move on to another task within the fab.

FIG. 7A shows another AGV 200B that implements a gripper assembly 601, in accordance with one embodiment of the present invention. The gripper assembly 601 is connected to a horizontal slide assembly 605. The horizontal slide assembly 605 is connected to a movement means, such as a chain drive or belt drive, to enable controlled vertical and horizontal movement of the horizontal slide assembly 605 within a vertical plane in accordance with tracks 609 defined within a guide plate 611. The guide plate 611 is connected to and held by supports 603 at one side of the AGV 200B. The tracks 609 are defined to enable movement of the gripper assembly 601 to engage with/disengage from handles 607A-607D of each container 303A-303D, respectively, when positioned on a corresponding container support member 407. The container support members 407 can be fixed to the guide plate and/or the supports 603.

FIGS. 7B-7K show a sequence of operations of the AGV 200B in transferring the container 303A to the LPT 301, in accordance with one embodiment of the present invention. As shown in FIG. 7B, the AGV 200B is directed to travel to the LPT 301 and position itself in front of the LPT 301, such that a vertical transfer track 609A defined within the guide plate 611 is positioned in a substantially centered manner on the LPT 301. As shown in FIG. 7C the horizontal slide assembly 605 is moved within the track 609 so as to be positioned over the container 303A, such that the gripper assembly 601 is positioned over the handle 607A. As shown in FIG. 7D, the horizontal slide assembly 605 is lowered in the track 609 so as to enable the gripper assembly 601 to engage the handle 607A. As shown in FIG. 7E, the horizontal slide assembly 605 is raised in the track 609 so as to raise the gripper assembly 601 and container 303A by way of the 607A. As shown in FIG. 7F, the horizontal slide assembly 605 is actuated to move the gripper assembly 601 and container 303A connected thereto horizontally toward the LPT 301 to a location outside the AGV 200B. Then, as shown in FIG. 7G, the horizontal slide assembly 605 is moved within the track 609 to a position in alignment with the vertical transfer track 609A. Then, as shown in FIG. 7H, the horizontal slide assembly 606 is actuated to move the gripper assembly 601 and container 303A connected thereto horizontally toward the LPT 301 to a location above the advance plate assembly 313 of the LPT 301. At this point, the attitudinal orientation of the container 303A relative to the LPT 301 and advance plate 315 is corrected as necessary to ensure proper alignment of the container 303A over the advance plate assembly 313 and registration pins of the advance plate 315. Then, as shown in FIG. 7I, the horizontal slide assembly 605 is lowered within the vertical transfer track 609A to lower the container 303A onto the advance plate 315 of the LPT 301. Then, as shown in FIG. 7J, the gripper assembly 601 is disengaged from the handle 607A and, if necessary, the horizontal slide assembly 605 is raised within the vertical transfer track 609A to provide clearance of the gripper assembly 601 relative to the handle 607A. Then, as shown in FIG. 7K, the horizontal slide assembly 605 is retracted, and the AGV 200B is free to move on to another task within the fab.

It should be understood that the AGV 200 is not limited to use with transfer of containers 303 to/from LPT's 301. For example, FIGS. 8A-8B show how the AGV 200B can be used to transfer a container 303A to a conveyer 701, such as a floor conveyer 701, within the fab, in accordance with one embodiment of the present invention. It should be appreciated that the conveyer 701 can be a floor conveyer in one embodiment, or any other type of conveyance device/system within reach of the AGV 200. As described above with regard to FIGS. 7B-7G, the horizontal slide assembly 605 and gripper assembly 601 can be operated to retrieve the container 303A from its container support member 407, and move the horizontal slide assembly 605 to the vertical transfer track 609A. Then, as shown in FIG. 8A, the horizontal slide assembly 601 can be operated to move the container 303A horizontally outward from the AGV 200B, and lower the container 303A onto the conveyer 701. Then, as shown in FIG. 8B, the gripper assembly 601 can be operated to disengage from the handle 607A and the horizontal slide assembly 605 can be raised within the vertical transfer track 609A, to provide free clearance for movement of the container 303A by way of the conveyer 701, as indicated by arrow 703.

Also, the AGV 200 can be used to enable transfer of a container 303 to an OHT system. For example, FIGS. 9A-9D show a sequence of operations in which the container 303B is retrieved from the AGV 200 by an OHT system 800. In FIG. 9A, the AGV 200B is positioned beneath the OHT system 800 such that an OHV 803 can travel downward to engage with the handle 607B of the container 303B. In FIG. 9B, the OHV 803 travels downward and engages with the handle 607B of the container 303B. In FIG. 9C, the OHV 803 lifts the container 303B from its container support member 407. Then, in FIG. 9D, the OHV and OHT system 800 move the container 303B as needed. It should be understood that accurate positioning of the AGV 200 relative to the OHT system 800 can be provided by an alignment system, such as a laser alignment system among others, with respective components thereof disposed on both the AGV 200 and OHT system 800.

In the embodiments described above, the transfer of the container 303 to the LPT 301 was conducted completely by the AGV 200. However, in other embodiments, the LPT 301 is equipped to participate in the operations required to transfer of the container 303 between the AGV 200 and LPT 301. For example, FIGS. 10A-10D show an exemplary embodiment in which the LPT 301 is equipped with a horizontal slide assembly 1001 to provide for horizontal movement of the container 303 between the LTP 301 and the AGV 200A, vice-versa. In this embodiment, the lifting/guiding members 405 and container support members 407 of the AGV 200A are used to provide the required vertical movement of the container 303 during the transfer operation. And, the horizontal slide assembly 1001 of the LPT 301 is used to provided the required horizontal movement of the container 303 during the transfer operation.

FIGS. 10A-10D show a sequence of operation in which the container 303A is moved from the LPT 301 to the AGV 200A, in accordance with one embodiment of the present invention. In FIG. 10A, the AGV 200A is directed to travel to the LPT 301 and position itself in front of the LPT 301, such that the container support member 407 for container 303A is positioned in a substantially centered manner on the LPT 301. The lifting/guiding member 405 of the AGV 200A is directed to vertically position the container support member 407 of the container 303A at an appropriate transfer height, as shown in FIG. 10A. Then, as shown in FIG. 10B the horizontal slide assembly 1001 of the LPT 301 is actuated to move the container 303A horizontally to a location above the vacant container support member 407 of the AGV 200A. At this point, the attitudinal orientation of the container 303A relative to the container support member 407 is corrected as necessary to ensure proper alignment of the container 303A over the container support member 407. Then, as shown in FIG. 10C, the lifting/guiding member 405 is operated to raise the container support member 407, so as to lift the container 303A from the horizontal slide assembly 1001 of the LPT 301. Then, as shown in FIG. 10D, the horizontal slide assembly 1001 is retracted into the advance plate assembly 313 of the LPT 301, and the AGV 200A is free to move on to another task within the fab.

FIGS. 11A-11D show another sequence of operations in which the container 303A is moved from the LPT 301 to the AGV 200A, in accordance with one embodiment of the present invention. However, in this sequence of operations, the LPT 301 is equipped with a vertical/horizontal movement mechanism 1101 to provide both vertical and horizontal transfer movement of the container 303A. In FIG. 11A, the AGV 200A is directed to travel to the LPT 301 and position itself in front of the LPT 301, such that the container support member 407 for container 303A is positioned in a substantially centered manner on the LPT 301. The lifting/guiding member 405 of the AGV 200A is directed to vertically position the container support member 407 of the container 303A at an appropriate transfer height, as shown in FIG. 11A. Then, as shown in FIG. 11B the vertical/horizontal movement mechanism 1101 of the LPT 301 is actuated to move the container 303A vertically to a location above the advance plate assembly 313 of the LPT 301. Then, as shown in FIG. 11C the vertical/horizontal movement mechanism 1101 of the LPT 301 is actuated to move the container 303A horizontally to a location above the vacant container support member 407 of the AGV 200A. At this point, the attitudinal orientation of the container 303A relative to the container support member 407 is corrected as necessary to ensure proper alignment of the container 303A over the container support member 407. Then, as shown in FIG. 11D, the vertical/horizontal movement mechanism 1101 of the LPT 301 is operated to lower the container 303A onto its container support member 407 of the AGV 200A. Then, the vertical/horizontal movement mechanism 1101 is retracted into the LPT 301, and the AGV 200A is free to move on to another task within the fab.

Additionally, the AGV's 200 can be defined to provide for container transfer from one AGV 200 to another AGV 200, without requiring use of other container transfer equipment within the fab. For example, FIGS. 12A-12H show a sequence of operations in which AGV's 200A-1 and 200A-2 are positioned and operated to transfer a container 303A from AGV 200A-1 to AGV 200A-2, in accordance with one embodiment of the present invention. FIG. 12A shows the AGV 200A-1 with a container 303A located on a container support member 407. FIG. 12B shows the AGV 200A-2 with a vacant container support member 407 to which the container 303A is to be transferred. As shows in FIG. 12C, the AGV 200A-1 and AGV 200A-2 are positioned next to each other to enable transfer of the container 303A from the AGV 200A-1 to the AGV 200A-2. In one embodiment, the AGV's 200A-1 and 200A-2 are directed to position themselves next to each other such that the vertical transfer track 609A of AGV 200A-1 is positioned in a substantially centered manner on the vacant container support member 407 of the AGV 200A-2 to which the container 303A is to be transferred.

As shown in FIG. 12D the horizontal slide assembly 605 of AGV 200A-1 is moved within the track 609 to enable the gripper assembly 601 to engage the handle 607A of container 303A. As shown in FIG. 12E, the horizontal slide assembly 605 is raised in the track 609 so as to raise the gripper assembly 601 and container 303A by way of the 607A. As shown in FIG. 12F, the horizontal slide assembly 605 is actuated to move the gripper assembly 601 and container 303A connected thereto horizontally toward the AGV 200A-2 so as to position the container 303A over the vacant container support member 407. At this point, the attitudinal orientation of the container 303A relative to the vacant container support member 407 is corrected as necessary to ensure proper alignment of the container 303A over the vacant container support member 407. Then, as shown in FIG. 12G, the horizontal slide assembly 605 is lowered within the vertical transfer track 609A to lower the container 303A onto the vacant container support member 407 of the AGV 200A-2. Then, as shown in FIG. 12H, the gripper assembly 601 is disengaged from the handle 607A and, if necessary, the horizontal slide assembly 605 is raised within the vertical transfer track 609A to provide clearance of the gripper assembly 601 relative to the handle 607A, and the horizontal slide assembly 605 is retracted. Then, both the AGV 200A-1 and the AGV 200A-2 are free to move on to another task within the fab.

Figure 13A:
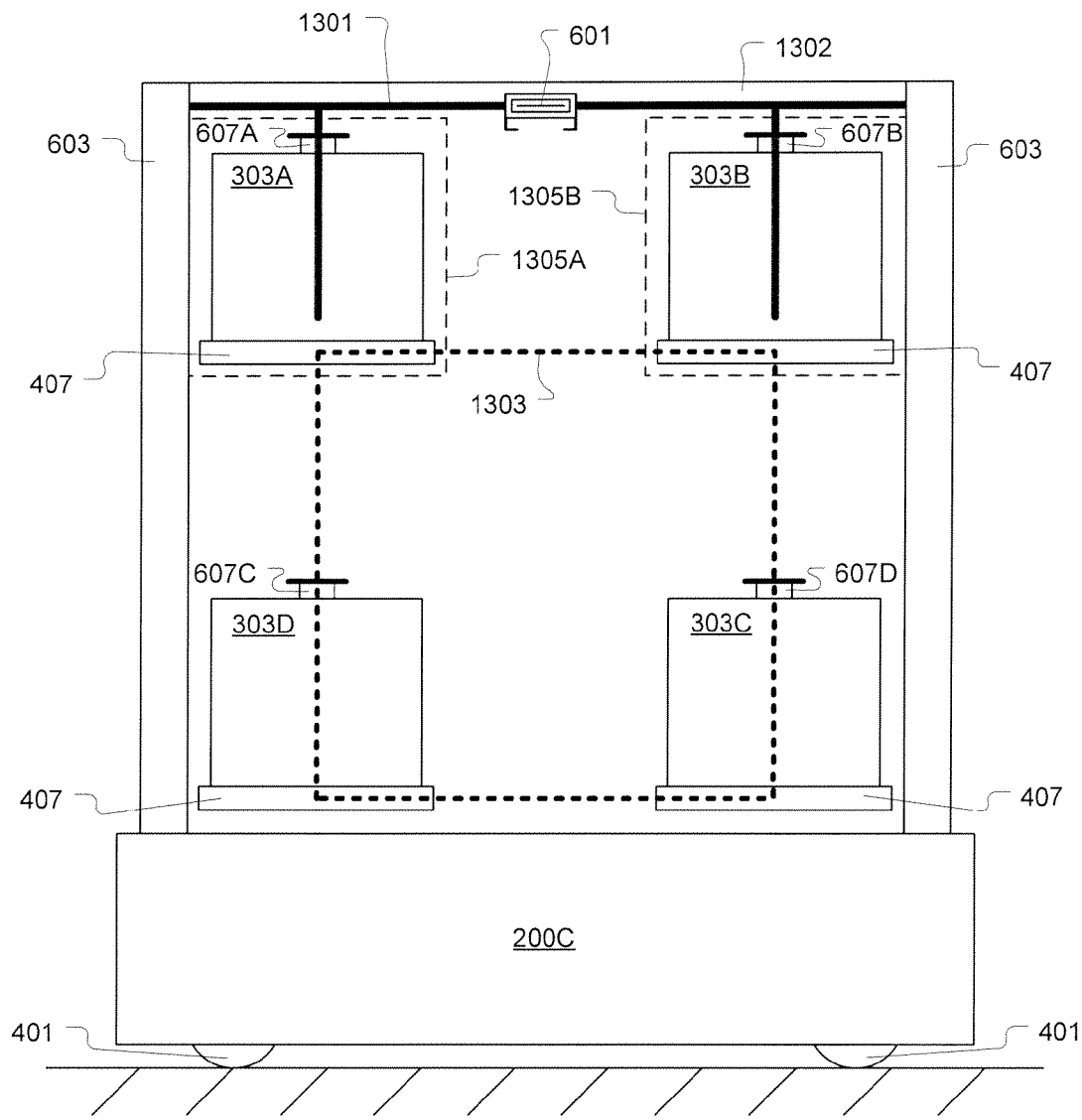
FIGS. 13A-13C show another embodiment of an AGV defined to include a container carousel for moving container support members and their respective containers when present thereon, in accordance with one embodiment of the present invention.

FIG. 13A shows another embodiment of an AGV 200C defined to include a container carousel for moving container support members 407, and their respective containers 303A-303D when present thereon, in a circuitous manner around a carousel route 1303, such that a container 303A-303D to be transferred or a vacant container support member 407, is positioned in either of a number of transfer positions 1305A-1305B, in accordance with one embodiment of the present invention. As with the AGV 200A, the AGV 200C includes the gripper assembly 601 connected to a horizontal slide assembly 605. The horizontal slide assembly 605 is connected to a movement means, such as a chain drive or belt drive, to enable controlled vertical and horizontal movement of the horizontal slide assembly 605 within the vertical plane in accordance with tracks 1301 defined within a guide plate 1302. The guide plate 1302 is connected to and held by supports 603 at the sides of the AGV 200C. The tracks 1301 are defined to enable movement of the gripper assembly 601 to engage with/disengage from handles 607A-607D of each container 303A-303D, respectively, when positioned on a corresponding container support member 407 and within either of the number of transfer positions 1305A-1305B.

Figure 13B:
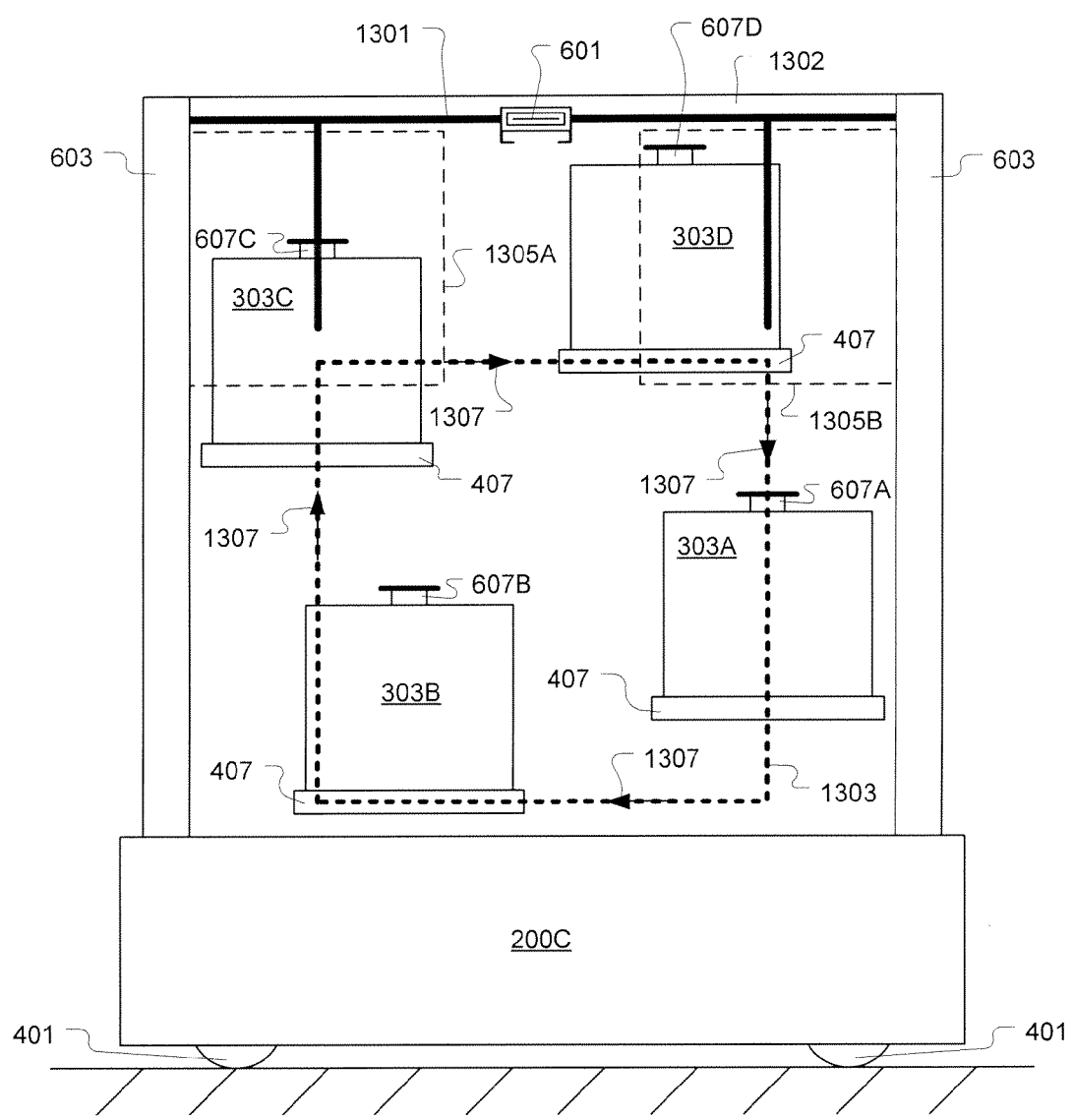
Figure 13C:
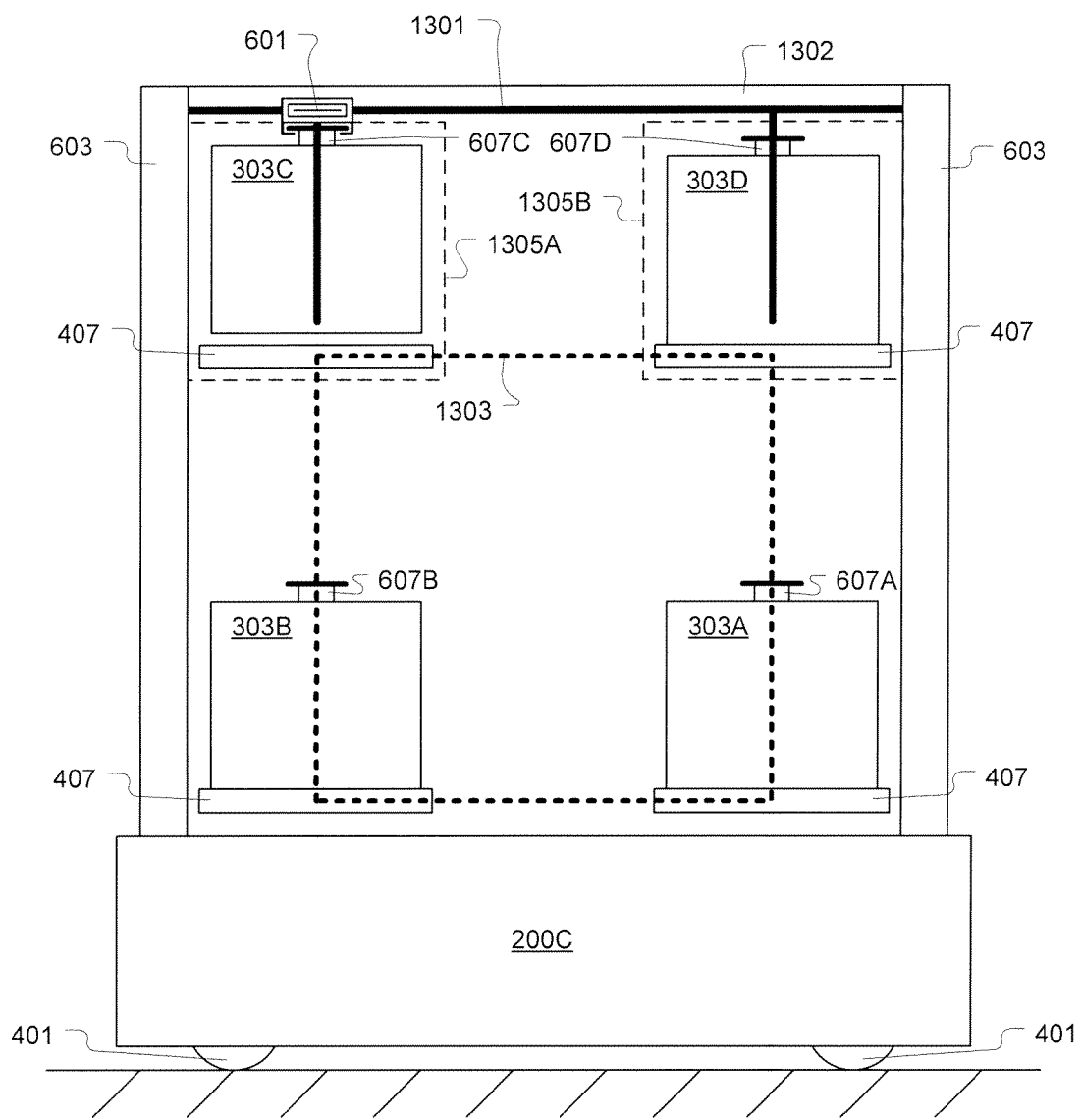

Each of the container support members 407 is connected to a carousel movement means, such as a chain drive or belt drive, to enable controlled vertical and horizontal movement of the container support members 407 within the vertical plane in accordance with carousel route 1303 defined within the guide plate 1302. In this manner, a given container support member 407 can be rotated around the carousel route 1303 to one of the transfer positions 1305A, 1305B to enable transfer of a container 303A-303D to or from the given container support member 407. For example, FIG. 13B shows actuation of the carousel movement means to rotate the container support members 407 around the carousel route 1303, as indicated by arrows 1307, in accordance with one embodiment of the present invention. FIG. 13C shows movement of the gripper assembly 601 to engage with the handle 607C of the container 303A after the container 303A was positioned within the transfer position 1305A through actuation of the carousel movement means. FIG. 13C also shows the container 303C lifted from its container support member 407. From this point, horizontal slide assembly 605 to which the gripper assembly 601 is connected can be operated to move the container 303C horizontally and/or vertically to enable transfer of the container 303C from the AGV 200C in a manner similar to that previously described with regard to FIGS. 7A-7K.

Although the example AGV embodiments (200, 200A, 200A-1, 200A-2, 200B, 200C) disclosed above have been defined to carrying multiple containers, e.g., 303A-303D, at a time, it should be understood that the AGV can be defined to carry essentially any number of containers at a time, so long as an overall size of AGV enables movement as required throughout the fab. For example, FIG. 14A shows an AGV 200D that is defined to carry a single container 303A at a time, in accordance with one embodiment of the present invention. The AGV 200D is defined as a wheeled vehicle having at least three wheels 401. In various embodiments, different numbers of the wheels 401 can be defined to turn to provide for steering of the AGV 200D. It should be understood that the turning and orientation of the wheels 401 are controlled by electromechanical systems on board the AGV 200D in accordance with instructions communicated to the AGV 200D from the fab computer and/or in accordance with signals generated by sensors on board the AGV 200D or by communication with devices deployed within the fab.

The AGV 200D further includes a base 403 defined to provide sufficient weight and stability to the AGV 200D during any operation to be performed by the AGV 200D. More specifically, the base 403 is defined and weighted to lower the center of gravity of the AGV 200D to ensure that the AGV 200D will not topple over as it moves throughout the fab and as it operates to transfer containers 303 to/from LPT's 301 or other equipment within the fab. In one embodiment, the base 403 is configured to house the computing/control equipment and the power supply, e.g., batteries, required for AGV 200D operation.

The AGV 200D of this embodiment is further equipped with a lifting/guiding member 1404 and container support member 407. The container support members 407 is connected to a lifting means, such as a chain drive or belt drive, within the lifting/guiding member 1401 to enable controlled vertical movement of the container support members 407 in the Z direction. As with the AGV 200A, the AGV 200D includes the gripper assembly 601 connected to the horizontal slide assembly 605. The horizontal slide assembly 605 is connected to a movement means, such as a chain drive or belt drive, to enable controlled vertical movement of the horizontal slide assembly 605 within the vertical track 1403 defined within the lifting/guiding member 1401. The vertical track 1403 is defined to enable movement of the gripper assembly 601 to engage with/disengage from the handles 607A of the container 303A when positioned on the container support member 407.

FIG. 14B shows the AGV 200D operated to lower the horizontal slide assembly 605 and gripper assembly 601 to engage with the handle 607A of the container 303A. FIG. 14C shows the AGV 200D operated to lift the horizontal slide member 605 and gripper assembly 601, so as to lift the container 303A to an appropriate transfer height. FIG. 14D shows the horizontal slide member 605 actuated to extend horizontally so as to move the gripper assembly 601 and container 303A connected thereto horizontally toward the LPT 301 to a location above the advance plate assembly 313 of the LPT 301. At this point, the attitudinal orientation of the container 303A relative to the LPT 301 and advance plate 315 is corrected as necessary to ensure proper alignment of the container 303A over the advance plate assembly 313 and registration pins of the advance plate 315. Then, as shown in FIG. 14E, the horizontal slide assembly 605 is lowered within the lifting/guiding member 1401 to lower the container 303A onto the advance plate 315 of the LPT 301. Then, as shown in FIG. 14F, the gripper assembly 601 is disengaged from the handle 607A, and the horizontal slide assembly 605 is raised be the lifting/guiding member 1401 to provide clearance of the gripper assembly 601 relative to the handle 607A, and the horizontal slide assembly 605 is retracted. Then, the AGV 200D is free to move on to another task within the fab.

It should be understood that the various example AGV embodiments described herein can be defined to handle containers and workpieces of various types, shapes, and sizes. As previously mentioned, the "container" as referenced herein can refer to any type of container used within a fab, such as a FOUP (Front Opening Unified Pod), a FOSB (Front-Opening Shipping Box), a SMIF (Standard Mechanical Interface) pod, a SRP (Single Reticle Pod), an open substrate cassette, among many others. Also, the "workpiece" as referenced herein can refer to a semiconductor wafer, a semiconductor substrate, a reticle, a liquid crystal panel, a rigid magnetic media, e.g., for hard disk drives, a solar cell, among many others. In one particular embodiment, the container is defined as a reticle container, and the workpiece is a reticle. Examples of reticles containers are described in each of U.S. Pat. No. 7,318,697, U.S. Pat. No. 6,364,595, and U.S. Patent Application Publication No. 2004/0005209, which are incorporated herein by reference in their entirety. It should be understood, however, that the reticle containers described in the above-identified U.S. patents and U.S. patent application Publication are referenced by way of example, and in no way limit the scope of container or workpiece with which an AGV, as described herein, may be defined to operate.

Figure 15A:
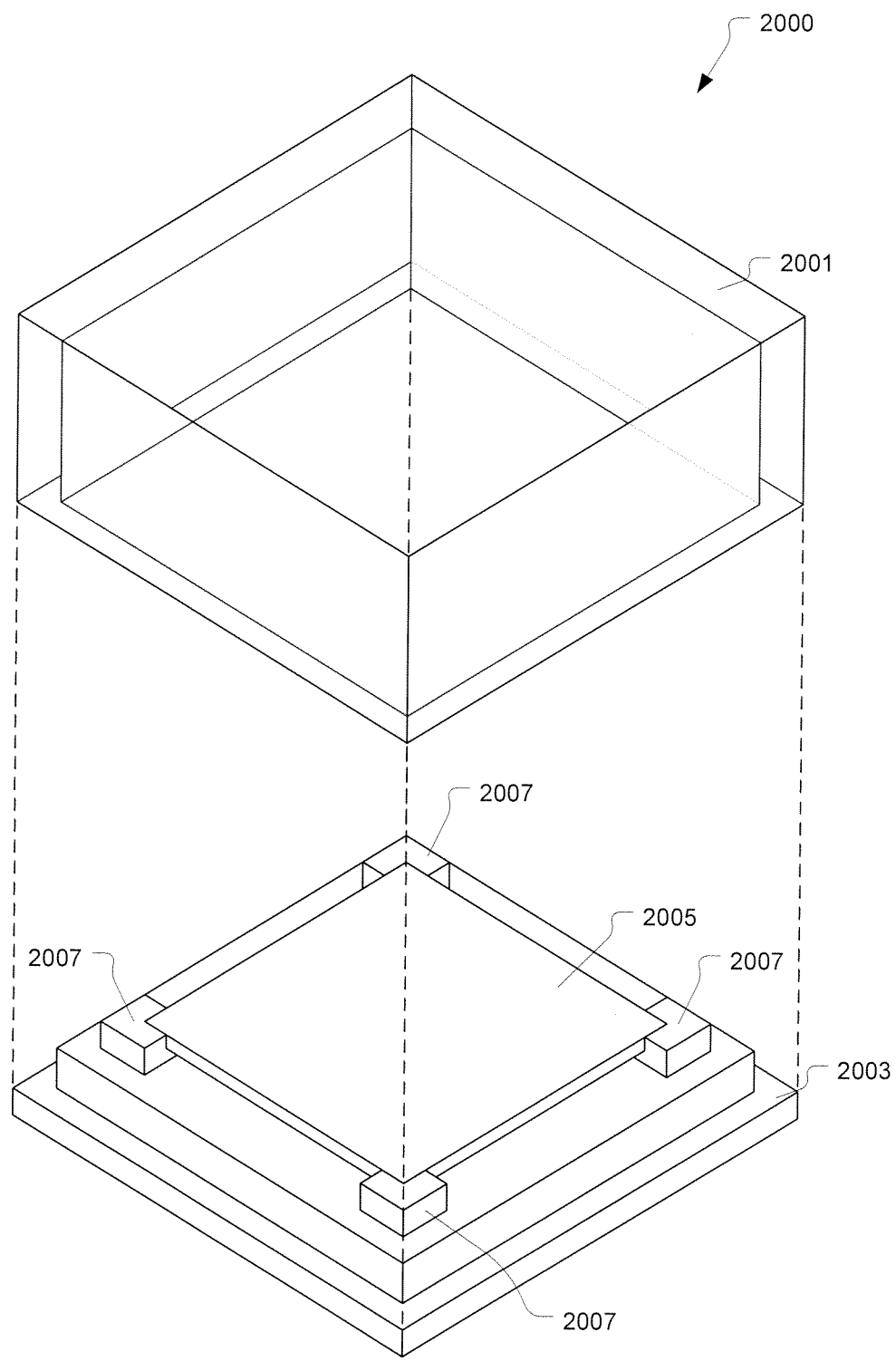
FIG. 15A shows an example of a reticle container that may be handled/stored/transported by an AGV, in accordance with one embodiment of the present invention.
Figure 15B:
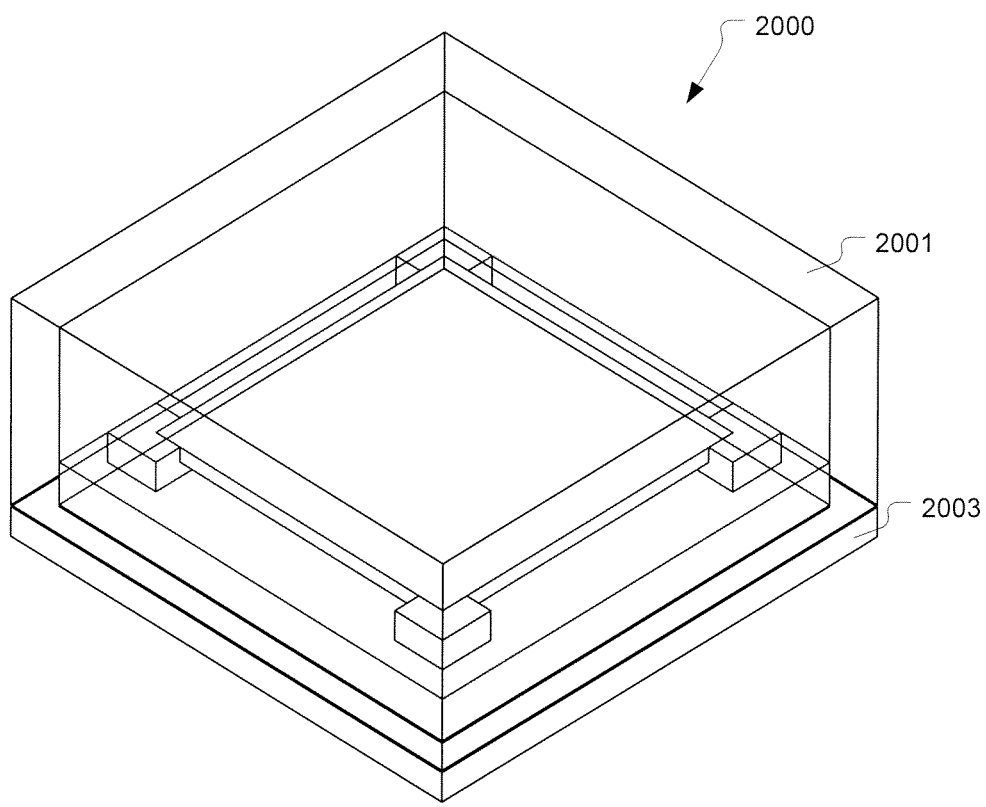
FIG. 15B shows the reticle container with the cover secured to the base to provide a controlled ambient enclosure for the reticle, in accordance with one embodiment of the present invention.

FIG. 15A shows an example reticle container 2000 that may be handled/stored/transported by an AGV, in accordance with one embodiment of the present invention. The reticle container 2000 in this example is defined by a base 2003 and a cover 2001. The reticle container 2000 includes retaining clips 2007 for securely holding a reticle 2005. While the example of FIG. 15A is shown to hold a single reticle 2005, it should be appreciated that other reticle container embodiments can be defined to hold multiple reticles 2005. FIG. 15B shows the reticle container 2000 with the cover 2001 secured to the base 2003 to provide a controlled ambient enclosure for the reticle 2005, in accordance with one embodiment of the present invention.

FIG. 15C shows an end view of an AGV 200E, in accordance with one embodiment of the present invention. FIG. 15D shows a side view of the AGV 200E, in accordance with one embodiment of the present invention. The example AGV 200E is essentially the same as the previously described example AGV 200A of FIGS. 4A-4B. However, the AGV 200E is defined to include many container support members 407 for supporting many reticle containers 2000, such as described with regard to FIGS. 15A-15B. It should be understood that the AGV 200E can be defined to incorporate any of the features previously described in FIGS. 4A-14F, with regard to handling and transfer of the container, i.e., of the reticle container 2000.

Figure 16:
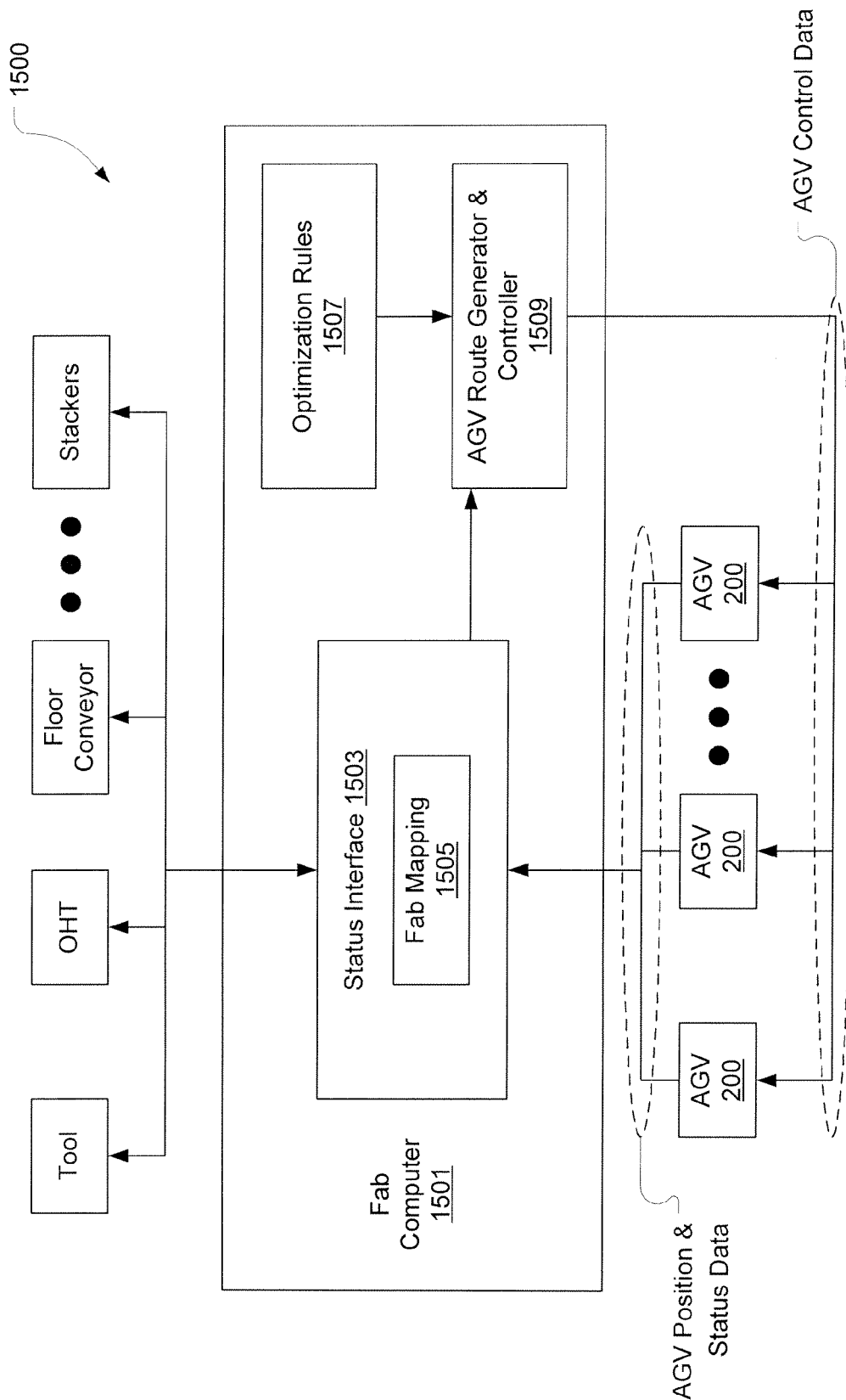
FIG. 16 shows a fab control system defined to interface with and control AGVs, in accordance with one embodiment of the present invention.

FIG. 16 shows a fab control system 1500 defined to interface with and control AGV's 200, in accordance with one embodiment of the present invention. The system 1500 includes a fab computer 1501 defined and programmed to control essentially all automated operations within the fab. It should be understood that the fab computer 1501 in the system 1500 can represent multiple fab control computers defined to operate in coordination with each other to control operations throughout the fab. Each of the multiple fab control computers can be defined to communicate with one or more of the other fab control computers through either wired or wireless communication connections. For ease of description, the fab computer 1501 is referred to hereafter as a single computer. However, it should be understood from the foregoing that the fab computer 1501 can include multiple interconnected computer systems.

The fab computer 1501 includes a status interface 1503 that is defined to provide a current status of each component within the fab, such as tools 103, OHT systems, floor conveyer systems, stackers, LPT's 301, among many other components. The current status of a given component can include information such as whether or not the component is operating, is scheduled to operate at a given time, or is encountering a malfunction or other problem. The status interface also includes a fab mapping module 1505 that monitors and conveys a material handling state of the fab. For instance, at a given time the fab mapping module 1505 is aware of where each component is located in the fab relative to a floorplan of the fab, and where each container and workpiece is located in the fab relative to both the floorplan and components within the fab. Using the information gleaned through the fab mapping module 1505 and status interface 1503, the fab computer 1501 is defined to control operation of each component within the fab and movement of all containers/workpieces within the fab, in accordance with a prescribed schedule and a current state of the fab.

With implementation of the AGV's within the fab, the fab computer 1501 can be defined to include an AGV route generator & controller (RGC) module 1509. The AGV RGC module 1509 is defined to process prescribed AGV operational instructions and current AGV status feedback, in view of a current state of the components and material handling systems within the fab, to generate AGV instructions and transmit those AGV instructions to the appropriate AGV's within the fab. In one embodiment, the AGV RGC module 1509 can be defined to operate in accordance with a prescribed set of optimization rules 1507. The optimization rules 1507 can provide direction to the AGV RGC module 1509 with regard to how AGV operational instructions should be generated for different scenarios that may occur within the fab with regard to fab component and material handling states. For instance, a simple optimization rule may be defined to detour an AGV from a prescribed route of travel within the fab of travel if an interference is detected ahead of the AGV. Another example optimization rule may be to alter a tool destination of an AGV if the tool to which the AGV was scheduled to travel is busy/down and another tool of the same capability is available.

The AGV RGC module 1509 is defined to communicate AGV control data to each AGV present within the fab. The communication between the AGV RGC module 1509 and the various AGV's can be accomplished through essentially any combination of wired and wireless communication networks. For example, in one embodiment, the AGV RGC module 1509 sends a communication to a given AGV from the fab computer 1501, through a network, to a wireless hub detected to be in communication range of the given AGV, and from the wireless hub to a wireless receive onboard the AGV. Each AGV can be assigned a unique identifier to enable correct routing of communications from the AGV RGC module 1509 to the appropriate AGV. It should be understood that a given communication from the AGV RGC module 1509 to an AGV can include data and/or instructions to direction essentially any operation which the AGV is capable of performing.

Additionally, each AGV can be equipped with a wireless communication transmitter to provide for communication of data from the AGV to the fab computer 1501. In one embodiment, the AGV is defined to establish a communication connection with a wireless hub within range of the AGV that is networked to the fab computer 1501. And, as the AGV travels throughout the fab, the AGV is able to maintain a communication connection with the network by switching between wireless hubs in a seamless manner so as to ensure that continuous communication is maintained between the AGV and the fab computer 1501. In general, each AGV will transmit its position and status data to the fab computer 1501 in accordance with one or more of a prescribed frequency, various operational states of the AGV, and/or various operational states of fab equipment associated with a directed mission of the AGV. Also, in one embodiment, the AGV can serve as a communication proxy as it travels through the fab to enable essentially any appropriately equipped component within the fab to wirelessly communicate through the AGV to the fab computer 1501. Also, in one embodiment, the AGV provides a mobile computing terminal to enable access to the fab computer 1501 or any application operating thereon from any location within the fab at which the AGV is located.

Figure 17:
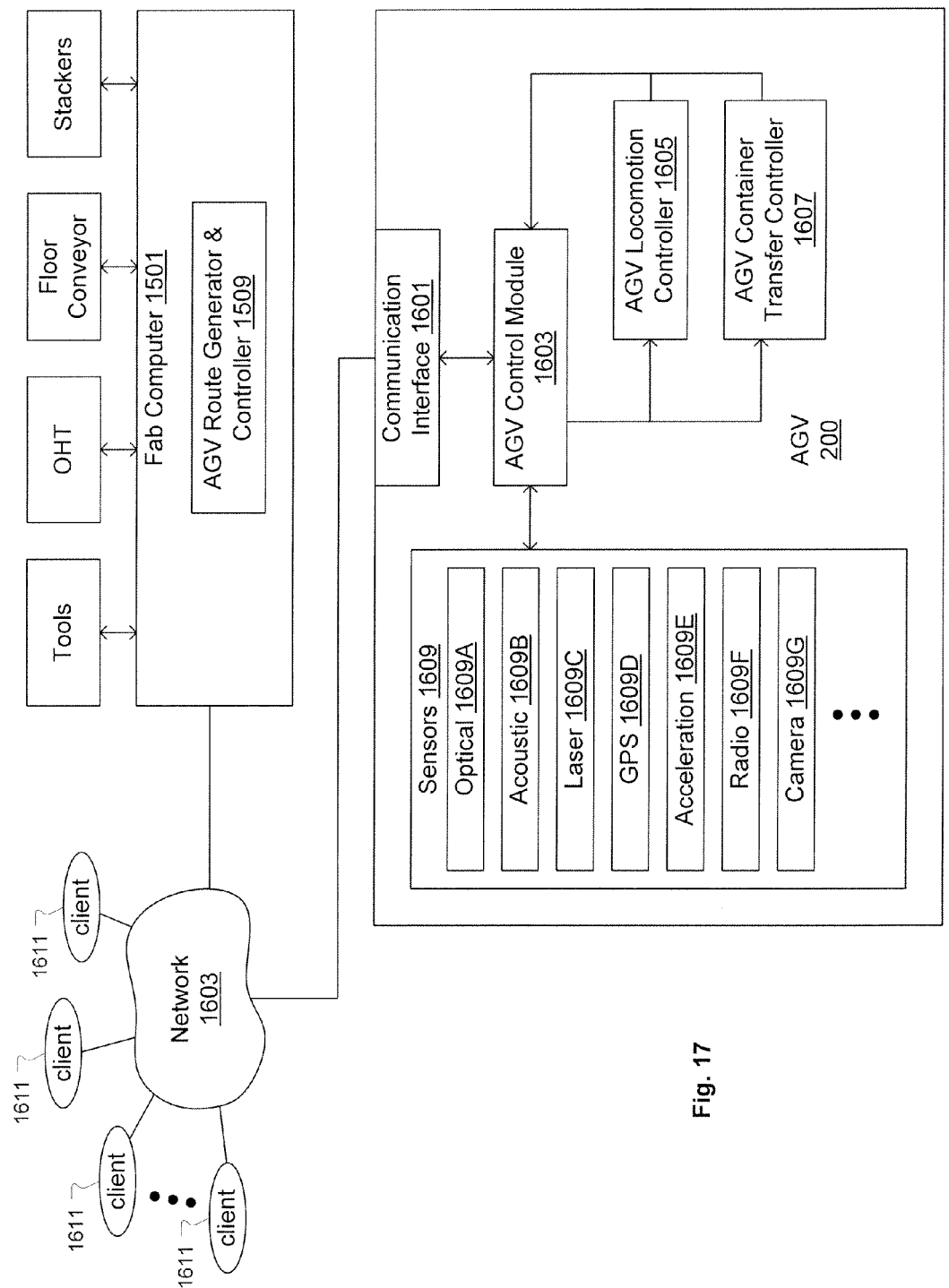
FIG. 17 shows the fab control system with a more detailed architectural view of a given AGV in communication with the fab computer, in accordance with one embodiment of the present invention.

FIG. 17 shows the fab control system 1500 with a more detailed architectural view of a given AGV 200 in communication with the fab computer 1501, in accordance with one embodiment of the present invention. The AGV 200 includes a wireless communication interface 1601 defined to enable wireless data communication between the AGV 200 and a network 1603 to which the fab computer 1501 is connected. In this manner, the communication interface 1601 of the AGV 200 is defined to receive instructions and data from the AGV RGC module 1509 and transmit its AGV position and status data to the fab computer 1501. Instructions and data received by the AGV 200 from the AGV RGC module 1509 are processed within an AGV control module 1603 onboard the AGV 200. Based on the received instructions and/or data, the AGV control module 1603 is defined to transmit appropriate control signals/data to one or more of an AGV locomotion controller 1605, an AGV container transfer controller 1607, and any of a number of sensors 1609 onboard the AGV 200.

The AGV locomotion controller 1605 is defined to direct operation of electromechanical systems onboard the AGV which control the physical movement and position of the AGV within the fab, such as drive and steering motors and associated mechanical linkage systems connected to the wheels of the AGV 200. It should be appreciated that the AGV control module 1603 can receive signals from a number of the sensors 1609, and based on those received signal direct operation of electromechanical systems onboard the AGV which control the physical movement and position of the AGV within the fab. In this manner, the AGV control module 1603 can be defined to override an instruction from the AGV RGC 1509 when a signal received from a sensor 1609 requires such an override. For example, if an optical sensor 1609A were to detect an impending collision of the AGV 200 with a structure within the fab, the AGV control module 1603 is defined to interpret the signal received from the optical sensor 1609A as indicating the impending collision and override the current movement instruction received from the AGV RGC controller 1509 to stop movement of the AGV 200 until either the collision threat goes away or a solution to the collision threat is generated.

Example sensors 1609 and systems that could be deployed onboard an AGV 200 include the following, among others:
- optical sensors 1609A, which enable determination of a presence of objects near the AGV 200 based on processed light input,
- acoustic sensors 1609B, which enable determination of a presence of objects near the AGV 200 based on processed acoustic input,
- laser emitters/sensors 1609C, which enable determination of a presence of objects near the AGV 200 and enable accurate alignment of the AGV 200 with objects within the fab, e.g., LPT's, based on transmission/receipt of laser light,
- GPS 1609D, which enables accurate geolocation of the AGV 200,
- acceleration sensors 1609E, which enable monitoring of acceleration rates of the AGV 200,
- radio transmitters/receivers 1609F, which enables radar-like determination of a presence of objects near the AGV 200, and
- camera 1609G, which enables visual monitoring/processing of scenes within view of the AGV 200 within the fab.

The AGV container transfer controller 1607 is defined to direct operation of electromechanical systems onboard the AGV which control transfer of a container between the AGV and other equipment within the fab. It should be appreciated that the AGV control module 1603 can receive signals from the sensors 1609, and based on those received signals direct operation of electromechanical systems onboard the AGV which control the container transfer operations of the AGV. In this manner, the AGV control module 1603 can be defined to override an instruction from the AGV RGC 1509 when a signal received from a sensor 1609 requires such an override. For example, an electrical current drawn by a motor onboard the AGV used to direct lifting of a container support member 407 can be monitored to enable detection of an unanticipated resistance applied against the container support member 407, and thereby enable the AGV control module 1603 to stop the transfer operation before the interference with the container support member 407 causes damage to either the AGV, the container, the workpieces, or the nearby fab equipment. It should be appreciated that the AGV control module 1603 is defined to accurately control all operations of the AGV in accordance with both instructions/data received from the centralized AGV RGC module 1509 and from the sensors 1609 and systems onboard the AGV 200 so as to ensure safe and efficient autonomous operation of the AGV 200 with fab environment.

Additionally, with reference to FIG. 17, the fab network 1603 can include a number of client terminals 1611 through which humans can interact with the fab computer 1501. In one embodiment, through a client terminal 1611, a human can access the AGV RGC 1509 to assume direct control of a given AGV 200 within the fab. In this manner, the given AGV 200 can be directed to perform essentially any specialized task within the fab that may not otherwise be possible through existing non-AGV fab infrastructure and systems.

Figure 18:
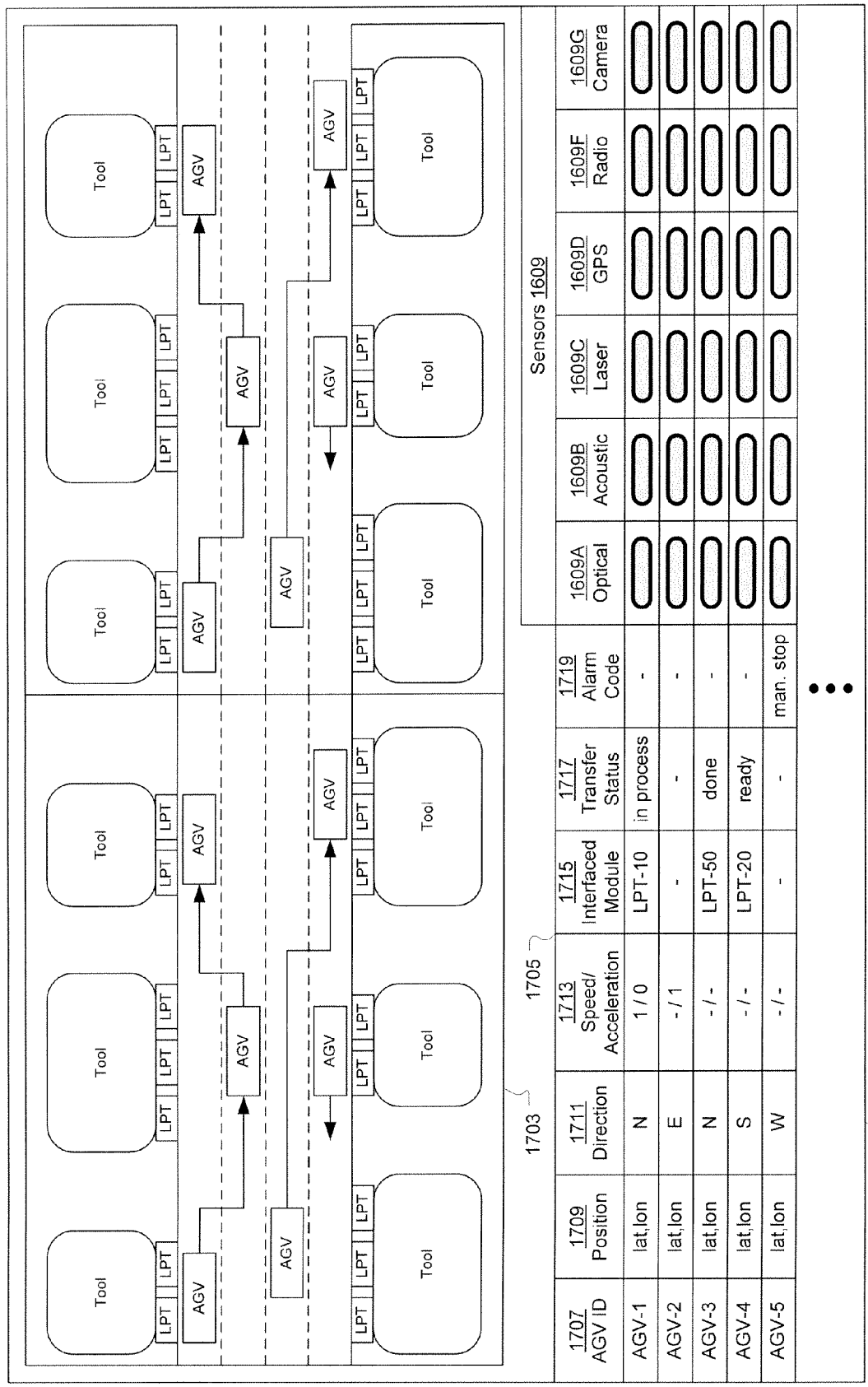
FIG. 18 shows an exemplary status diagram that may be generated by the AGV RGC to enable monitoring of AGV operations within the fab, in accordance with one embodiment of the present invention.

FIG. 18 shows an exemplary status diagram 1701 that may be generated by the AGV RGC 1509 to enable monitoring of AGV operations within the fab, in accordance with one embodiment of the present invention. The status diagram 1701 may be viewed in a graphical user interface (GUI) on a computer display connected to the fab computer 1501, or connected to the network 1603 which is in turn connected to the fab computer 1501. In one embodiment, the status diagram 1701 include a floorplan map 1703 of the fab, such as that shown in FIG. 1, that indicates a position/direction of travel of each AGV within the fab. The floorplan map 1703 of the fab may be segmented as necessary to provide for meaningful representation of a given region within the fab, and to provide for navigation of the floorplan map 1703 throughout the fab. Also, in one embodiment, the status diagram 1701 can include an AGV status chart 1705 that shows information about each AGV deployed within the fab. Also, it should be appreciated that the information contained within the AGV status chart 1705 can be updated in real-time to provide a current view of the status of each AGV within the fab. For each AGV, the AGV status chart 1705 can include the following types information, among others:
- AGV identifier 1707,
- AGV position 1709 (either geolocation or fab coordinates),
- AGV direction of travel 1711,
- AGV speed and acceleration 1713,
- identifier of fab component to which AGV is interfaced 1715,
- container transfer status of AGV 1717,
- alarm code 1719 representing any alarm triggered onboard the AGV, and
- sensor states 1721 providing data from any number of sensors 1609 onboard the AGV.

Figure 19:
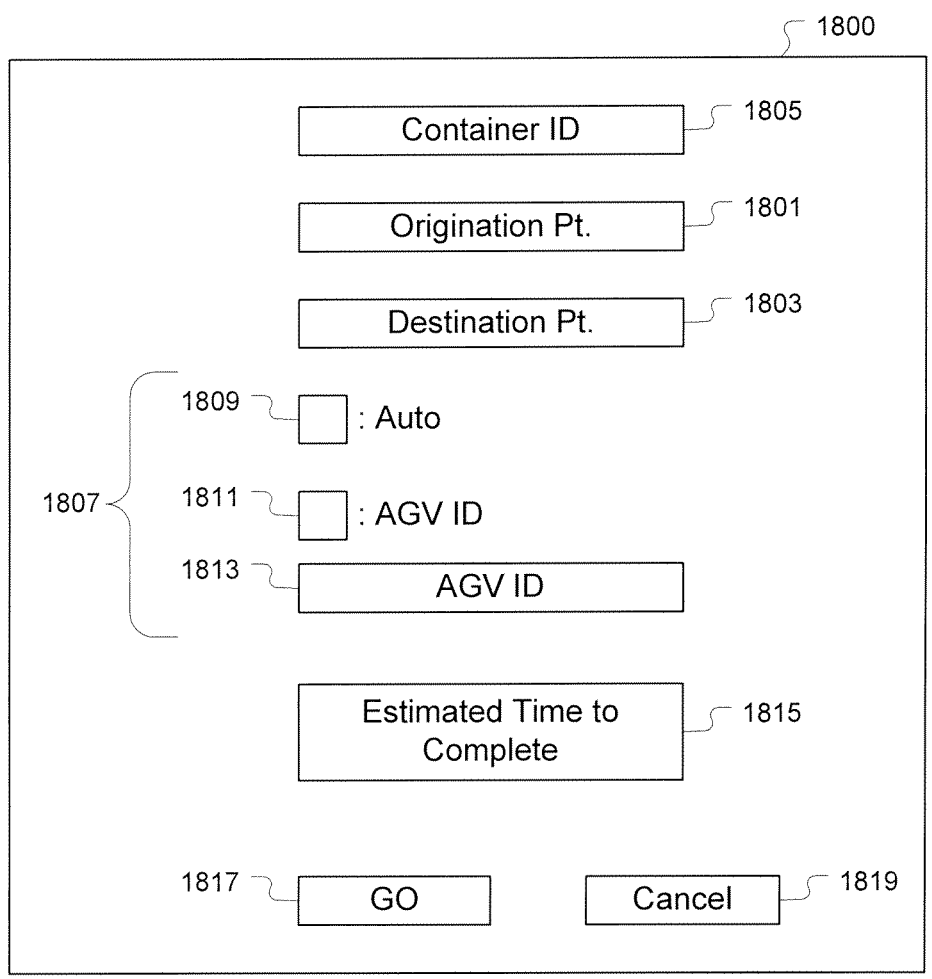
FIG. 19 shows an AGV dispatch GUI that may be implemented by the AGV RGC to enable clients to input a request for AGV operation within the fab, in accordance with one embodiment of the present invention.

FIG. 19 shows an AGV dispatch GUI 1800 that may be implemented by the AGV RGC 1509 to enable clients 1611 to input a request for AGV operation within the fab. The GUI 1800 can include a container pickup location entry field 1801, a container drop off location field 1803, and a container identifier field 1805. The AGV dispatch GUI 1800 also allow the client 1611 to provide preferences 1807 as to how an AGV is to be selected for performing the requested operation within the fab. In one embodiment, these selection preferences 1807 can include an auto selection checkbox 1809, which would direct the AGV RGC 1509 to determine which AGV is most appropriate for use in carrying out the request for AGV operation. The selection preferences 1807 can also include an AGV identifier checkbox 1811 and corresponding AGV identifier entry field 1813, so that the client 1611 can direct a specific AGV to perform the request. The GUI 1800 can also include an estimated time to compete field 1815 to display how long it may take for the request to be completed based on the entered data and preferences. The GUI 1800 can also include a go button 1817 to launch the request and a cancel button 1819 to cancel the request. It should be understood that the GUI 1800 is provided by way of example. In other embodiment, GUI's of essentially limitless form and content can be constructed to enable interface with the AGV RGC 1509 and control of AGV operations within the fab.

Based on the foregoing, it should be understood that the AGV utilizes its X-motion capability to present a designated product container to a designated tool loadport. In one embodiment, the AGV provides for Z-motion of the product container to enable the transfer of the product container from its storage location on the AGV to a Z position at which the product container can be transferred to the designated tool loadport.

In various embodiments, the transfer of the product container between the AGV and the designated loadport can be performed in a number of ways. In one embodiment, the loadport has a horizontal traveling linear slide assembly (or equivalent means) that is capable of lifting the product container off of the advance plate of the loadport, and extend the product container into/over the AGV, and lower the product container onto alignment features that will locate and retain the product container during AGV travel.

In another embodiment, the AGV has a horizontal traveling slide assembly (or equivalent means) that is capable of retrieving the product container from its storage location on the AGV, and extending the product container at the appropriate elevation to enable transfer of the product container to the advance plate of the tool loadport. In one version of this embodiment, the horizontal traveling slide assembly is defined to interface with a bottom of the product container to pick up and move the product container. In another version of this embodiment, the horizontal traveling slide assembly is equipped with a gripper assembly and is defined to interface with a top structure of the product container to pick up and move the product container.

In one embodiment, the AGV can be defined to provide additional storage locations for product containers. For example, the AGV can be defined to lift product containers from their storage location on the AGV to an appropriate height for transfer of the product container to the loadport. Similarly, the AGV is defined to retrieve the product container from the loadport at the appropriate transfer height and move the product container to its storage location on the AGV. In one version of this embodiment, the AGV is defined to include multiple tiers/levels of storage locations. Also, in one embodiment, the product container lifting mechanism of the AGV is also defined to extend horizontally to provide for loading/unloading of the product container onto/from the loadport. This embodiment enables the AGV to work directly with the existing loadport configuration without requiring modification of the existing loadport.

In one embodiment, the AGV is defined to have multiple product container storage locations and a carousel mechanism for moving the multiple product container storage locations through a circuitous route within the AGV. The route of the carousel mechanism can include a transfer position, such that a product container positioned in the transfer position by the carousel mechanism can be transferred to a loadport. In different embodiments, this transfer may be performed by a transfer mechanism onboard the AGV or by a transfer mechanism onboard the loadport. Also, with an empty storage location positioned at the transfer position, a product container can be retrieved from the loadport into the empty storage location of the AGV. Again, this retrieval may be performed by a transfer mechanism onboard the AGV or by a transfer mechanism onboard the loadport. For further description of the use and benefits of a recirculating carousel, see U.S. patent application Ser. No. 12/780,761, filed on May 14, 2010, entitled "Substrate Container Storage System," which is incorporated herein by reference in its entirety, and U.S. patent application Ser. No. 12/780,846, filed on May 14, 2010, entitled "Integrated Systems for Interfacing with Substrate Container Storage Systems," which is incorporated herein by reference in its entirety.

The AGV-equipped dynamic storage and transfer system can also include means for identifying containers, such as RFID (radio frequency identification). Also, the system can include means for communicating with loadports, process/metrology tools, and with other factory automation modules, such as product stocking systems and other product container transport systems. In one embodiment, the system can also include routing and control software as well as optimization algorithms and the ability to work in conjunction with overall factory MES (Manufacturing Execution Systems) software.

Additionally, the AGV and associated dynamic storage and transfer system can be utilized with essentially any type of product container. Examples of product containers include a FOUP (Front Opening Unified Pod), FOSB (Front-Opening Shipping Box), SMIF (Standard Mechanical Interface) pod, SRP (Single Reticle Pod), open substrate cassettes, among many others. In one embodiment, the AGV can provide for open storage of substrates in the factory cleanroom air. In another embodiment, the AGV can be defined to provide an isolated clean air mini-environment around substrates stored on the AGV. In one embodiment, the clean air mini-environment can be maintained around the substrates as they are transferred between the AGV and loadport.

Figure 20:
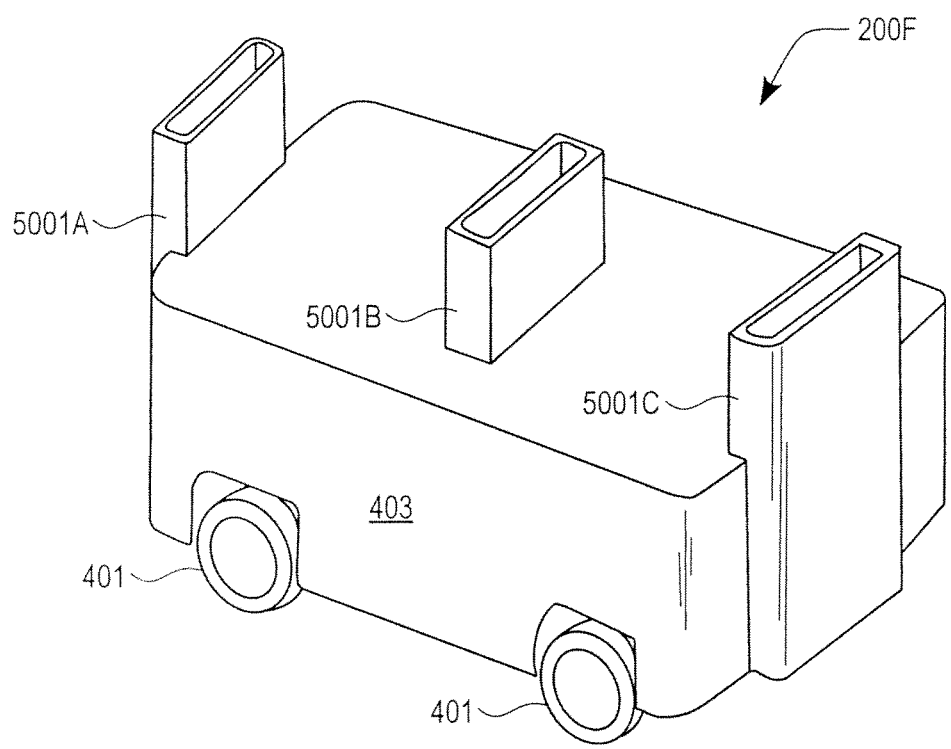
FIGS. 20-23 depict various views of an AGV equipped with a "Dynamic Storage and Transfer" (DST) mechanism (AGV/DST), in accordance with one embodiment of the present invention.
Figure 21:
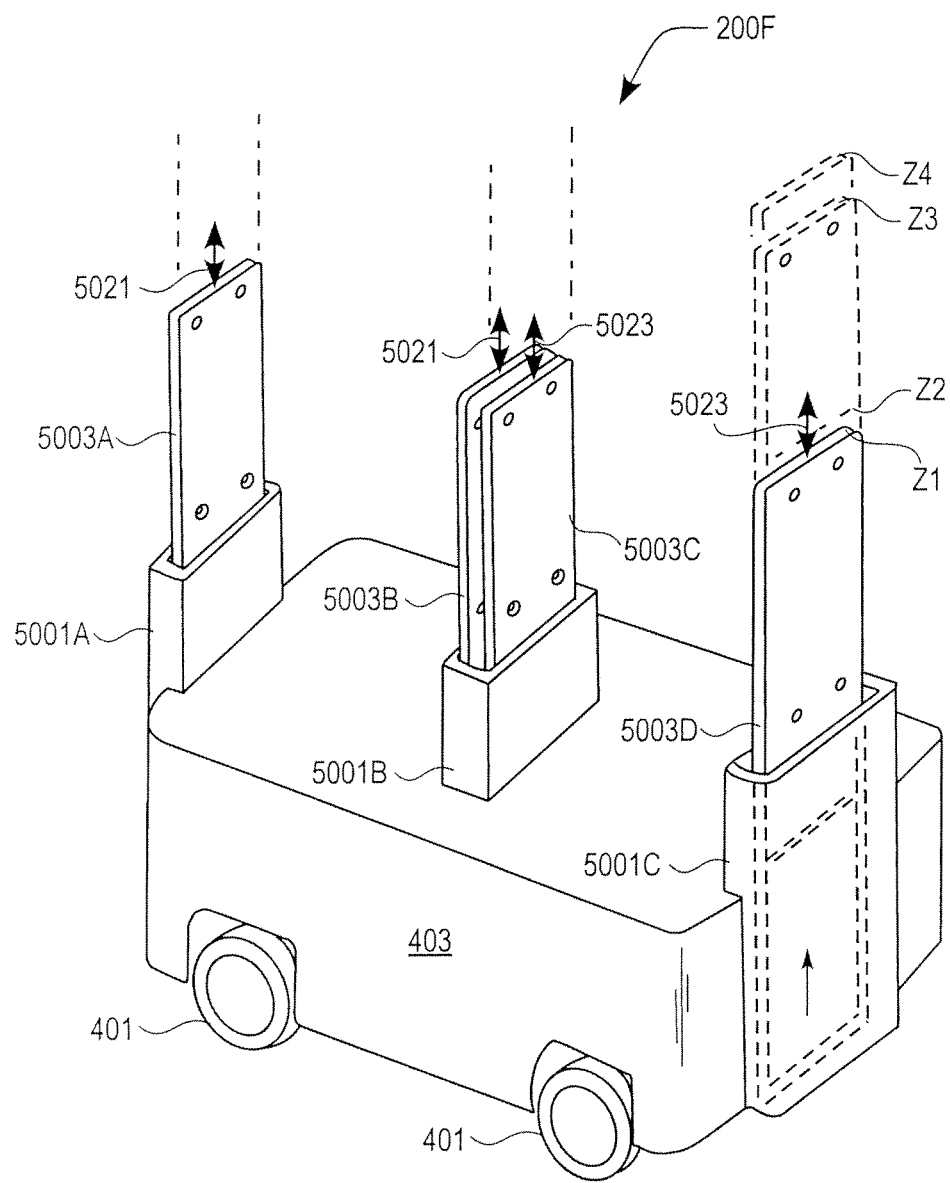

FIGS. 20-23 depict various views of an AGV equipped with a "Dynamic Storage and Transfer" (DST) mechanism (AGV/DST 200F), in accordance with one embodiment of the present invention. FIG. 20 shows the base 403 (i.e., chassis 403) of the AGV/DST 200F equipped with the wheels 401, in accordance with one embodiment of the present invention. In one embodiment, the AGV/DST 200F includes three vertical motion guides/lift towers (VMG/LT) 5001A, 5001B, 5001C fixed to the base 403. FIG. 21 shows the AGV/DST 200F with Z lift plates (ZLP's) disposed in the VMG/LT's 5001A, 5001B, 5001C.

Specifically, a ZLP 5003A is disposed in the VMG/LT 5001A so as to be movable in a controlled manner in the Z direction, i.e., in the vertical direction, relative to a floor upon which the AGV/DST 200F is positioned, as indicated by arrow 5021. The ZLP's 5003B, 5003C are disposed in the VMG/LT 5001B so as to be independently movable in a controlled manner in the Z direction, as indicated by arrows 5021 and 5023. And, the ZLP 5003D is disposed in the VMG/LT 5001C so as to be movable in a controlled manner in the Z direction, as indicated by arrow 5023. The ZLP's 5003A and 5003B are configured, connected, and controlled to be moved in unison in the Z direction. Also, the ZLP's 5003C and 5003D are configured, connected, and controlled to be moved in unison in the Z direction.

The VMG/LT's 5001A, 5001B, 5001C are defined to guide their corresponding ZLP's 5003A, 5003B, 5003C, 5003D to provide for their substantially vertical movement in the directions 5021, 5023. Also, the VMG/LT's 5001A, 5001B, 5001C are defined to provide structural support for the their corresponding ZLP's 5003A, 5003B, 5003C, 5003D so as to prevent lateral movement as they are moved in the Z direction. In one embodiment, the drive mechanism and associated mechanical linkage required for movement of the ZLP's 5003A, 5003B can be disposed within the base 403. Also, in one embodiment, the drive mechanism and associated mechanical linkage required for movement of the ZLP's 5003C, 5003D can be disposed within the base 403. It should be appreciated that in various embodiments essentially any type of drive mechanism, e.g., rotary, linear, etc., and associated mechanical linkage, e.g., belts, gears, chains, etc., can be utilized to provide for controlled vertical movement of the pair of ZLP's 5003A, 5003B, and for controlled vertical movement of the pair of ZLP's 5003C, 5003D. Also, the drive mechanisms can be connected to be controlled by a computer system either locally located onboard the AGV/DST 200F or remotely located and connected to a wireless network within range of a wireless communication capability of the AGV/DST 200F.

In one embodiment, each pair of ZLP's 5003A/5003B and 5003C/5003D is controlled to move in the Z direction between four prescribed Z positions Z1, Z2, Z3, Z4. In this embodiment, Z positions Z2 and Z4 correspond to vertical positions at which a container on board the AGV/DST 200F can be moved horizontally over a receiving device, e.g., loadport 301. And, Z positions Z1 and Z3 correspond to vertical positions at which a container can be lowered to engage with the receiving device, e.g., loadport 301, after having been moved horizontally over the receiving device.

Figure 22:
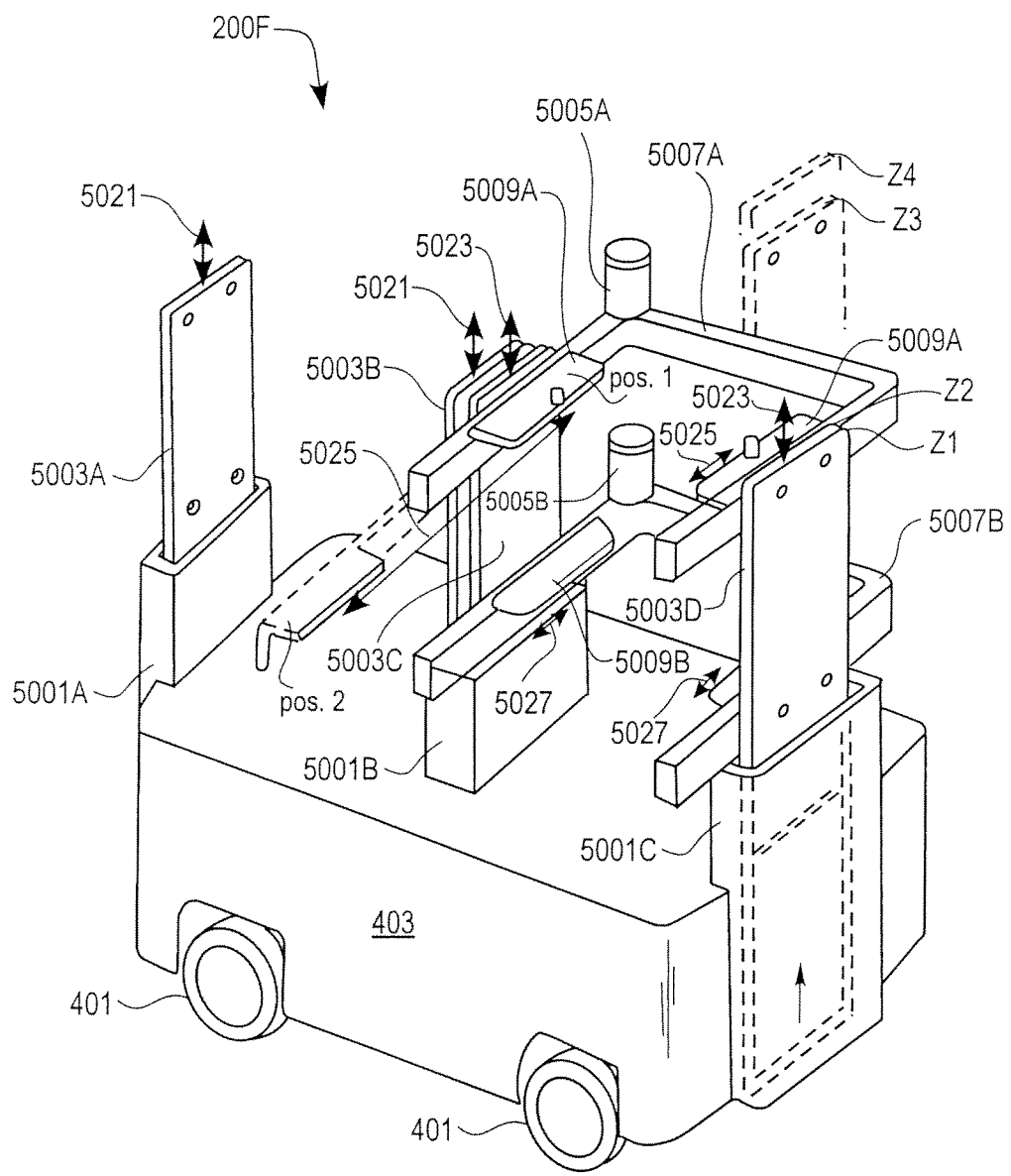

FIG. 22 shows the AGV/DST 200F with example container transfer mechanisms 5007A, 5007B connected between the ZLP pair 5003C, 5003D, in accordance with one embodiment of the present invention. It should be understood that additional container transfer mechanisms like 5007A, 5007B can be connected between the ZLP pair 5003A, 5003B, in a manner similar to the connection of the container transfer mechanisms 5007A, 5007B between the ZLP pair 5003C, 5003D. However, in the interest of clarity, FIG. 22 shows the one set of container transfer mechanisms 5007A, 5007B connected between the ZLP pair 5003C, 5003D. Each container transfer mechanism 5007A, 5007B includes a linear slider 5009A, 5009B, respectively. The linear slider 5009A is defined to engage a workpiece container, such as a FOUP or any other type of workpiece container, and move the workpiece container is a horizontal direction 5025. Similarly, the linear slider 5009B is defined to engage a workpiece container, such as a FOUP or any other type of workpiece container, and move the workpiece container is a horizontal direction 5027.

Each container transfer mechanisms 5007A, 5007B is equipped with a motor drive 5005A, 5005B, respectively, and corresponding linkage to provide for independently controlled horizontal movement of its linear slider 5009A, 5009B from a first position (pos. 1) to a second position (pos. 2), i.e., to an extended position (pos. 2). In this manner the linear sliders 5009A and 5009B can be independently controlled to provide for horizontal movement of a workpiece container to and from a loadport beside which the AGF/DST 200F is positioned. It should be understood that through the independently controlled vertical movement of the ZLP pairs 5003A/5003B and 5003C/5003D, and through positioning of the AGV/DST 200F relative to the loadport, the container transfer mechanisms 5007A, 5007B and their linear sliders 5009A, 5009B can be used to position a container at any location within the extension distance of the linear sliders 5009A, 5009B and the vertical travel distance of the ZLP pairs 5003A/5003B and 5003C/5003D, so as to provide for controlled transfer of a workpiece container between the AGV/DST 200F and a loadport, vice-versa.

Figure 23:
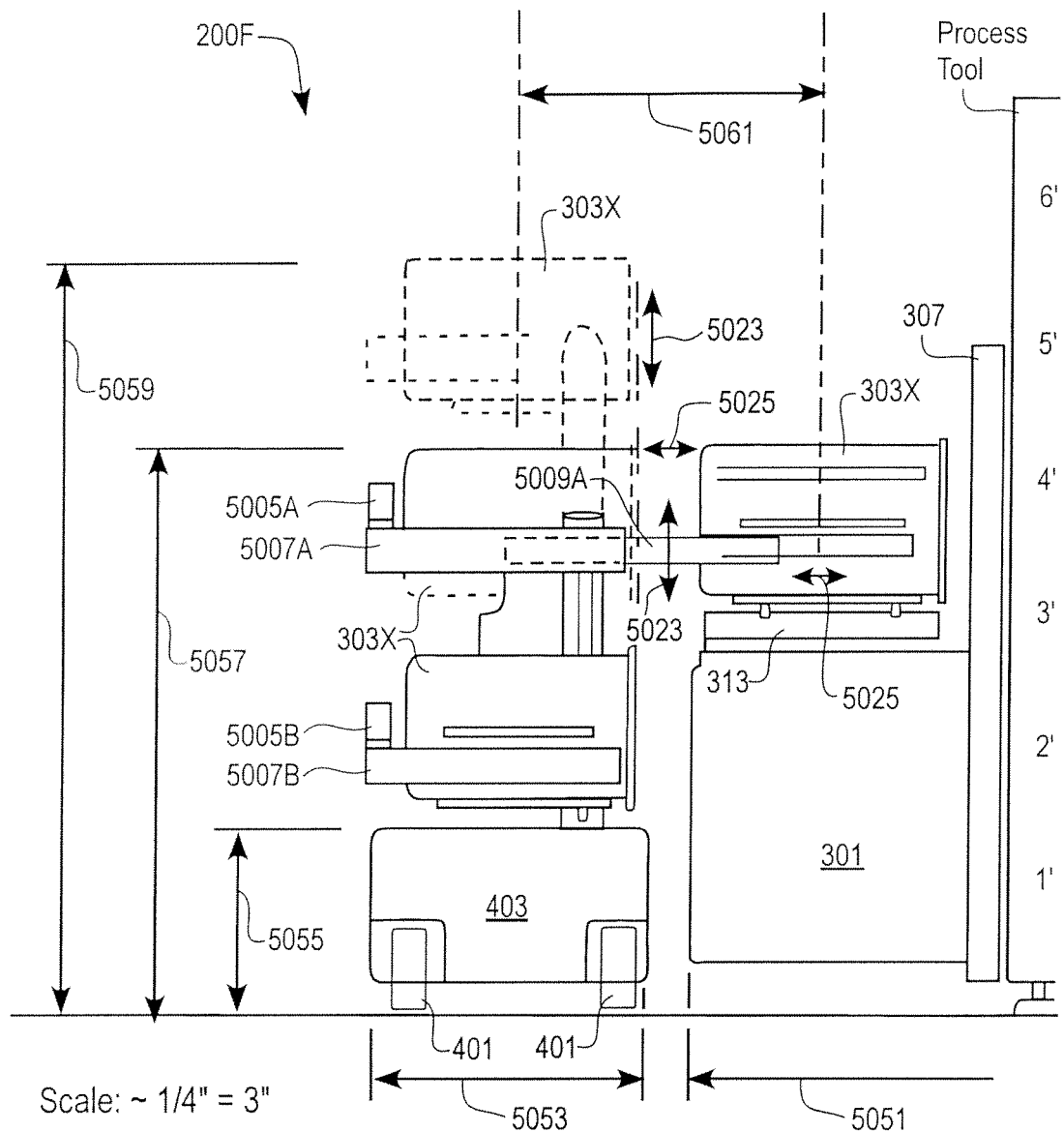

FIG. 23 shows the AGV/DST 200F positioned next to the loadport 301 to provide for transfer of a workpiece container 303X to/from the advance plate assembly 313 of the loadport 301. In one embodiment, the container transfer mechanisms 5007A, 5007B and their linear sliders 5009A, 5009B are defined to extend the container 303X over the advance plate assembly 313 of the loadport having a clearance 5051 of about 1 meter. Also, in one embodiment, the base of the AGV/DST 200F has a width 5053 of about 1.25 meters. In this embodiment, a horizontal movement distance 5061, i.e., stroke distance 5061, of the workpiece container 303X is about 0.7 meter.

In one embodiment, a distance 5055 of the top surface of the base 403 above the floor is within a range extending from about 0.43 meter to about 0.48 meter. Also, in one embodiment, a distance 5057 of the top surface of the upper container 303X above the floor in a travel configuration (mode), i.e., a vertical clearance distance 5057 of the AGV/DST 200F in the travel mode, is up to about 1.29 meters. Also, in one embodiment, a distance 5059 of the top surface of the upper container 303X above the floor in during a lower container transfer operation is up to about 1.73 meters. It should be understood, however, that each of the above-mentioned distances 5051, 5061, 5053, 5055, 5057, 5059 are provided by way of example, and can be different in different embodiments, depending on the configuration of the AGV/DST 200F, container 303X, and loadport 301.

In one embodiment, the AGV/DST 200F is configured to provide for handling/storage of 450 mm FOUPs using the mid-level "Forklift" features contained in the Semi Standards for both 300 mm and 450 mm FOUP containers. The same principles would also directly apply to the use of the FOUP's base-plate which also has similar/analogous features to enable handling/storage. Either of the mid-level forklift or base-plate FOUP handling/storage techniques enable a very small AGV footprint relative to container capacity while also enabling the ability of the transfer system to provide random access to any of the depicted four storage/transfer locations on the AGV. This is achieved by raising or lowering each "tier" of FOUP storage, i.e., container tier, for the Z position selection, combined with horizontal (X axis/parallel with the tool-face) travel/positioning of the AGV. Additionally, each of the four storage locations has a dedicated horizontal container, e.g., FOUP, transfer mechanism (Y axis/perpendicular to the tool-face), as discussed with regard to the container transfer mechanisms 5007A, 5007B of FIGS. 20-23.

While the example AGV embodiment of FIGS. 20-23 depict two container tiers, it should be understood that other AGV embodiments can implemented any number of container tiers depending on the container geometry. Note that back-end/assembly operations employ a variety of container approaches and could employ single substrate containers in some applications. In such cases, it could also be efficient to provide the horizontal transfer mechanism on the tool and utilize an elevator-only type of mechanism on the AGV. In this case, the AGV would have the 'Dynamic Storage' functionality while the tool (or other transfer destination) would provide the 'Dynamic Transfer' function. In this case, real-time communication may be utilized between AGV/Dynamic Storage and the Stationary tool (or other location). In some instances, a semiconductor tool may be defined in accordance with a short-range infrared-based communication standard, e.g., E-84, which can be configured to provide a required communication bandwidth between the semiconductor tool and the AGV.

In another embodiment, a Storage Variant of the AGV can be configured to have static container tiers, i.e., shelves on the AGV, with both the vertical and horizontal container travel functions provided by the semiconductor tool. The Storage Variant AGV embodiment may be particularly useful with non-EFEM configurations. Additionally, in various embodiments, the AGV can be defined to provide for container transfer to stationary stocking locations and/or stockers with load/unload zones accessible by the AGV/DST architecture. In yet another embodiment, the AGV/DST can be configured to utilize the Dynamic Storage functionality in conjunction with a conventional multi-axis robotic device to accomplish product transfer.

It should be understood that for successful container transfer, the X, Y, and Theta positions of the AGV should be known accurately in relation to the position of the Tool's Loadports/ Containers. In various embodiments, this can be achieved through floor-based navigational markings, Tool/Loadport-based markings, or the use of other spatial recognition or reconnaissance systems that enable accurate positional control of the AGV vehicle and/or the transfer mechanisms. Also, in some embodiments, accuracy in positioning/orienting the AGV relative to the Tool's Loadports/Containers can be achieved through use of radio frequency (such as GPS) or Active Vision Recognition, which could, by way of example, recognize key loadport/container features such as the kinematic container support and alignment pins (Semi/Industry Standards) or other optically identifiable features/fiducials.

It should be appreciated that the overall AGV/DST concepts disclosed herein enable efficient access to one or more layers of stored product while providing for a mechanically simple and accurate product transfer means to and from a loadport. Also, it should be noted that although the drawings depict a 25 wafer capacity semiconductor wafer container, the AGV/DST embodiments disclosed herein can be applied to the handling of essentially any other product/container, such as reticle containers, 200 mm SMIF Pods, among others, or to applications in other industries.

As disclosed herein, the combination of the AGV with the active on-board product, i.e., workpiece/workpiece container, storage and handling system provides a mobile dynamic storage and/or handling system directed towards efficient operation in conjunction with standardized ultra-clean containers and process/metrology tool loadports and/or stationary storage and buffering locations. To serve the emerging needs of ultra-high productivity semiconductor manufacturing/testing/assembly operations it is sometimes necessary to perform multiple "puts and/or gets" of the containers at a given process/metrology tool or storage/buffering/transfer location. These emerging needs may require that the available container storage capacity on the AGV/DST be at least for two containers and possibly for three or more containers.

This container capacity of the AGV/DST is accomplished in a space-efficient manner based upon the narrow aisle widths in semiconductor manufacturing facilities. In a semiconductor factory aisle configuration, there can be a row of tools on each side of the aisle and the AGVs serving the tools can be defined to temporarily stop at opposing tools/locations for container transfer while still leaving sufficient space within the aisle between the AGVs for a moving vehicle (and/or humans) to pass between the AGVs. In one embodiment, the dimension into the aisle, i.e., width, of the AGV and its active on-board storage and handling system can be only slightly greater than the relevant dimension of the workpiece container. Maintaining the AGV width dimension close to the workpiece container dimension can be beneficial as the semiconductor wafer diameter transitions from the currently dominant size of 300 mm to 450 mm and larger.

The high capacity storage and container transfer system (DST) is defined to enable random access to the various container storage locations on the AGV without increasing the effective footprint of the AGV/DST, and is also defined to provide a container extension range outboard of the AGV that is sufficient for transferring the containers to/from a variety of loadports on the process/metrology tools. Additionally, the DST can be defined to interface with and support the containers in a variety of ways. For example, in one embodiment, the DST can be defined to interface with a top mounted handle on the container, where the top mounted handle has a standardized shape and alignment features. In another embodiment, the DST can be defined to interface with handles mounted on two sides of the container, and located approximately halfway between the base and the top of the container, e.g., as defined in standards as "Forklift Handles." In another embodiment, the DST can be defined to interface with surfaces defined on the baseplate of the container, e.g., as defined in standards as "Conveyor Rails." In yet another embodiment, the DST can be defined to use kinematic pin sockets located on the bottom surface of the container baseplate, e.g., at three locations, to interface with the container.

It should be understood that the AGV/DST can be defined to utilize a variety of the above-mentioned embodiments to interface with the containers. For example, the DST can include a support plate equipped with kinematic pins that interface with and support the container. This support plate may be capable of vertical travel to several positions such as a travel position, an access/clearance position, and a transfer position for enabling the delivery/receipt of the container to/from the process tool loadport. In one embodiment, the support plate may use offset pin locations. In another embodiment, the DST can provide support for the container using the kinematic pins, but also utilize either the conveyor rails, the forklift handles, or the top mounted handle for transfer to/from the tool loadport. It should be understood that any combination of the above-mentioned techniques for interfacing the DST with the container can be used to efficiently and securely support, store, transfer, and retrieve the container.

Based on the disclosure herein, a combination of an AGV and a dynamic handling, transfer, and storage system for use with sealed semiconductor containers is provided. The AGV/DST system disclosed herein can implement a variety of techniques for footprint, fast random access to a desired container onboard the AGV/DAT, controls simplicity, etc. In some embodiments, the container transfer mechanism is part of the tool loadport or is directly associated with the tool. In other embodiments, the container transfer mechanism, such as the DST, is fully implemented onboard the AGV, without requiring modification of the tool loadport. In other embodiments, a portion of the container transfer mechanism can be implemented on the tool loadport with another portion of the container transfer mechanism implemented onboard the AGV. It should be understood that the AGV and its container transfer mechanism can be defined to interface with container stockers or stocking locations adjacent to or above tool locations, such as DARTS, among others. Also, it should be understood that the AGV and its container transfer mechanism can be defined to interface with another AGV and its container transfer mechanism to enable transfer of containers from one AGV to the another AGV.

As described herein, a workpiece container storage and handling system is provided in one embodiment of the present invention. The workpiece container storage and handling system includes a base and a number of wheels connected to the base to provide for movement of the base. The workpiece container storage and handling system also includes a container handling system connected to the base and defined to hold at least two containers in a vertically overlying orientation relative to each other. The container handling system is defined to provide for controlled vertical travel of the at least two containers in unison relative to the base. The container handling system is also defined to provide for controlled and independent horizontal travel of each of the at least two containers relative to the base.

In one embodiment, the container handling system includes at least two separate container transfer mechanisms. Each of the at least two container transfer mechanisms includes support structures defined to support a single container. In one embodiment, the support structures are defined to engage a bottom surface of the single container. In one embodiment, the support structure are defined to engage opposing side surfaces of the single container. In one embodiment, the support structures are defined to engage a handle fixed to the single container. In one instance, the handle extends above the single container.

The container handling system also includes a vertical travel mechanism. Each of the at least two separate container transfer mechanisms is connected to the vertical travel mechanism, such that movement of the vertical travel mechanism in a vertical direction causes corresponding movement of the at least two separate container transfer mechanisms in unison in the vertical direction. The container handling system can include a vertical drive motor having mechanical linkage engaged therewith and connected to the vertical travel mechanism. The vertical drive motor and its mechanical linkage are defined to provide controlled movement of the vertical travel mechanism in the vertical direction in response to control signals. In one embodiment, the vertical drive motor and its mechanical linkage are positioned within the base.

Also, each of the at least two separate container transfer mechanisms can include a linear slider defined to move the support structures in a horizontal direction perpendicular to the vertical direction and relative to the vertical travel mechanism. In one embodiment, the container handling system includes at least two separate horizontal drive motors having mechanical linkage engaged therewith and connected to the linear slider of a respective one of the at least two separate container transfer mechanisms. Each horizontal drive motor and its mechanical linkage are defined to provide controlled movement of the liner slider to which it is connected so as to provide controlled movement of the support structures in the horizontal direction in response to control signals. In one embodiment, each horizontal drive motor and its mechanical linkage is positioned on its respective one of the at least two separate container transfer mechanisms. Each horizontal drive motor and its mechanical linkage and the linear slider to which it is connected are collectively defined to provide horizontal movement of the support structures over a distance sufficient to completely move a container to be supported on the support structures beyond of a vertical plane coincident with an outermost side surface of the base.

In one embodiment, the workpiece container storage and handling system includes a base drive motor having mechanical linkage engaged therewith and connected to at least one of the number of wheels connected to the base. The base drive motor and its mechanical linkage are defined to provide controlled axial rotation of the at least one of the number of wheels to which it is connected in response to control signals. It should be understood that controlled axial rotation of a given wheel corresponds to rotation of the given wheel about its axis of rotation.

In one embodiment, the workpiece container storage and handling system includes a base steering motor having mechanical linkage engaged therewith and connected to at least one of the number of wheels connected to the base. The base steering motor and its mechanical linkage are defined to provide controlled azimuthal rotation of the at least one of the number of wheels to which it is connected in response to control signals. It should be understood that controlled azimuthal rotation of a given wheel corresponds to rotation of the given wheel about an azimuthal axis extending perpendicularly through the given wheel's axis of rotation.

Figure 24:
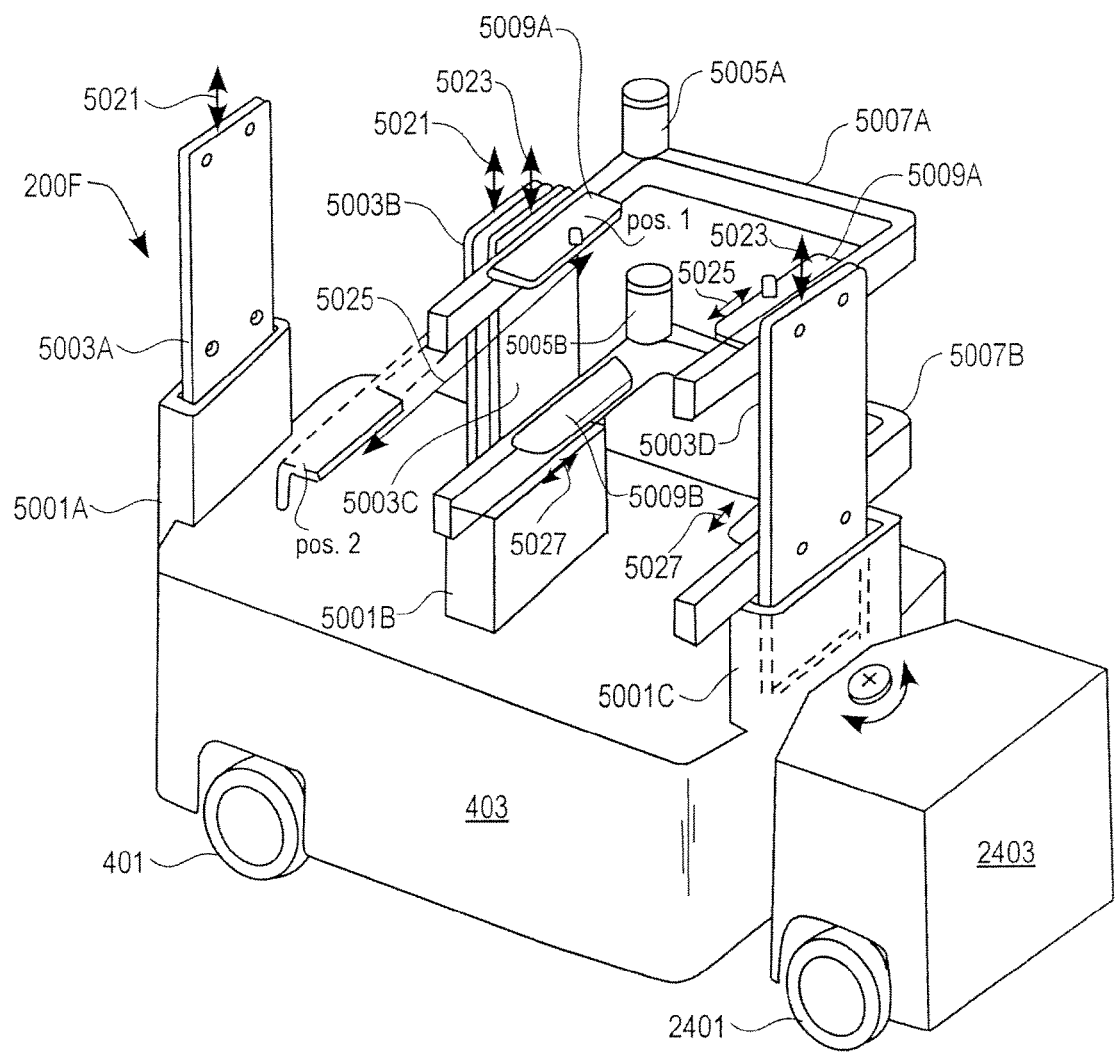
FIG. 24 shows the workpiece container storage and handling system including a drive and steering platform defined independent from the base and physically connected to the base, in accordance with one embodiment of the present invention.

FIG. 24 shows the workpiece container storage and handling system 200F including a drive and steering platform 2403 defined independent from the base 403 and physically connected to the base 403, in accordance with one embodiment of the present invention. The drive and steering platform 2403 is defined to provide controlled movement of the base 403 through its physical connection to the base 403 in response to control signals. The drive and steering platform 2403 is connectable to the base 403 and is disconnectable from the base 403. In one instance of this embodiment, the number of wheels 401 connected to the base 403 are defined to freely rotate in response to controlled movement of the base 403 provided by the drive and steering platform 2403.

In one embodiment, the physical connection of the drive and steering platform 2403 to the base 403 is provided by a hitch connection. In various embodiments, the hitch connection can be a pinned connection, a ball and socket connection, or the like, such that the drive and steering platform 2403 can pivot relative to the base 403 about the hitch connection. In another embodiment, the drive and steering platform 2403 is rigidly connected to the base 403, such that the drive and steering platform 2403 cannot pivot relative to the base 403. The drive and steering platform 2403 includes a plurality of wheels 2401. In one embodiment, the drive and steering platform 2403 includes a pair of wheels 2401 that provide both driving and steering functions. In one instance of this embodiment, a differential rate of rotation can be applied to different wheels 2401 to impart a steering motion to the drive and steering platform 2403. In another instance of this embodiment, controlled azimuthal rotation can be applied to the wheels 2401 to impart the steering motion to the drive and steering platform 2403. It should be understood that controlled azimuthal rotation of a given wheel corresponds to rotation of the given wheel about an azimuthal axis extending perpendicularly through the given wheel's axis of rotation. It should be understood that the drive and steering functions of the drive and steering platform 2403 can be implemented as discussed above and in other ways, so long as the drive and steering platform 2403 is capable of towing/pushing the base 403 and steering the base 403 in a controlled manner in response to control signals.

As described herein, a method is disclosed for workpiece container handling. The method includes an operation for positioning at least two workpiece containers in a vertically overlying orientation with respect to each other. The method also includes moving the at least two workpiece containers in unison next to a platform on which a given one of the at least two workpiece containers is to be positioned. The method also includes moving the at least two workpiece containers in unison in a vertical direction until the given one of the at least two workpiece containers is positioned higher than the platform. The method also includes moving the given one of the at least two workpiece containers in a horizontal direction so as to position the given one of the at least two workpiece containers over the platform without moving others of the at least two workpiece containers. The method also includes moving the at least two workpiece containers in unison in the vertical direction until the given one of the at least two workpiece containers is positioned on the platform.

Positioning the at least two workpiece containers in the vertically overlying orientation with respect to each other in the method can include placing each of the at least two workpiece containers on a respective container transfer mechanism on an autonomous guided vehicle. Also, moving the at least two workpiece containers in unison next to the platform in the method can be performed by moving the autonomous guided vehicle. And, the vertical and horizontal movement of each of the at least two workpiece containers in the method can be provided by its respective container transfer mechanism.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A workpiece container storage and handling system, comprising:
a base;
a number of wheels connected to the base to provide for movement of the base; and
a container handling system connected to the base, the container handling system including at least two separate container transfer mechanisms collectively defined to hold at least two containers in a vertically overlying orientation relative to each other, vertically adjacent ones of the at least two separate container transfer mechanisms separated by a fixed distance measured in a vertical direction, the container handling system including a vertical travel mechanism, each of the at least two separate container transfer mechanisms connected to the vertical travel mechanism such that movement of the vertical travel mechanism in a vertical direction causes corresponding movement of the at least two separate container transfer mechanisms in unison in the vertical direction so as to maintain the fixed distance separation between the vertically adjacent ones of the at least two separate container transfer mechanisms, each of the at least two separate container transfer mechanisms including a horizontal travel mechanism configured to provide for controlled and independent horizontal travel of a corresponding one of the at least two containers relative to the base.

2. The workpiece container storage and handling system as recited in claim 1, wherein each of the at least two container transfer mechanisms includes support structures defined to support a single container.

3. The workpiece container storage and handling system as recited in claim 2, wherein the support structures are defined to engage a bottom surface of the single container.

4. The workpiece container storage and handling system as recited in claim 2, wherein the support structure are defined to engage opposing side surfaces of the single container.

5. The workpiece container storage and handling system as recited in claim 2, wherein the support structures are defined to engage a handle fixed to the single container.

6. The workpiece container storage and handling system as recited in claim 5, wherein the handle extends above the single container.

7. The workpiece container storage and handling system as recited in claim 1, further comprising:
a vertical drive motor having mechanical linkage engaged therewith and connected to the vertical travel mechanism, the vertical drive motor and its mechanical linkage defined to provide controlled movement of the vertical travel mechanism in the vertical direction in response to control signals.

8. The workpiece container storage and handling system as recited in claim 7, wherein the vertical drive motor and its mechanical linkage are positioned within the base.

9. The workpiece container storage and handling system as recited in claim 2, wherein the horizontal travel mechanism of each of the at least two separate container transfer mechanisms includes a linear slider defined to move the support structures in a horizontal direction perpendicular to the vertical direction and relative to the vertical travel mechanism.

10. The workpiece container storage and handling system as recited in claim 9, wherein the horizontal travel mechanism of each of the at least two separate container transfer mechanisms includes a horizontal drive motor having mechanical linkage engaged therewith and connected to the linear slider, the horizontal drive motor and its mechanical linkage defined to provide controlled movement of the linear slider to which it is connected so as to provide controlled movement of the support structures in the horizontal direction in response to control signals.

11. The workpiece container storage and handling system as recited in claim 10, wherein each horizontal drive motor and its mechanical linkage is positioned on its respective one of the at least two separate container transfer mechanisms.

12. The workpiece container storage and handling system as recited in claim 11, wherein the horizontal drive motor and its mechanical linkage and the linear slider to which it is connected are collectively defined to provide horizontal movement of the support structures over a distance sufficient to completely move a container to be supported on the support structures beyond of a vertical plane coincident with an outermost side surface of the base.

13. The workpiece container storage and handling system as recited in claim 1, further comprising:
a base drive motor having mechanical linkage engaged therewith and connected to at least one of the number of wheels connected to the base, the base drive motor and its mechanical linkage defined to provide controlled axial rotation of the at least one of the number of wheels to which it is connected in response to control signals.

14. The workpiece container storage and handling system as recited in claim 13, further comprising:
a base steering motor having mechanical linkage engaged therewith and connected to at least one of the number of wheels connected to the base, the base steering motor and its mechanical linkage defined to provide controlled azimuthal rotation of the at least one of the number of wheels to which it is connected in response to control signals.

15. The workpiece container storage and handling system as recited in claim 1, further comprising:
a drive and steering platform defined independent from the base and physically connected to the base, the drive and steering platform defined to provide controlled movement of the base through its physical connection to the base in response to control signals, the drive and steering platform connectable to the base and disconnectable from the base.

16. The workpiece container storage and handling system as recited in claim 15, wherein the number of wheels connected to the base are defined to freely rotate in response to controlled movement of the base provided by the drive and steering platform.

* * * * *